United States Patent [19]

Inoue et al.

[11] Patent Number: 5,712,861
[45] Date of Patent: Jan. 27, 1998

[54] ERROR CORRECTING METHOD AND DECODER WITH IMPROVED RELIABILITY

[75] Inventors: Tohru Inoue; Ken Onishi; Sadayuki Inoue, all of Nagaokakyo; Mitsuru Matsui, Kamakura, all of Japan

[73] Assignee: Mitsubishi Denki Kabushiki Kaisha, Tokyo, Japan

[21] Appl. No.: 501,322

[22] Filed: Jul. 12, 1995

[30] Foreign Application Priority Data

| Jul. 12, 1994 | [JP] | Japan | 6-184110 |
| Aug. 23, 1994 | [JP] | Japan | 6-198455 |
| Sep. 22, 1994 | [JP] | Japan | 6-228305 |
| Mar. 1, 1995 | [JP] | Japan | 7-041941 |

[51] Int. Cl.$^6$ ............................................. G11B 20/18
[52] U.S. Cl. ..................................... 371/37.1; 371/37.4
[58] Field of Search ........................... 371/37.1, 37.4, 371/37.5, 37.6, 37.7, 37.8, 38.1, 39.1, 40.1, 40.3

[56] References Cited

U.S. PATENT DOCUMENTS

| 4,336,612 | 6/1982 | Inoue et al. | 371/37.4 |
| 4,546,474 | 10/1985 | Sako et al. | 371/37.5 |
| 4,607,367 | 8/1986 | Ive et al. | 371/37.1 |
| 4,646,301 | 2/1987 | Okamoto et al. | 371/37.4 |
| 4,653,051 | 3/1987 | Sugimura et al. | 371/37.4 |
| 4,653,052 | 3/1987 | Doi et al. | 371/37.4 |
| 4,677,622 | 6/1987 | Okamoto et al. | 371/37.5 |
| 4,682,333 | 7/1987 | Onishi et al. | 371/37.4 |
| 4,683,572 | 7/1987 | Baggen et al. | 371/37.5 |
| 4,719,628 | 1/1988 | Ozaki et al. | 371/37.4 |
| 4,782,490 | 11/1988 | Tenengolts | 371/37.5 |
| 4,785,451 | 11/1988 | Sako et al. | 371/37.1 |
| 4,821,268 | 4/1989 | Berlekamp | 371/37.1 |
| 4,845,714 | 7/1989 | Zook | 371/37.4 |
| 4,916,702 | 4/1990 | Berlekamp | 371/39.1 |
| 4,972,416 | 11/1990 | Nagai et al. | 371/37.4 |
| 5,224,106 | 6/1993 | Weng | 371/37.4 |
| 5,247,523 | 9/1993 | Arai et al. | 371/37.4 |
| 5,278,846 | 1/1994 | Okayama et al. | 371/37.1 |
| 5,381,422 | 1/1995 | Shimizu | 371/37.4 |
| 5,422,895 | 6/1995 | Nguyen et al. | 371/37.5 |
| 5,436,917 | 7/1995 | Karasawa | 371/37.4 |
| 5,539,755 | 7/1996 | Baggen | 371/37.1 |

*Primary Examiner*—Stephen M. Baker

[57] ABSTRACT

A codeword contains information symbols representing elements of a Galois field, a parity check symbol generated using a certain element of the Galois field, and additional check symbols generated using a polynomial of which this certain element is not a root. The reliability of corrected codewords is assessed by counting the number of symbols found to be in error, or by counting the number of symbols having at least a certain number of bits in error. When a row-column array is decoded, rows of intermediate reliability are not corrected but their error patterns are stored in a memory, and columns of intermediate reliability are corrected if their error patterns match the error information stored in the memory.

60 Claims, 40 Drawing Sheets

FIG.13

| Pr | q2 | q1 | q0 |
|---|---|---|---|
| 0 | 0 | 0 | 0 |
| 1 | $\alpha^4$ | $\alpha^2$ | $\alpha^3$ |
| $\alpha$ | $\alpha^5$ | $\alpha^3$ | $\alpha^4$ |
| $\alpha^2$ | $\alpha^6$ | $\alpha^4$ | $\alpha^5$ |
| $\alpha^3$ | 1 | $\alpha^5$ | $\alpha^6$ |
| $\alpha^4$ | $\alpha$ | $\alpha^6$ | 1 |
| $\alpha^5$ | $\alpha^2$ | 1 | $\alpha$ |
| $\alpha^6$ | $\alpha^3$ | $\alpha$ | $\alpha^2$ |

ERROR CORRECTING METHOD AND DECODER WITH IMPROVED RELIABILITY

BACKGROUND OF THE INVENTION

This invention relates to a method and decoder for correcting errors in encoded digital information that has been transmitted over a communication channel or reproduced from a recording medium.

When such information is encoded, it is customary to add redundant check information that enables errors to be detected and corrected when the information is received or reproduced. Algebraic codes such as the Reed-Solomon codes are often used. In these codes, the information to be transmitted or recorded is divided into symbols, each including of a certain number of bits, then into codewords, each including of a certain number of symbols. Additional check symbols are generated from each codeword by mathematical operations in which the information symbols are treated as the coefficients of a polynomial. The check symbols are appended to the codeword.

In the decoding process, the redundancy created by the check symbols enables errors in a codeword to be corrected, provided the number of symbols in error does not exceed half the number of check symbols. If more errors are present, the errors cannot be corrected, but it is usually possible to detect their presence, and flag the codeword as having uncorrectable errors.

Error-correcting capability can be improved by use of a two-dimensional product encoding scheme such as the cross-interleave Reed-Solomon code (CIRC) employed for recording digital audio signals on compact discs, and similar product codes often employed in video tape recording. The information to be encoded is divided into rectangular blocks of symbols. Column check symbols, referred to as $C_2$ check symbols, are appended to vertical columns of information symbols to form $C_2$ codewords; then row check symbols, referred to as $C_1$ check symbols, are appended to horizontal rows of information symbols or $C_2$ check symbols to form $C_1$ codewords.

In the decoding process, first the $C_1$ codewords are decoded, errors are corrected, and $C_1$ codewords with uncorrectable errors are flagged. Next the $C_2$ codewords are decoded, using the flags to identify likely error positions. Knowledge of the error positions enables a larger number of errors to be corrected: the number of correctable errors of known position per $C_2$ codeword is equal to the number of $C_2$ check symbols, instead of only half this number.

The total error-correcting capability of the $C_2$ decoding process is given by the following inequality, in which e is the number of errors of unknown position, s is the number of errors of known position, and $d_2$ is the minimum distance between $C_2$ codewords (the minimum number of symbol positions in which any two correct $C_2$ codewords differ; this number is one more than the number of $C_2$ check symbols). If inequality (1) is satisfied, the errors can be corrected; if inequality (1) is not satisfied, the errors are uncorrectable.

$$2e+s<d_2 \quad (1)$$

If uncorrectable errors still remain after $C_2$ decoding, for audio or video information, steps can be taken to conceal the errors, e.g. by substituting information obtained by interpolation from other codewords. Such error concealment can render the error substantially undetectable to a human listener or viewer. The embodiments of the present invention which will be described below are based on the above $C_1$-$C_2$ coding scheme, so it will be useful to explain this scheme in more detail. The mathematical operations by which check symbols are generated make use of a type of extended arithmetic in which each symbol is treated as an element in a Galois field. In many applications the Galois field is $GF(2^8)$, in which each symbol includes of eight bits, but the principles are the same in any Galois field.

As an example, Table 1 lists the elements of $GF(2^4)$, showing their representation both as four-bit symbols and as powers of a primitive element $\alpha$. The four bits of each symbol represent the four coefficients $a_3$, $a_2$, $a_1$, and $a_0$ of a polynomial of the form:

$$a_3z^3+a_2z^2+a_1z+a_0$$

Addition and subtraction are carried out modulo two, by exclusive-OR logic operations on the coefficients. Addition is therefore identical to subtraction. Multiplication and division are carried out modulo a prime polynomial P(z), such as the following prime polynomial over $GF(2^4)$:

$$P(z)=z^4+z+1$$

Thus $\alpha^4$ plus or minus $\alpha^5$ is $\alpha^8$ (0011+0110=0101), $\alpha^4$ multiplied by $\alpha^5$ is $\alpha^9$ (0011×0110=1010), $\alpha^4$ divided by $\alpha^5$ is $\alpha^{-1}$ or $\alpha^{14}$ (0011/0110=1001), and $\alpha^{15}$ is equal to the unity element $\alpha^0$ (0001).

Since addition and subtraction are equivalent in any Galois field $GF(2^m)$ with $2^m$ elements, the addition sign (+) and subtraction sign (−) can be used interchangeably in arithmetic operations over $GF(2^m)$. Equations appearing hereinafter should be read with this in mind.

TABLE 1

| GF ($2^4$) | | | |
|---|---|---|---|
| Element | Symbol | Element | Symbol |
| 0 | 0000 | $\alpha^7$ | 1011 |
| 1 (= $\alpha^0$) | 0001 | $\alpha^8$ | 0101 |
| $\alpha$ (= $\alpha^1$) | 0010 | $\alpha^9$ | 1010 |
| $\alpha^2$ | 0100 | $\alpha^{10}$ | 0111 |
| $\alpha^3$ | 1000 | $\alpha^{11}$ | 1110 |
| $\alpha^4$ | 0011 | $\alpha^{12}$ | 1111 |
| $\alpha^5$ | 0110 | $\alpha^{13}$ | 1101 |
| $\alpha^6$ | 1100 | $\alpha^{14}$ | 1001 |

Galois arithmetic operations and other operations required in encoding and decoding can be carried out at high speed by the hardware shown in FIGS. 37 to 40. Referring to FIG. 37, the hardware configuration includes a program unit 40, an arithmetic processor 50, and a Galois processor 80. The program unit 40 provides instructions to terminals T1 and T2. The instructions are executed by the arithmetic processor 50 and Galois processor 80, which are interconnected via further terminals T3 to T7. Additional data are input to the Galois processor 80 at a terminal T8. The Galois processor 80 is controlled by an external sequence controller (not shown), to which it is coupled by a terminal T9.

Referring to FIG. 38, the program unit 40 includes a branch address generator 41, a program counter 42, a read-only memory (ROM) 43, and an instruction latch 44. The program counter 42 generates successive addresses in the ROM 43, which outputs instructions stored at these addresses to the instruction latch 44. The instruction latch 44 provides the instructions to terminal T1 and to the branch address generator 41. Some of the provided instructions may be branch instructions, which cause the branch address generator 41 to set a new address in the program counter 42.

Referring to FIG. 39, the arithmetic processor 50 includes a pair of up-down counters 55 and 56 and a pair of latches 57 and 58, the outputs of which are added by a pair of adders 59 and 60 to produce addresses at terminals T3 and T6. These addresses specify locations in two random-access memory areas (RAM A and RAM B) in the Galois processor 80. The counters 55 and 56 each provide, for example, five bits of output, specifying values from zero to thirty-one.

The arithmetic processor 50 also has a pair of flag registers 61 and 62 which indicate (by flags $F_3$ and $F_4$) the status of counters 55 and 56, an arithmetic-logic unit (ALU) 63, another pair of flag registers 51 and 52 that indicate the status of results from the ALU 63, and a register file 64 with at least four registers, addressed as $AD_1$ to $AD_4$. Input to register $AD_1$ is controlled by the contents of a latch 65. Inputs to all the registers in the registers file 64 are selected by a selector 66. Two additional registers 67 and 68 hold data to be processed by the ALU 63.

These elements are interconnected as indicated by arrows in the drawings. The symbol A represents arithmetic result data from the ALU 63, Ca represents the value in counter 55, Cb represents the value in counter 56, P represents preset data received from terminal T4, and R represents register data from the register file 64.

Referring to FIG. 40, the Galois processor 80 includes the two random-access memory areas RAM A 81 and RAM B 82 mentioned earlier, a set of flag registers 84, 85, 86, 87, and 88, and a Galois arithmetic processing unit 89. This unit 89 consists of a Galois-logic unit (GLU) 90 that performs Galois arithmetic operations on three inputs G1, G2, and G3, and a reciprocal look-up table 91, stored in a read-only memory (ROM), that supplies the reciprocals of the elements in the Galois field, thereby facilitating division operations. The three inputs to the GLU 90 are obtained from an X register 92, a Y register 93, and a Z register 94. The operations performed by the GLU 90 include finding quantities such as X+Z, X/Y, XY+Z, and $X^2Y+Z$. Results are supplied at a terminal G0. The Galois processor 80 also has selectors 95, 96, and 97 that select inputs to RAM A 81 and RAM B 82.

The symbols A and B in FIG. 40 denote data read from RAM A 81 and RAM B 82, respectively. The letter I denotes, for example, syndrome data or Chien search data (described later). P and R denote preset data and register data as in FIG. 39, and V denotes Galois arithmetic results from the GLU 90. A gate 98 controlled by terminal T9 determines whether the I input is supplied from terminal T8 or selector 97. A flag register 99 stores a flag F5 indicating whether the result output by the GLU 90 is zero.

Flags set in registers 84, 85, 86, 87, and 88 include a computation-in-progress flag St, an external bus read request flag EXR, an external bus write request flag EXW, and two flags $F_1$ and $F_2$ that are input from and output to the sequence controller (not shown).

Information including of k symbols $a_0, \ldots a_{k-1}$ can be treated as the coefficients of a polynomial A(z), where $$A(z)=a_{k-1}z^{k-1}+a_{k-2}z^{k-2}+\ldots+a_1z+a_0$$

To generate c check symbols, $z^cA(z)$ is divided by a generator polynomial G(z) of degree c. The check symbols are the coefficients of the remainder B(z). For a Reed-Solomon code, the generator polynomial G(z) has the following form, its roots being successive powers of a selected element β of the Galois field.

$$G(z)=(z+\beta^j)(z+\beta^{j+1})\ldots(z+\beta^{j+c-1})$$

Except when stated otherwise, it will be assumed hereinafter that the roots of G(z) are the first c powers of a primitive element α of the Galois field, including the zeroth power or unity element, so that G(z) has the following form:

$$G(z)=(z+\alpha^0)(z+\alpha^1)\ldots(z+\alpha^{c-1})$$

The codeword W with appended check symbols $b_0, \ldots, b_{c-1}$ represents the polynomial $z^cA(z)+B(z)$, or $$W(z)=a_{k-1}z^{k-1+c}+\ldots+a_0z^c+b_{c-1}z^{c-1}+\ldots+b_0$$

By construction, W(z) is divisible by G(z). Furthermore, the minimum distance d between codewords is equal to c+1; any two different codewords will differ In at least this number (c+1) of symbol positions. Thus d=c+1.

To decode a codeword W(z) that has been received from a communication channel or reproduced from a recording medium, W(z) is divided by G(z). Details will be omitted, but this polynomial division operation can be carried out rapidly by the hardware in FIGS. 37 to 40. The remainder is referred to as the syndrome polynomial S(z). If all coefficients of S(z) are zero, the codeword W(z) is regarded as correct. If all coefficients of S(z) are not zero, further decoding is performed to correct errors.

The first step in the error-correcting process is to apply the Euclidean algorithm for finding the greatest common divisor of two polynomials. The two polynomials are S(z) and $z^{d-1}$ (or $z^c$).

The execution of the Euclidean algorithm will be described with reference to FIGS. 37 to 43, assuming that there are sixteen check symbols, so that d=17, c=16, the generator polynomial G(z) is of degree sixteen, and the syndrome polynomial S(z) is of degree fifteen or less. No error location information will be used, so the maximum number of errors t that can be corrected is half the number of check symbols, or half the degree of G(z); in this cake the maximum number of correctable errors is eight.

In the general case, if d is the miningurn distance between codewords, and so d−1 is the number of check symbols per codeword, then t is equal to the greatest integer not exceeding (d−1)/2. This can be expressed as follows, using brackets to indicate the greatest-integer function.

$$t=[(d-1)/2]$$

The first step is to load the syndrome data. Counter 55. In the arithmetic processor 50 is initialized to fifteen, a value of sixteen is set in the register file 64 at addresss $AD_2$ as the degree of the polynomial $z^{d-1}$, and a base address is set in latch 56. Adder 59 generates the sum of the contents of counter 55 and the base address in latch 56, which is an address in RAM A 81. Latch 65 is cleared to zero, which enables data to be stored at address $AD_1$ in the register file 64.

The syndrome coefficient data, which have been computed and stored in a memory area (not shown) are next read in at terminal T8, starting wlth the coefficient of $z^{15}$ and routed via selector 95 to RAM A 81, where they are stored at addresses indicated by adder 59. As each coefficient symbol is stored, the contents (Ca) of counter 56 are loaded via selector 66 into the register file 64 at address $AD_1$; then counter 56 is decremented by one so that adder 59 indicates the next address.

When each coefficient symbol is loaded into RAM A 81, it is also sent to the GLU 89 and added to a preset value of zero. If the result of this addition is zero, indicating that the coefficient was the zero symbol, flag $F_5$ in register 99 is cleared to zero. If the result is not zero, indicating a non-zero coefficient, flag $F_5$ is set to one, and this flag value is latched in latch 65, disabling the storing of further data at address $AD_1$ in the register file 64. At the end of the operation, address $AD_1$ continues to hold the highest exponent of z with a non-zero coefficient in the syndrome $S(z)$; this is the degree of the syndrome polynomial $S(z)$.

Referring to the flowchart in FIG. 41, RAM A 81 and RAM B 82 are now initialized to start the Euclidean algorithm. Coefficient data for the polynomial $z^{16}$ are stored as a polynomial $M_1(z)$ in RAM B 82. The syndrome coefficients $S(z)$ already stored in RAM A 81 form a second polynomial $M_2(z)$. Two more polynomials $U_1(z)$ and $U_2(z)$ are initialized to zero, and a further polynomial $U'_1(z)$ to the unity polynomial (1). $U'_1(z)$ and $U_2(z)$ are stored in RAM A 81 and RAM B 82, respectively. After tilts initialization, at point $h_0$ in the flowchart, RAM A 81, RAM B 82, and the register file 64 contain the data shown at the left in FIG. 42.

Next $M_1(z)$ is divided by $M_2(z)$, using the GLU 90 in the Galois processor 80, to obtain a quotient polynomial $Q(z)$ and remainder $R(z)$. In the first iteration, $M_1(z)$ is $z^{16}$ and $M_2(z)$ is $S(z)$, so $R(z)$ and $Q(z)$ are related as follows:

$$R(z)=z^{16}-Q(z)S(z) \qquad (2)$$

The coefficients of the remainder $R(z)$ are stored in RAM B 82, replacing the $M_1(z)$ data. $Q(z)$, $U'_1(z)$, and $U_2(z)$ are used to calculate a new value for $U_1(z)$, as follows:

$$U_1(z)=Q(z)U'_1(z)+U_2(z) \qquad (3)$$

Polynomial $U_2(z)$ is then discarded, and polynomial $U'_1(z)$ is reassigned as $U_2(z)$. At this point j in the flowchart, RAM A 81, RAM B 82, and the register file 64 have the contents shown in the column headed $j_1$ in FIG. 42. The degrees of polynomials $M_2(z)$, $R(z)$, $U_1(z)$, and $Q(z)$ are stored in the register file 64 at addresses $AD_1$, $AD_2$, $AD_3$, and $AD_4$, respectively.

The degree of the remainder $R(z)$, stored in register $AD_2$, is now compared with the integer t, here equal to eight, designating the maximum number of correctable errors. If the degree of the remainder $R(z)$ is equal to or greater than t, substitutions are made so that the old polynomial $M_2(z)$ becomes the new $M_1(z)$, the remainder $R(z)$ becomes the new $M_2(z)$, and $U_1(z)$ becomes the new $U'_1(z)$. These substitutions are made simply by exchanging the roles of RAM A 81 and RAM B 82, without actually transferring any data, as indicated in the column headed $h_1$ in FIG. 42.

The algorithm now loops back to divide the new $M_1(z)$ by the new $M_2(z)$ and obtain a new quotient $Q(z)$ and remainder $R(z)$. Columns $j_2$ and $h_2$ lndleate the RAM and register contents at points j and h in the flowchart during this second iteration, assuming that the degree of the remainder $R(z)$ is stlll equal to or greater than t. The symbols $R_1(z)$ and $R_2(z)$ indicate the remainder in the first and second iteration, respectively.

This process continues to loop until the degree of the remainder $R(z)$ becomes equal to or less than t−1. The roles of RAM A 81 and RAM B 82 are swapped at each iteration of the loop, so that the algorithm can be executed with a minimum of data transfer. FIG. 43 shows the RAM and register contents at points j and h in the flowchart for even-numbered iterations of the loop (columns $j_{2m}$ and $h_{2m}$) and odd-numbered iterations of the loop (columns $j_{2m+1}$ and $h_{2m+1}$).

When the degree of the remainder $R(z)$ becomes t−1 or less, the values of $U_1(z)$ and $R(z)$ are left stored as polynomials $\sigma(z)$ and $\eta(z)$, respectively, and the process ends. FIG. 43 shows the final state when the process ends in an even number of repetitions, so that $\sigma(z)$ and $\eta(z)$ are left stored in RAM A 81.

The degree of $\sigma(z)$, stored at address $AD_3$ in the register file, indicates the number of error symbols. If this degree exceeds t, the codeword is flagged as uncorrectable. An uncorrectable codeword is referred to as an erasure. If the degree does not exceed t, the roots of $\sigma(z)$ are found by carrying out a Chien search; that is, by substituting successive powers of $\alpha$ in the Galois field for z, and testing whether the resulting value of $\sigma(z)$ is zero. These roots designate the rotations off errors in the codeword. Details of the Chien search procedure will be given later (FIG. 21).

The polynomials $\sigma(z)$ and $\eta(z)$ can be normalized as follows, so that their leading coeficients are nnity:

$$\sigma(z)=U_1(z)=K\sigma_0(z) \qquad (4)$$

$$\eta(z)=R(z)=K\eta_0(z) \qquad (5)$$

If $\sigma(z)$ has the maximum correctable degree t, it can be factored as follows:

$$\begin{aligned}\sigma(z) &= K\sigma_0(z) \\ &= K(z+\alpha_1)(z+\alpha_2)\ldots(z+\alpha_t)\end{aligned} \qquad (6)$$

The roots of $\sigma(z)$ are $\alpha_1, \alpha_2, \ldots, \alpha_t$. Their values designate error symbols under a scheme by which, for example, $\alpha^0$ designates the coefficient of $z^0$ in the codeword, $\alpha^{-1}$ designates the coefficient of $z^1$, $\alpha^{-2}$ designates the coefficient of $z^2$, and so on.

The difference between the codewords $W(z)$ and $\hat{W}(z)$, referred to as the error pattern, gives the values that must be added to the symbols at the error locations to correct the errors. Like the codeword $W(z)$, the error pattern is a collection of symbols; non-zero error pattern symbols correspond to symbols that are in error in $\hat{W}(z)$. Once the roots of $\sigma(z)$ have been found, these non-zero error pattern symbols can be obtained by dividing $\eta(z)$ by the formal derivative $\sigma'(z)$, which includes of the odd terms of $\sigma(z)$ with exponents of z reduced by one, setting z to each of the roots in turn. The error pattern symbol value $e_i$ at the location corresponding to root $\alpha_i$ is given by:

$$e_i=\eta(\alpha_i)/\sigma'(\alpha_i) \qquad (7)$$

Details will be omitted, but the Chien search and the computation of the error pattern values in equation (7) can be carried out rapidly on the hardware in FIGS. 37 to 40 by means of a suitable program stored in the ROM 43.

When error locations are already identified by erasure flags, the above procedure must be modified. A conventional algorithm which can be applied will be described below, using g(z) to represent the polynomial $z^{d-1}$, which becomes an instance of a so-called Goppa polynomial.

When a received symbol $r_i$ has been flagged as an erasure, its value is conventionally set to zero. If $a_i$ was the transmitted value, then the value of the corresponding error pattern symbol becomes:

$$e_i=r_i-a_i=a_i \qquad (8)$$

If $r_i$ is in error but has not been flagged as an erasure symbol, then the corresponding error pattern symbol has the following value:

$$e_i=r_i-a_i\neq 0 \qquad (9)$$

The syndrome of the received codeword is calculated as follows, where n is the total number of symbols, including check symbols, in the codeword.

$$S(z) = -\sum_{i=1}^{n} r_i \frac{g(z) - g(\alpha_i)}{z - \alpha_i} [g(\alpha_i)]^{-1} \quad (10)$$

Polynomials $\sigma_e(z)$, $\eta_e(z)$, $\phi_e(z)$, $\sigma_\epsilon(z)$, $\eta_\epsilon(z)$, and $\phi_\epsilon(z)$ are defined as follows, where $E_e$ is the set error locations and $E_\epsilon$ is the set of erasure locations.

$$\sigma_e(z) = \prod_{i \in E_e} (z - \alpha_i) \quad (11)$$

$$\eta_e(z) = \sum_{i \in E_e} e_i \prod_{\substack{i' \in E_e \\ i' \neq i}} (z - \alpha_{i'}) \quad (12)$$

$$\phi_e(z) = \sum_{i \in E_e} e_i [g(\alpha_i)]^{-1} \prod_{\substack{i' \in E_e \\ i' \neq i}} (z - \alpha_{i'}) \quad (13)$$

$$\sigma_\epsilon(z) = \prod_{i \in E_\epsilon} (z - \alpha_i) \quad (14)$$

$$\eta_\epsilon(z) = \sum_{i \in E_\epsilon} \epsilon_i \prod_{\substack{i' \in E_\epsilon \\ i' \neq i}} (z - \alpha_{i'}) \quad (15)$$

$$\phi_\epsilon(z) = \sum_{i \in E_\epsilon} \epsilon_i [g(\alpha_i)]^{-1} \prod_{\substack{i' \in E_\epsilon \\ i' \neq i}} (z - \alpha_{i'}) \quad (16)$$

Polynomials $S(z)$ and $\sigma_\epsilon(z)$ can be calculated from the received codeword and erasure location information. The other polynomials are unknown, but they are related to $S(z)$ and $\sigma_\epsilon(z)$ by the following basic equation:

$$S(z) = \frac{\eta_e(z) - \phi_e(z)g(z)}{\sigma_e(z)} + \frac{\eta_\epsilon(z) - \phi_\epsilon(z)g(z)}{\sigma_\epsilon(z)} \quad (17)$$

If $\sigma_e(z)$, $\eta_e(z)$, and $\eta_\epsilon(z)$ were known, the error locations $E_e$ could be obtained by carrying out a Chien search to find the roots of $\sigma_e(z)$, and the error pattern symbols $e_i$ and $\epsilon_i$ could be found by means of formal derivatives, as follows:

$$e_i = \frac{\eta_e(\alpha_i)}{\sigma_e'(\alpha_i)} \quad (18)$$

$$\epsilon_i = \frac{\eta_\epsilon(\alpha_i)}{\sigma_\epsilon'(\alpha_i)} \quad (19)$$

The decoding process is carried out by solving the basic equation (17). Three polynomials $\sigma(z)$, $\eta(z)$, and $\phi(z)$ are defined as follows:

$$\sigma(z) = \sigma_e(z)\sigma_\epsilon(z) \quad (20)$$

$$\eta(z) = \eta_e(z)\sigma_\epsilon(z) + \eta_\epsilon(z)\sigma_e(z) \quad (21)$$

$$\phi(z) = \phi_e(z)\sigma_\epsilon(z) + \phi_\epsilon(z)\sigma_e(z) \quad (22)$$

The basic equation can then be rewritten as follows:

$$\eta(z) = \sigma(z)S(z) + \phi(z)g(z) \quad (23)$$

From the known polynomials $S(z)$ and $\sigma_\epsilon(z)$ it is possible to find two polynomials $S_\epsilon(z)$ and $\phi_\epsilon(z)$ that satisfy the following conditions:

$$S_\epsilon(z) = \sigma_\epsilon(z)S(z) - \phi_\epsilon(z)g(z) \quad (24)$$

$$\deg S_\epsilon(z) < \deg g = d-1 \quad (25)$$

Equation (23) can then be rewritten as follows:

$$\eta(z) = \sigma_e(z)S_\epsilon(z) + [\sigma_e(z)\phi_\epsilon(z) + \phi(z)]g(z) \quad (27)$$

This modified basic equation (27) can be used for decoding by the Euclidean algorithm. The degrees (deg) of the polynomials appearing in equation (27) satisfy the conditions given by equations (28) to (30) below, and the greatest-common-divisor (gcd) condition given by equation (31). $N_e$ is the number of errors, and $N_R$ is the number of erasures.

$$\deg \sigma_e(z) = N_e \leq t - (N_R/2) \quad (28)$$

$$\deg \eta \leq N_e + N_R - 1 < t + N_R/2) \quad (29)$$

$$\deg (\sigma_e\phi_\epsilon + \phi) = \deg (S_\epsilon\sigma_e) - \deg g \leq N_e - 1 < t - N_R/2 \quad (30)$$

$$\gcd(\sigma_e, \sigma_e\phi_\epsilon + \phi) = 1 \quad (31)$$

It can be shown that there is a unique set of polynomials $\{\eta(z), \sigma_e(z), \sigma_e(z)\phi_\epsilon(z)+\phi(z)\}$ satisfying the basic equation (27). It can also be shown that the number of errors $N_e$ is zero if and only if the degree of $S_\epsilon(z)$ is less than the number of erasures $N_R$. It can furthermore be shown that if $p_\epsilon(z)$ is the greatest common divisor of $g(z)$ and $S_\epsilon(z)$, the following inequality is satisfied:

$$\deg p_\epsilon(z) < t + N_R/2 \quad (32)$$

An example using a Reed-Solomon code with four check symbols over $GF(2^4)$ will be given next. This generator polynomial of tills code is:

$$g(z) = z^4 + z + 1 \quad (33)$$

The codeword length is twelve symbols, including eight information symbols and four check symbols. The transmitted codeword was the following:

$$v = (100 \ \alpha 0000 \ \alpha^{12} 0 \ \alpha^{11} \ \alpha^9)$$

The received codeword, after erasure of a known incorrect symbol at the fourth position front the right, was:

$$r = (100 \ \alpha^9 000000 \ \alpha^{11} \ \alpha^9)$$

Locations in these codewords are addressed by elements of $GF(2^4)$ as follows, $\alpha^{-11}$ indicating the leftmost location and $\alpha^0$ the rightmost location.

$$\alpha^{-11} \ \alpha^{-10} \ \alpha^{-9} \ \alpha^{-8} \ \alpha^{-7} \alpha^{-6} \ \alpha^{-5} \ \alpha^{-4} \ \alpha^{-3} \ \alpha^{-2} \ \alpha^{-1} \ \alpha^0$$

Incorrect received symbols occur at positions $\alpha^{-8}$ and $\alpha^{-3}$, with $\alpha^{-3}$ being a known erasure position and $\alpha^{-8}$ an unknown error location. Front Table 1, $$\alpha - \alpha^9 = \alpha^3$$

The error pattern value at location $\alpha^{-8}$ is accordingly $\alpha^3$. The erasure pattern value at location $\alpha^{-3}$ is $\alpha^{12}$. The following polynomials call be calculated.

$$\sigma_\epsilon(z) = z + \alpha^{-3} = z + \alpha^{12} \quad (34)$$

$$S(z) = \alpha^6 z^3 + \alpha^4 z^2 + \alpha^7 z + \alpha^{12} \quad (35)$$

$$S_\epsilon(z) = S(z)\sigma_\epsilon(z) \quad (36)$$

$$= \alpha^2 z^3 + \alpha^{14} z^2 + \alpha^6 z + \alpha^9$$

Since the degree of $S_\epsilon(z)$ is not less than the number of erasures, the number of errors of unknown location is not zero. The following relation, however, is satisfied:

$$(d-1)/2 + N_R/2 \geq \deg S_\epsilon(z) \quad (37)$$

This indicates that the errors are correctable, so the Euclidean algorithm is used to find their locations. In the first iteration of this algorithm, $z^4$ is divided by $S_e(z)$ and the following relation is obtained:

$$z^4 = (\alpha^8 z + 1) S_e(z) + \alpha^3 z + \alpha^9 \quad (38)$$

The degree of the remainder $r_1 = \alpha^3 z + \alpha^9$ is one, so the iteration stops at this point, yielding the following results:

$$U_1(z) = q_1(z) = \alpha^8(z + \alpha^{-8}) \quad (39)$$

$$\sigma_e(z) = z + \alpha^{-8} = z + \alpha^7 \quad (40)$$

$$\eta(z) = r_1 = (\alpha^3 z + \alpha^9)\alpha^{-8} = \alpha^{10} z + \alpha \quad (41)$$

$$\sigma(z) = \sigma_e \sigma_e = (z + \alpha^7)(z + \alpha^{12}) \quad (42)$$

$$\sigma'(z) = \alpha^7 + \alpha^{12} = z^2 \quad (43)$$

From equation (40), there is one error at location $\alpha^{-8}$. The error and erasure pattern values at locations $\alpha^{-8}$ and $\alpha^{-3}$ are found as follows:

$$e_1 = \frac{\eta(\alpha^{-8})}{\sigma_e'(\alpha^{-8})} = \alpha^3 \quad (44)$$

$$\epsilon_1 = \frac{\eta(\alpha^{-3})}{\sigma_e'(\alpha^{-3})} = \alpha^{12} \quad (45)$$

The received codeword r is decoded by adding the error pattern e and erasure pattern $\epsilon$ as follows:

$$\begin{aligned} v &= r + e + \epsilon \quad (46) \\ &= (1\,0\,0\,\alpha\,0\,0\,0\,0\,\alpha^{12}\,0\,\alpha^{11}\,\alpha^9) \end{aligned}$$

The foregoing equations may make the error-and-erasure decoding procedure appear complex, but it can be carried out with comparatively minor modifications to the flowchart in FIG. 41, by the hardware shown in FIGS. 37 to 40.

Although the coding and decoding schemes described above have been widely used, they are not without certain problems. One problem is that of miscorrection: a decoded $C_1$ or $C_2$ codeword may still contain errors, even though is not tagged as an erasure. This can happen when the number of errors originally present i the codeword exceeds the error-correcting capability of the code.

One conventional solution to this problem is to add further redundant information to the codewords. Typically a parity check symbol is added to each codeword before the check symbols are generated. By checking the parity symbol after the codeword has been decoded, it is possible to catch some miscorrection.

For a Reed-Solomon code using a generator polynomial of the form $G(z) = (z + \alpha^0)(z + \alpha) \ldots (z + \alpha^{d-2})$, however, this parity scheme is far from satisfactory. A conventional parity check symbol is generated by adding all of the information symbols modulo two, by exclusive-OR logic, but the result obtained is equal to the remainder in polynomial division by $(z+1)$, which has a root in common with $G(z)$ (because $\alpha^0 = 1$). Consequently, if a miscorrection is due entirely to errors in the information part of the codeword, and not in the check symbols themselves, the miscorrection will pass the parity check and will not be detected. More specifically, a parity check on the entire codeword, including check symbols, is calculated as follows:

$$S_0 = \sum_{i=0}^{n-1} r_i = \sum_{i=0}^{n-1} e_i \quad (47)$$

where the $r_i$ are the received symbols and the $e_i$ are the error pattern symbols. Restricting the parity check to the k information symbols gives:

$$S_p = \sum_{i=0}^{k-1} r_i = \sum_{i=0}^{k-1} e_i \quad (48)$$

The correction to these symbols applied by the conventional decoding process will therefore cause the parity check to pass even if the corrections are incorrect.

A further problem of the conventional encoding scheme is that of over-erasure. When a $C_1$ codeword is flagged as an erasure, that does not mean that all the symbols in the codeword are incorrect. Typically, only a few of the symbols are incorrect. In the $C_2$ decoding process it is not necessarily helpful to have correct symbols flagged as incorrect. This is particularly true under adverse conditions, when the symbol error rate is so high that the number of erasures exceeds the erasure-correcting capability of the $C_2$ code.

As a partial solution to this last problem, one of the present inventors has proposed a decoder that uses erasure information only when the number of erasures is within the correction capability of the $C_2$ code. FIG. 44 shows the performance of this decoder. The symbol error rate prior to decoding is shown on the horizontal axis. The codeword error rate after decoding is shown on the vertical axis. The curve marked by crosses represents decoded codewords with uncorrected but detected errors. The curve marred with squares represents decoded codewords with wrongly corrected or undetected errors; that is, the number of miscorrected codewords.

The miscorrection curve trends generally downward as the symbol error rate decreases, but shows an upward jump in the circled area A. This corresponds to the symbol error rate at which it first becomes possible to make use of erasure information: the symbol error rate at which the number of erasures is typically just equal to the number of $C_2$ check symbols. This jump in the curve indicates that erasure information is not being used in the most effective way to detect and correct errors.

Both of these problems are manifestations of the more general problem that conventional decoders do not provide an adequate check on the reliability of their results. Errors may slip through unrecognized, or correct results may be flagged as incorrect. Even when the results are correct and are so identified, it is not possible to place confidence in their correctness.

SUMMARY OF THE INVENTION

It is accordingly a general object of the present invention to improve the reliability of error-correcting codes.

Another general object is to assess the reliability of decoded results.

A more particular object is to detect miscorrections by polynomial codes.

A further object is to improve the error-correcting capability of product codes.

According to a first aspect of the present invention, a codeword contains information symbols, a parity check symbol, and additional check symbols. The parity check symbol is generated by treating the information symbols as coefficients of a polynomial over a Galois field, and evaluating this polynomial at a certain element of the Galois field. The additional check symbols are generated by treating the information symbols and parity check symbol as high-order coefficients of a polynomial over the Galois field, the low-order coefficients being zero, and dividing this polynomial by a generator polynomial not having the above-mentioned certain element as a root.

According to a second aspect of the invention, the reliability of corrected codewords is assessed by counting the number of symbols found to be in error, or by counting the number of symbols having at least a certain number of bits in error. In decoding a row-column array of symbols, in particular, first the rows are decoded, their reliability is assessed, and erasure flags are set to indicate unreliable rows; then columns are decoded, using the erasure flags to identify likely error positions. Use of the erasure flags can be made conditional on the number of erasure flags present; alternatively, column decoding can be initially attempted without using the erasure flags, then repeated as necessary with increasing numbers of erasure flags, the erasure flags being used in their reliability order.

According to a third aspect of the invention, when a row-column array is decoded, rows and columns are assigned to a least reliable class, an intermediate class, and a most reliable class, reliability being assessed as in the second aspect. Rows belonging to the most reliable row class are corrected. Rows belonging to the intermediate row class are not corrected, but information about their errors is stored in a soft correction memory. Columns in the most reliable column class are corrected. Columns in the intermediate column class are corrected if their errors match the information in the soft correction memory at all positions. Other columns are flagged as having uncorrectable errors.

BRIEF DESCRIPTION OF THE DRAWINGS

FIG. 13 shows an example of a look-up table over $GF(2^3)$.

DETAILED DESCRIPTION OF THE INVENTION

Several embodiments off the invention will now be described with reference to the attached illustrative drawings.

The first embodiment pertains to a product code over a Galois field $GF(2^8)$ generated by the prime polynomial:

$$P(z)=z^8+z^4+z^3+z^2+1$$

Figure 1:
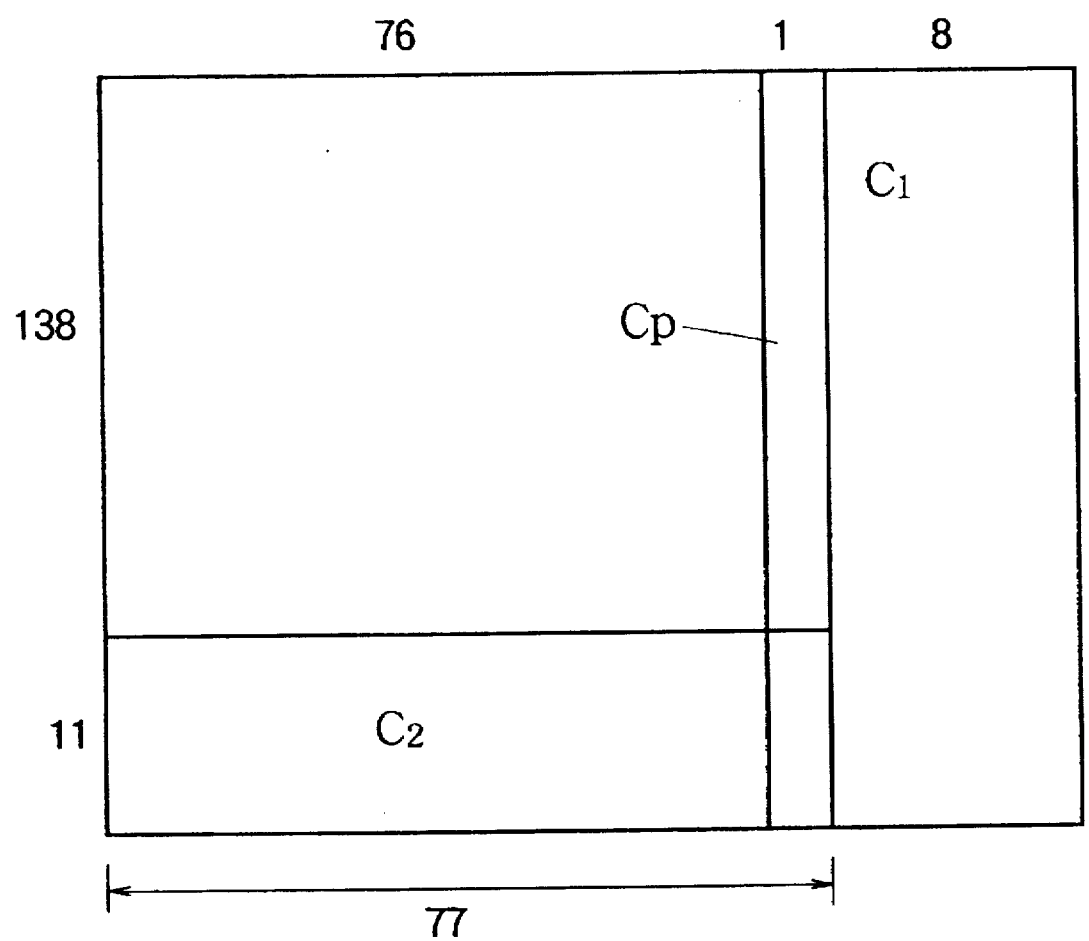
FIG. 1. illustrates the format of a product code with novel parity check symbols, used in a first embodiment: of the invention.

FIG. 1 shows the code format. The information to be encoded is grouped into blocks of 76×138 eight-bit symbols.

Further check symbols are added to generate horizontal and vertical codewords. Each vertical codeword comprises one hundred thirty-eight information symbols and eleven $C_2$ check symbols. Each horizontal codeword comprises seventy-six information symbols or $C_2$ check symbols, one parity check symbol (Cp), and eight $C_1$ check symbols. The horizontal and vertical codewords will be referred to as $C_1$ and $C_2$ codewords, respectively.

The parity check symbol of a horizontal ($C_1$) codeword is obtained by the Reed-Solomon encoding procedure, using a first-degree generator polynomial $z+\alpha^p$, where $\alpha$ is the element (00000010) of $GF(2^8)$ and p is an integer less than zero or greater than seven. The seventy-six information symbols are treated as coefficients of a polynomial $A(z)$, and the parity check symbol is the remainder resulting from the division operation $A(z)z/(z+\alpha^p)$. Simple algebra shows that the parity check symbol has the value $A(\alpha^p)\alpha^p$, so it can be obtained by evaluating $A(z)$ at $\alpha^p$ to obtain an intermediate value, then multiplying this intermediate value by $\alpha^\alpha$.

The $C_1$ check symbols are obtained by treating the seventy-seven symbols including the information symbols and parity check symbol as coefficients of a polynomial, multiplying by $z^8$, dividing by the following generator polynomial $G_1(z)$, and taking the remainder.

$$G_1(z)=(z+\alpha^0)(z+\alpha^1)\ldots(z+\alpha^7)$$

If the value of the parity check symbol is β, then the $C_1$ check symbols are the coefficients of the remainder polynomial resulting from the following division operation:

$$[A(z)z^9\beta z^8]/G_1(z)$$

The general requirement on p is that $\alpha^p$ must not be equal to any of the roots $\alpha^0, \alpha^1, \ldots, \alpha^7$ of the generator polynomial $G_1(z)$ of the $C_1$ code. In the following description it will be assumed that $\alpha^p$ is a $\alpha^{-1}$, or $\alpha^{254}$, representing the symbol (10001110).

The $C_2$ check symbols are obtained by use of a generator polynomial $G_2(z)$ of degree eleven on the first seventy-six columns in FIG. 1.

In the decoding procedure, first $C_1$ decoding is carried out as described previously, the eight $C_1$ check symbols enabling correction of up to four symbols per codeword. $C_1$ codewords found to have uncorrectable errors are flagged as erasures. $C_1$ decoding can be carried out using the hardware shown in FIGS. 37 to 40. The information symbols and parity check symbol in a codeword output from $C_1$ decoding will be referred to as a vector r, where $$r=(r_{n-1}, r_{n-2}, \ldots, r_1, r_0)$$

In the present embodiment, n equals seventy-seven. The last symbol $r_0$ is the parity check symbol.

Next a parity check is carried out on these symbols ($r_{n-1}, r_{n-2}, \ldots, r_1, r_0$), by treating them as the coefficients of a polynomial, and determining whether this polynomial is evenly divisible by the parity generator polynomial $(z+\alpha^{-1})$. Equivalently, the parity check is carried out by evaluating this polynomial at $\alpha^{-1}$ and testing whether the result is zero.

Figure 2:
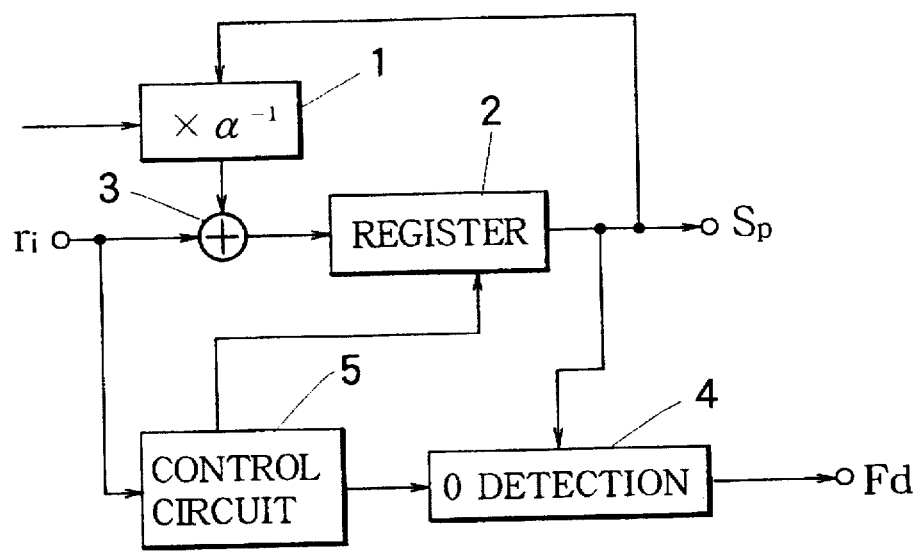
FIG. 2 is a block diagram of a parity-checking circuit for the code in FIG. 1.

FIG. 2 shows a block diagram of a parity checker for carrying out this check, including a multiplier 1, a register 2, a modulo-two adder 3, a zero detection circuit 4, and a control circuit 5, interconnected as shown. The multiplier 1 multiplies the contents of the register 2 by $\alpha^{-1}$. The modulo-two adder 3 adds an input symbol $r_i$ to the resulting product, and replaces the contents of the register 2 with the resulting sum. The zero detection circuit 4 tests whether the contents of the register 2 are zero. The control circuit 5 initializes the register 2, and has an internal counter (not shown) that controls the number of iterations of the above operations.

Figure 3:
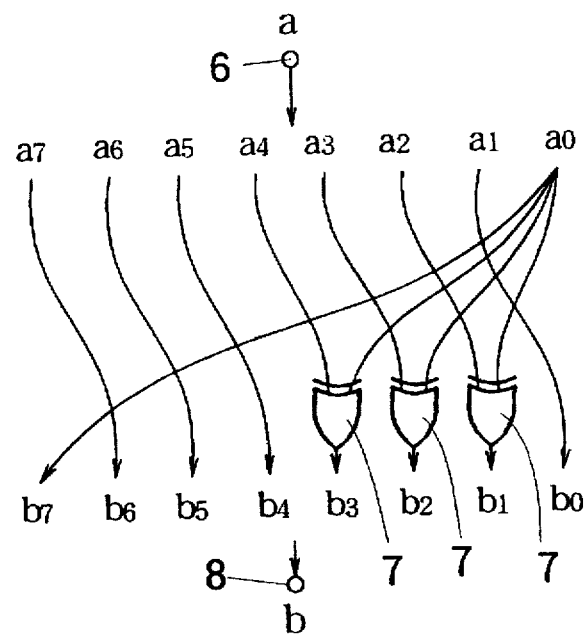
FIG. 3 is a schematic diagram of the multiplier in FIG. 2.

FIG. 3 shows a circuit that can be used as the multiplier 1. The eight-bit contents "a" ($a_7, a_6, \ldots, a_0$) of the register 2 are input at a terminal 6 and rotated one bit position to the right. Output bits $b_7, b_6, b_5, b_4$, and $b_0$ have the values resulting from this rotation. Input bit $a_0$ is added (modulo two) to bits $a_4, a_3$, and $a_2$ by three exclusive-OR gates 7 to produce output bits $b_3, b_2$, and $b_1$. The output bits (b) are output at an output terminal 8 to the modulo-two adder 3 in FIG. 2.

To carry out the parity check, the control circuit 5 initializes the register 2 to zero. The counter in the control circuit 5 is initialized to n, the number of symbols to be checked (including the parity check symbol). Then the symbols are input one by one to the parity checker. Input of the first symbol $r_{n-1}$ places its value $r_{n-1}$ in the register 2. Input of the second symbol $r_{n-2}$ results in $r_{n-1}$ being multiplied by $\alpha^{-1}$ and added to $r_{n-2}$, placing the following sum in the register 2.

$$r_{n-1}\alpha^{-1}+r_{n-2} \tag{57}$$

Similarly, input of the next symbol $r_{n-3}$ places the following sum in the register 2:

$$(r_{n-1}\alpha^{-1}+r_{n-2})\alpha^{-1}+r_{n-3} \tag{58}$$

When all n symbols, including the parity check symbol $r_0$, have been input, the control circuit 5 terminates the parity-check operation. The final contents of the register 2, which are output as a parity syndrome $S_p$, are:

$$S_p=(\ldots(r_{n-1}\alpha^{-1}+r_{n-2})\alpha^{-1}+r_{n-3})\alpha^{-1}+\ldots+r_1)\alpha^{-1}+rhd\ 0 \tag{59}$$

The parity syndrome $S_p$ can also be written as follows, showing that it is equal to the polynomial with coefficients $r_i$ evaluated at $\alpha^{-1}$.

$$S_p = \sum_{i=0}^{k-1} r_i(\alpha^{-1})^i \tag{60}$$

The zero detection circuit 4 tests the final $S_p$ and sets or clears all erasure flag Fd. The erasure flag Fd is set if $S_p$ is non-zero, indicating a parity error, and is cleared if $S_p$ is zero, indicating a correctly decoded $C_1$ codeword.

Figure 4:
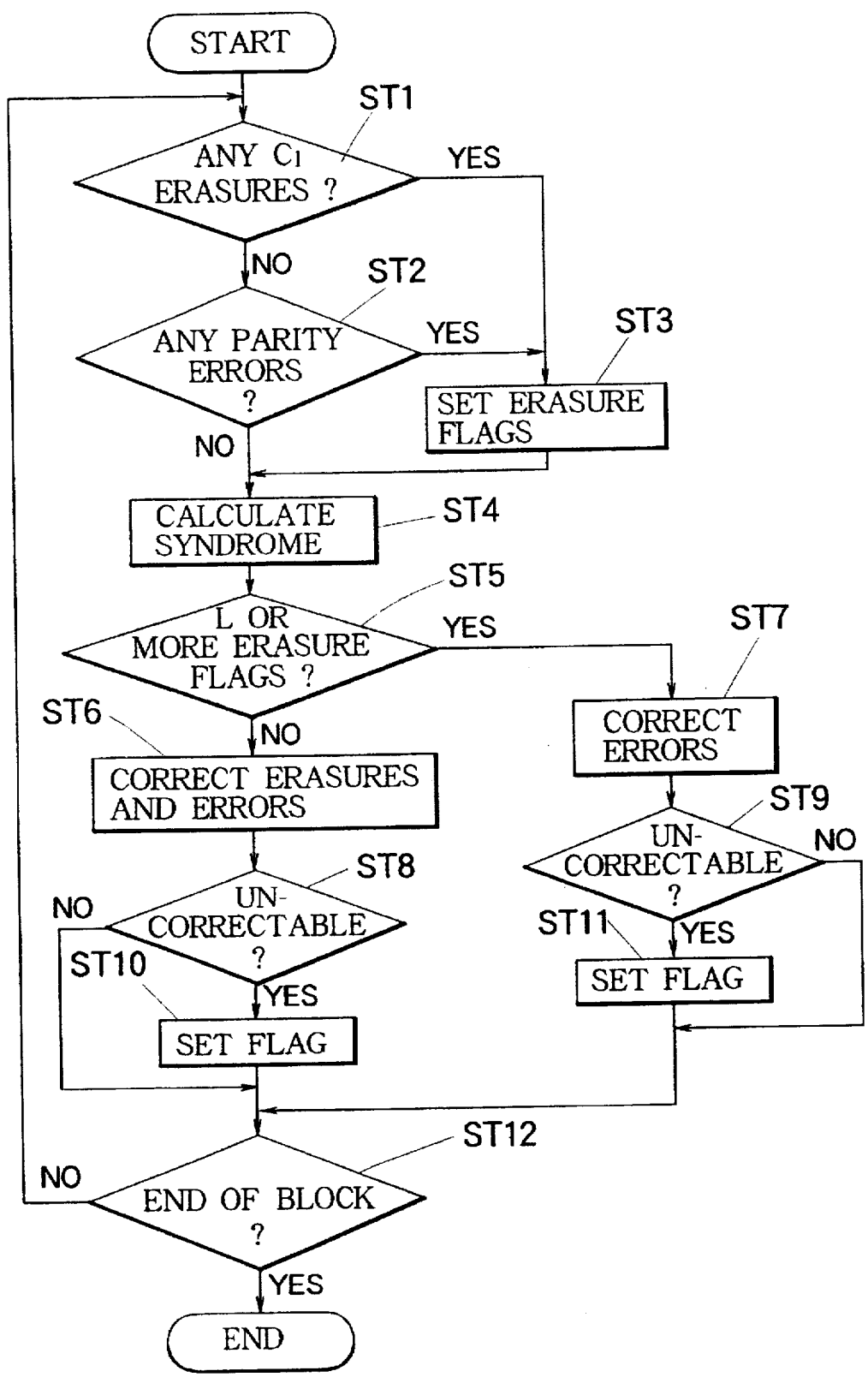
FIG. 4 is a flowchart of the $C_2$ decoding procedure in the first embodiment.
Figure 37:
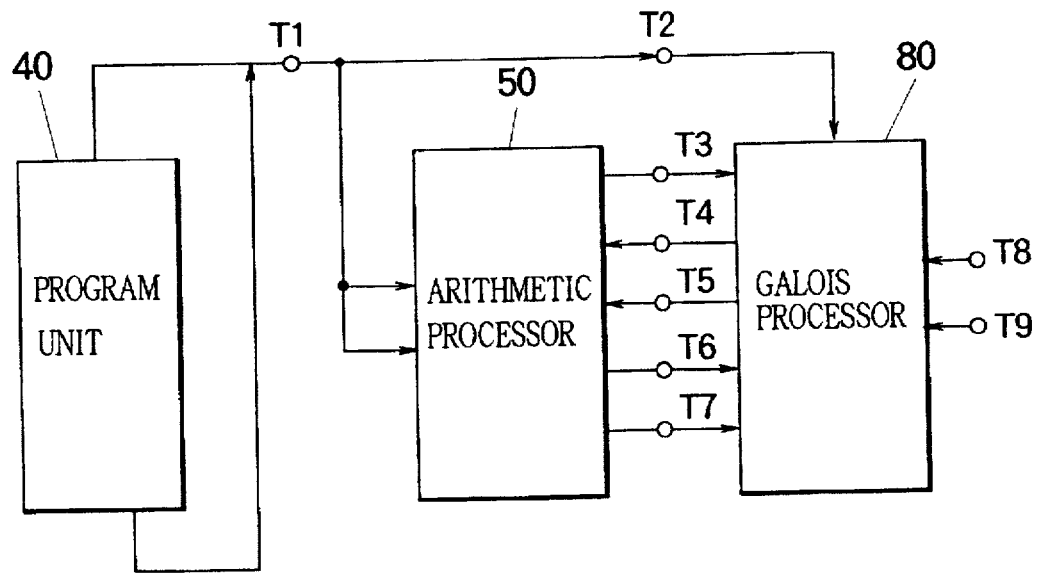
FIG. 37 is a general block diagram of a conventional decoder.
Figure 38:
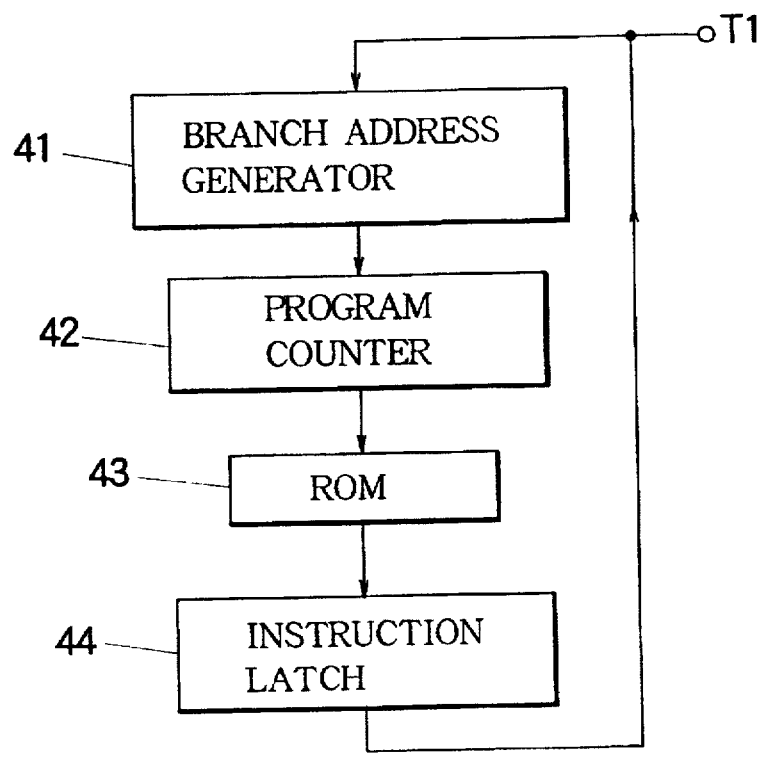
FIG. 38 is a more detailed block diagram of the program unit in FIG. 37.
Figure 39:
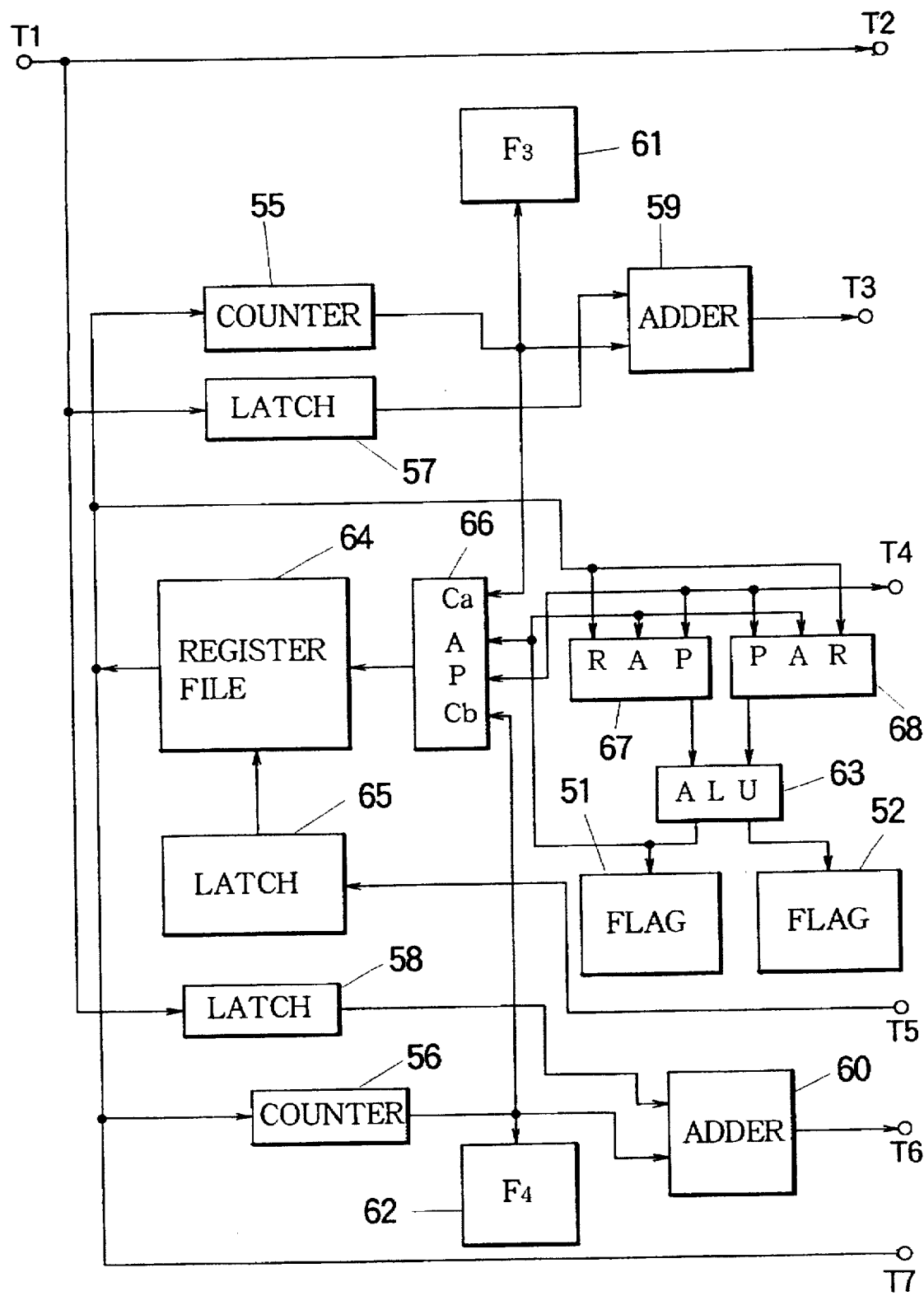
FIG. 39 is a more detailed block diagram of the arithmetic processor in FIG. 37.

The parity check is followed by $C_2$ decoding, which is again carried out by hardware like that shown in FIGS. 37 to 39. The $C_2$ decoding process will be described with reference to the flowchart in FIG. 4.

The first step ST1 in the decoding of a $C_2$ codeword is to determine whether erasure flags have been output by the $C_1$ decoding process. The second step ST2 is to determine, from the flag values Fd output as above, whether the parity check failed for any $C_1$ codewords after $C_1$ error correction. If the answer in either of these steps is yes, erasure flags are set for the corresponding symbols in step ST3, but these symbols are not yet erased to zero.

The next step ST4 is to generate the $C_2$ syndrome coefficients, as explained earlier. The next step ST5 is to determine whether the number of erasures, including both erasures flagged by $C_1$ decoding and erasures flagged as a result of the parity check, is less than a certain number L. The value of L can be set equal to the minimum distance between $C_2$ codewords, for example, so that L−1 is the number of $C_2$ check symbols (eleven in the present embodiment) and represents the maximum number of erasures that can be corrected.

If the number of erasures is less than L, then the erased symbols are set to zero, the syndrome polynomial is modified as explained earlier, and $C_2$ decoding is carried out using the erasure information, in step ST6. If the number of erasures is equal to or greater than L, then the symbols flagged as erasures are not set to zero, and $C_2$ decoding is carried out without using erasure information, in step ST7.

These $C_2$ decoding processes may result in a determination of uncorrectable errors. This determination is made In the next steps ST8 and ST9, according to the degree of the syndrome polynomial S(z) or modified syndrome polynomial $S_e(z)$. If uncorrectable errors are present, then the $C_2$ codeword is flagged as an erasure in steps ST10 and ST11, so that error concealment measures can be taken.

In step ST12, if the entire block has been decoded, the decoding process ends. If not, the process returns to step ST1 to decode the next $C_2$ codeword.

Figure 5:
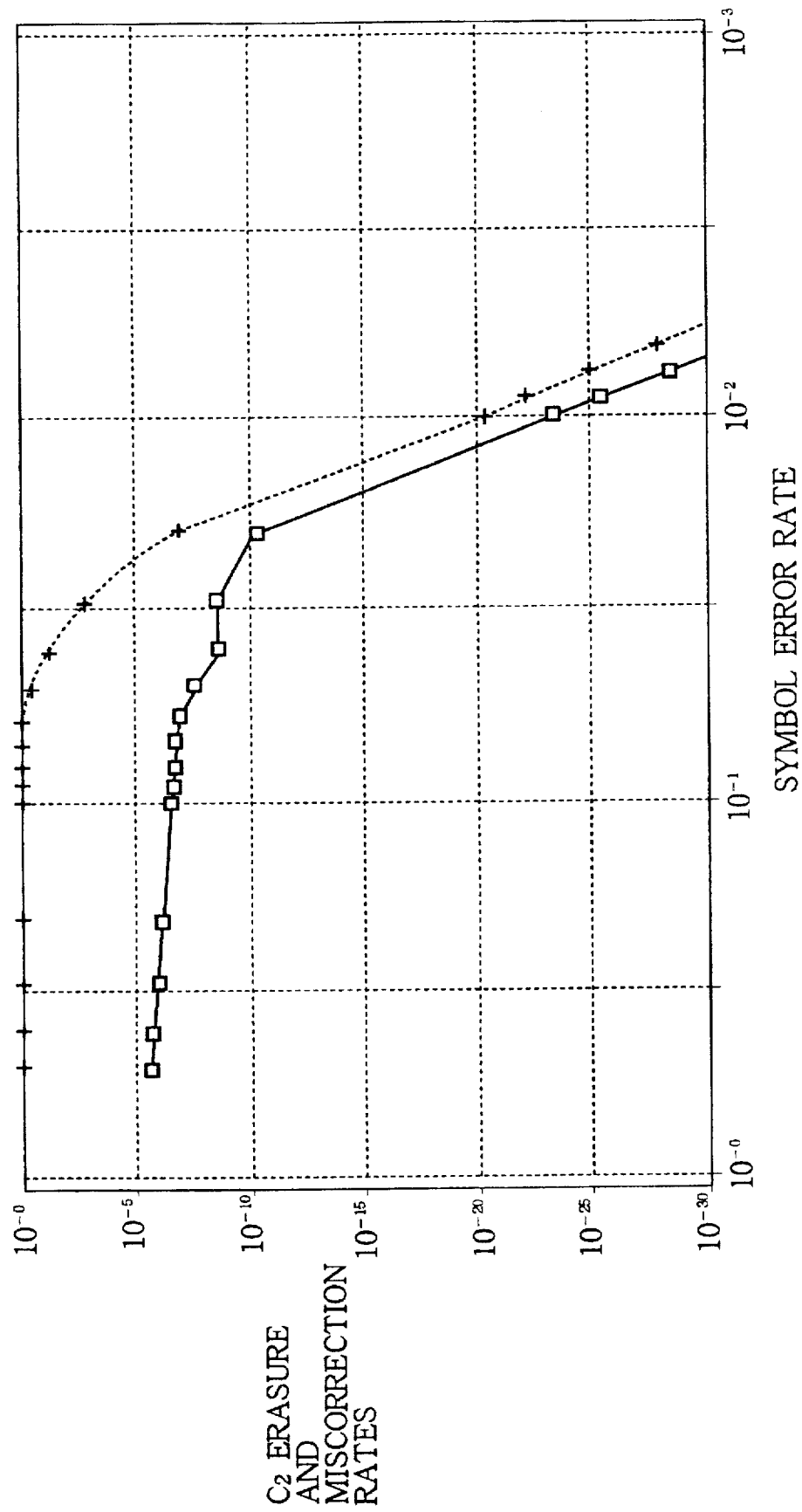
FIG. 5 is a graph illustrating the performance of the first embodiment.
Figure 44:
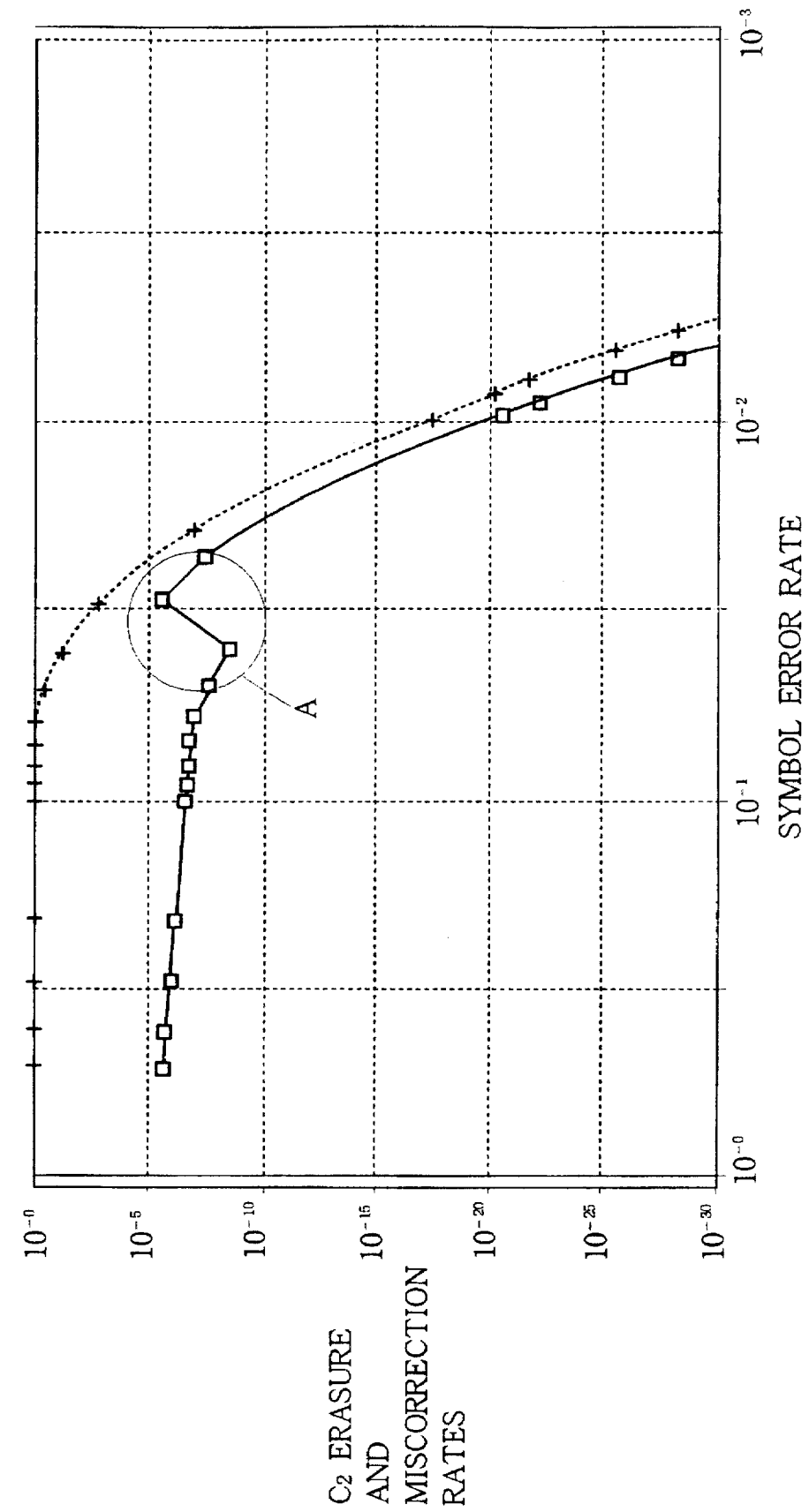
FIG. 44 is a graph illustrating the performance of a conventional decoder.

FIG. 5 illustrates the performance of the decoding procedure described above for various symbol error rates prior to $C_1$ decoding. The horizontal and vertical axes and the curves marked by crosses and squares have the same meaning as in FIG. 44. The addition of the parity check can be seen to lead to a definite improvement over FIG. 44. The miscorrection curve shows no upward jump like that in area A in FIG. 44. For what is commonly taken to be a worst-case symbol error rate of $10^{-2}$ the rate of miscorrected $C_2$ codewords drops by about three orders of magnitude, from about $10^{-20}$ in FIG. 44 to less than $10^{-23}$ in FIG. 5, and the rate of detected but uncorrected errors $C_2$ codewords ($C_2$ erasures) shows a similar decline.

This improvement is due to the detection of miscorrected $C_1$ codewords by the parity check. The parity check is particularly effective because the parity check is carried out using an element $\alpha^{-1}$ that is not a root of the generator polynomial $G_1(z)$ of the $C_1$ code. A similar improvement could be obtained by using any other element $\alpha^p$ that is not a root of $G_1(z)$.

Figure 6:
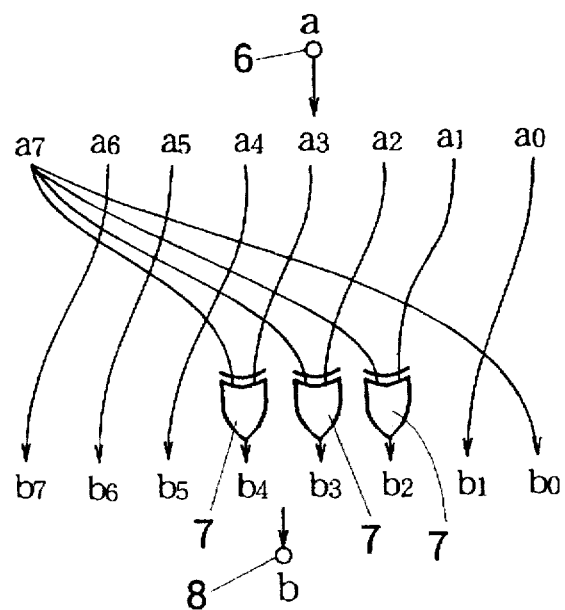
FIG. 6 is a schematic diagram of another multiplier.

With suitable modification of the multiplier circuit shown in FIG. 3, the parity checking circuit shown in FIG. 2 can be employed for other purposes, including $C_1$ encoding and decoding. FIG. 6 shows a similar multiplier circuit structured to carry out multiplication by $\alpha$, where as before, $\alpha$ is a root of $z^8+z^4+z^3+z^2+1$. Like the circuit in FIG. 3, the circuit in FIG. 6 has an input terminal 6, three exclusive-OR gates 7, and an output terminal 8. These elements are interconnected, however, so that the input bits $a_7$ go $a_0$ are rotated one big position to the left, with bit $a_7$ being added to $a_3$, $a_2$, and $a_1$ to generate output bits $b_4$, $b_3$, and $b_2$.

Figure 7:
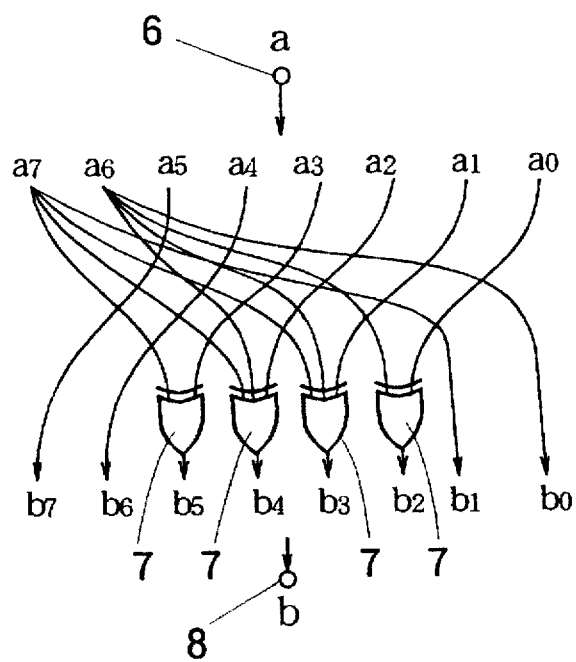
FIG. 7 is a schematic diagram of another multiplier.

FIG. 7 shows a similar multiplier circuit structured to perform multiplication by $\alpha^2$. This circuit requires four exclusive-OR gates 7, including two three-input exclusive-OR gates. A three-input exclusive-OR gate is configured by connecting a pair of two-input exclusive-OR gates in series, so the circuit in FIG. 7 actually requires six exclusive-OR gates, twice as many as the circuits in FIGS. 3 and 6. The circuit in FIG. 7 is also slower, because of the propagation delays of the series-connected exclusive-OR gates.

Although various elements $\alpha^p$ can be selected for generating the parity check symbol, as FIGS. 6 and 7 illustrate, the selection makes a difference to the speed and complexity of the decoding (and encoding) circuits. Of all the elements in $GF(2^8)$, $\alpha^{-1}$ has the advantage of a multiplier circuit of minimum complexity and maximum speed. In the present embodiment the elements $\alpha^0$ and $\alpha^1$ cannot be used, because they are roots of the greater polynomial $G_1(z)$ of the $C_1$ code.

The invention can also be practiced with a $C_1$ generator polynomial of the following form, where j is an integer greater than zero and d is the minimum distance between $C_1$ codewords, so that d−1 is the number of $C_1$ check symbols:

$(z+\alpha^j)(z+\alpha^{j+1}) \ldots (z+\alpha^{j+d-2})$

This makes it possible to use other elements, such as $\alpha^0$ or $\alpha^1$ to generate the parity check symbol. For example if the parity check symbol is generated by the conventional $\alpha^0$ and the $C_1$ code by $(z+\alpha)(z+\alpha^2) \ldots (z+\alpha^{d-1})$ then the parity checking operation and circuit become simpler. The operations required for $C_1$ encoding and decoding, however, become more complex. Use of $(z+\alpha^{-1})$ as the generator polynomial for the parity check symbol and the conventional $G_1(z)$ for the $C_1$ code has the advantage of minimizing overall complexity.

Next a second embodiment of the invention will be described. This embodiment is similar to the first, except that the parameter L employed in $C_2$ decoding is adjusted according to the number of miscorrections found by the parity check following $C_1$ decoding. That is, the $C_2$ decoding algorithm is switched according to the result of the parity check.

Figure 8:
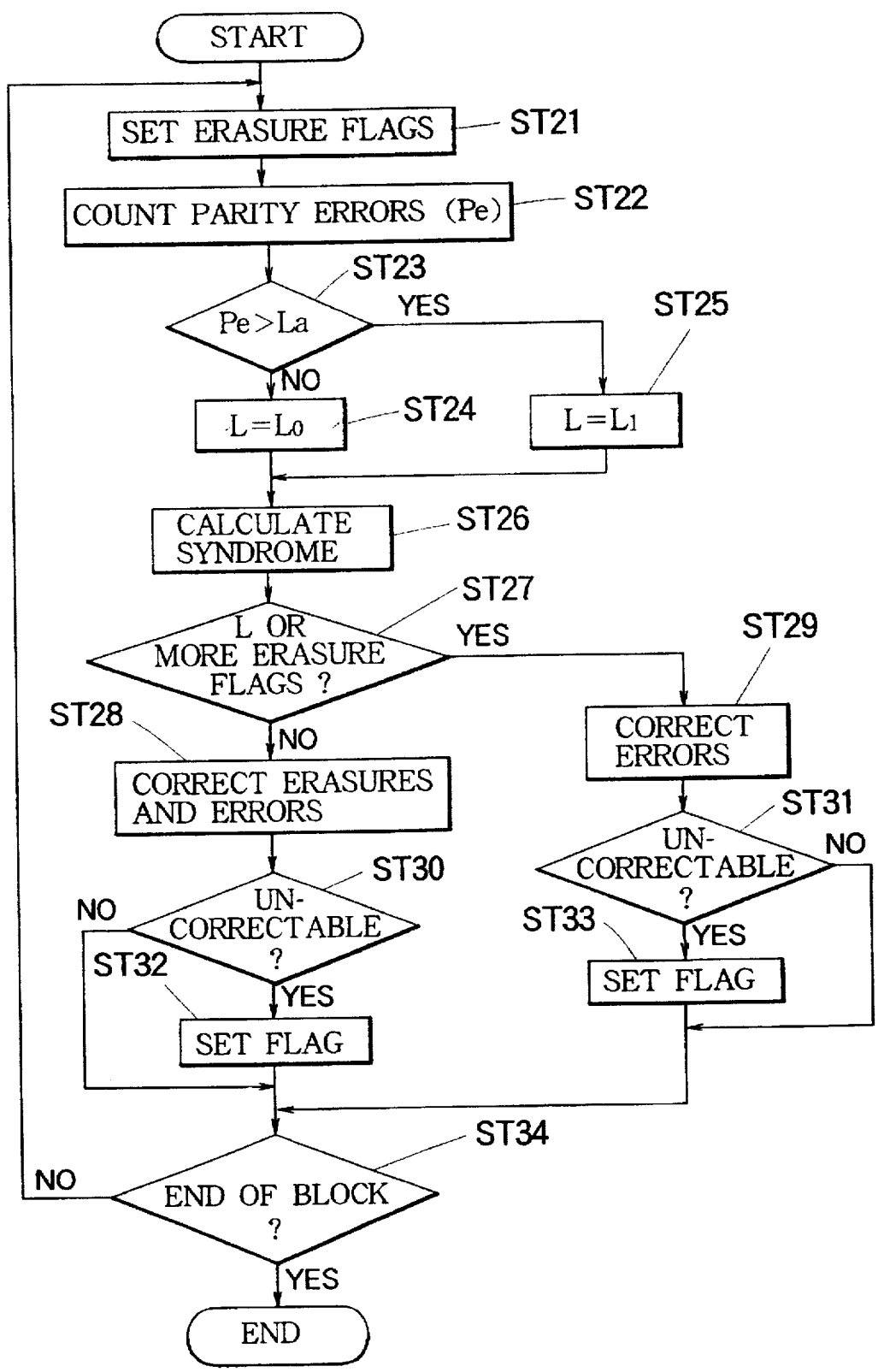
FIG. 8 is a flowchart of a $C_2$ decoding procedure in a second embodiment of the invention.

FIG. 8 shows the $C_2$ decoding procedure of the second embodiment. In the first step ST21, all symbols in $C_1$ icodewords identified as erasures by either $C_1$ decoding or the parity check are flagged as such. In the next step ST22 the number Pe of parity errors is counted; that is, the number of $C_1$ codewords which were not flagged as erasures in $C_1$ decoding but failed the parity check is counted.

In the next step ST23 this parity error count Pe is compared with a threshold value La. If Pe is less than or equal to La, then in the next step ST24 the parameter L is set to a first value $L_0$. If Pe exceeds La, then L is set to a second value $L_1$, which is less than than $L_0$, in step ST25.

$C_2$ decoding then proceeds as in the first embodiment. In step ST26 the syndrome coefficients are obtained. In step ST27 the total number of erasures flagged in step ST21 is compared with the value of L set as above. If the number of erasures is less than L, then the erasure information is used for erasure and error correction in step ST28. If the number of erasures is L or more, the erasure information is ignored and errors-only correction is executed in step ST29. If uncorrectable errors are found in step ST30 or ST31 as a result of either $C_2$ decoding process, then the $C_2$ codeword is flagged as an erasure in step ST32 or ST33. Step ST34 decides whether the $C_2$ codeword just decoded is the last in the block, and if it is not, returns to step ST21 to decode the next codeword.

When many $C_1$ miscorrections are detected because they fail the parity check, this is generally symptomatic of a high symbol error rate in the originally-received data. By reducing the value of the parameter L in this situation and thereby reducing the maximum number of erasures that can be taken into consideration, the second embodiment reduces the error-correcting capability of the $C_2$ code. As a result, the $C_2$ decoding process will correct fewer errors and flag more $C_2$ codewords as having uncorrectable errors. These codewords can then be dealt with by error concealment procedures such as interpolation.

If $L_0$ is the minimum distance between $C_2$ codewords, then when the number Pe of parity errors is within the threshold limit La, the full power of $C_1$–$C_2$ product decoding process is used, obtaining maximum error correction. When the number of parity errors exceeds La, indicating that the $C_1$ decoding results are less reliable, less use is allowed of $C_1$ erasure information, thereby avoiding $C_2$ correction mistakes. The second embodiment accordingly provides improved reliability in the presence of a high symbol error rate, without sacrificing error-correcting capability when the symbol error rate is low.

Figure 9:
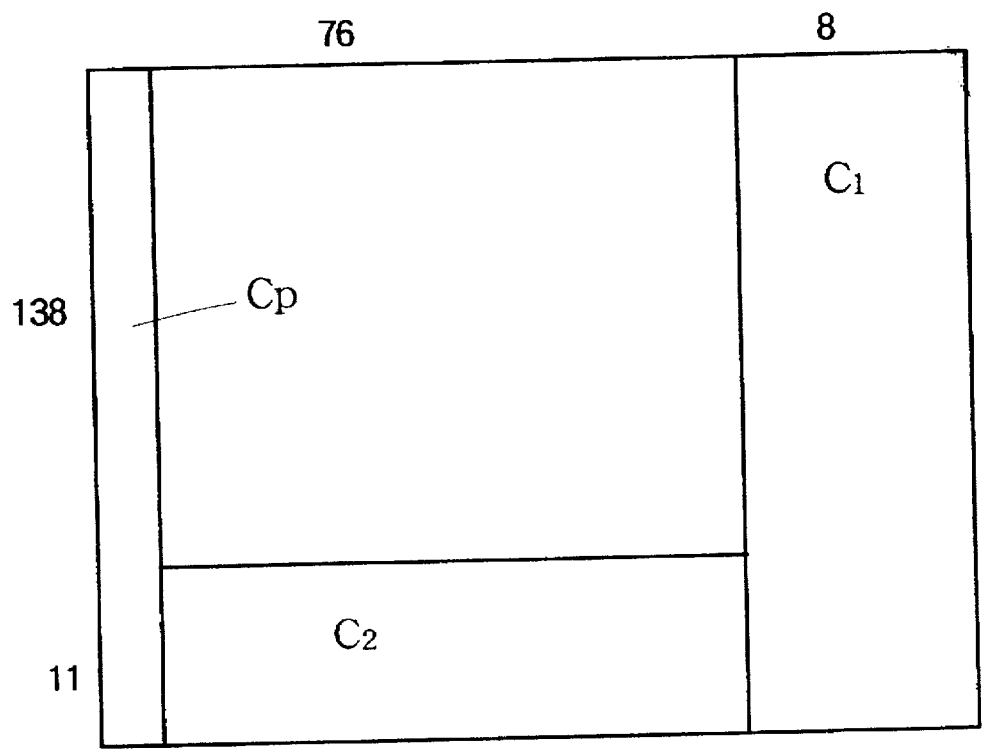
FIG. 9 illustrates the format of another product code with novel parity check symbols, used in a third embodiment.

FIG. 9 shows another possible location for the parity check symbols in the first two embodiments: at the head of the information symbols instead of between the information symbols and $C_1$ check symbols. This is one of many possible variations on the position of the parity check symbols and the way in which they are generated. To mention another possible variation, the information symbols can be taken in one order for generating the parity check symbols and in another order for generating $C_1$ check symbols: e.g. the parity check symbols can be generated by reading the information symbols in order from right to left in FIG. 9; then the $C_1$ check symbols can be generated by reading the parity check and information symbols in order from left to right.

Next a third embodiment of the invention will be described. This embodiment uses the arrangement in FIG. 9, with the parity check symbols at the head of the information symbols.

In some data recording formats the first information symbol in each codeword is an identification (ID) symbol which may or may not be needed. If the ID symbol is present and is not needed, it can be advantageously used to hold the parity check information. This is one of the purposes of the third embodiment. Another purpose is to permit rapid encoding by generating parity check formation concurrently with $C_1$ check information.

Figure 10:
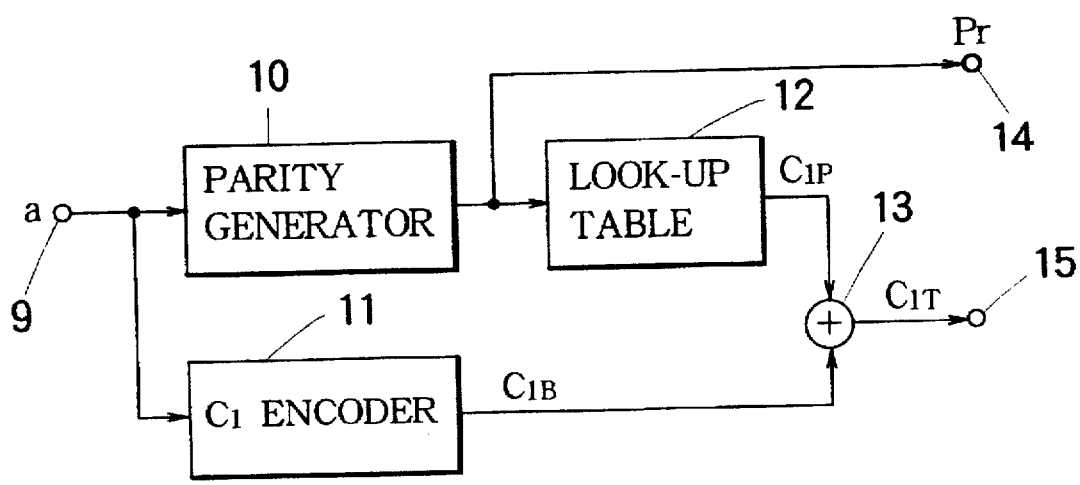
FIG. 10 is a block diagram of an encoder used in the third embodiment.

FIG. 10 shows an encoder for use in the third embodiment. Information symbols are received at an input terminal 9 and provided to a parity generator circuit 10 and a $C_1$ information encoder 11. The $C_1$ information encoder 11 generates a plurality of check symbols $C_{1B}$ from the input information symbols, using a generator polynomial $G_1(z)$ of the same type as in the first embodiment. The parity generating circuit 10 generates a parity check symbol Pr, using an element of the Galois field which is not a root of $G_1(z)$. The parity check symbol is sent to a ROM look-up table 12 and expanded into a plurality of check symbols $C_{1P}$, which are combined by a modulo-two adder 13 with the $C_{1B}$ check symbols output by the $C_1$ information encoder 11. The parity check symbol Pr is also output at an output terminal 14. The sums of the $C_{1P}$ and $C_{1B}$ check symbols are output an output terminal 15 as row check symbols $C_{1T}$.

Figure 11:
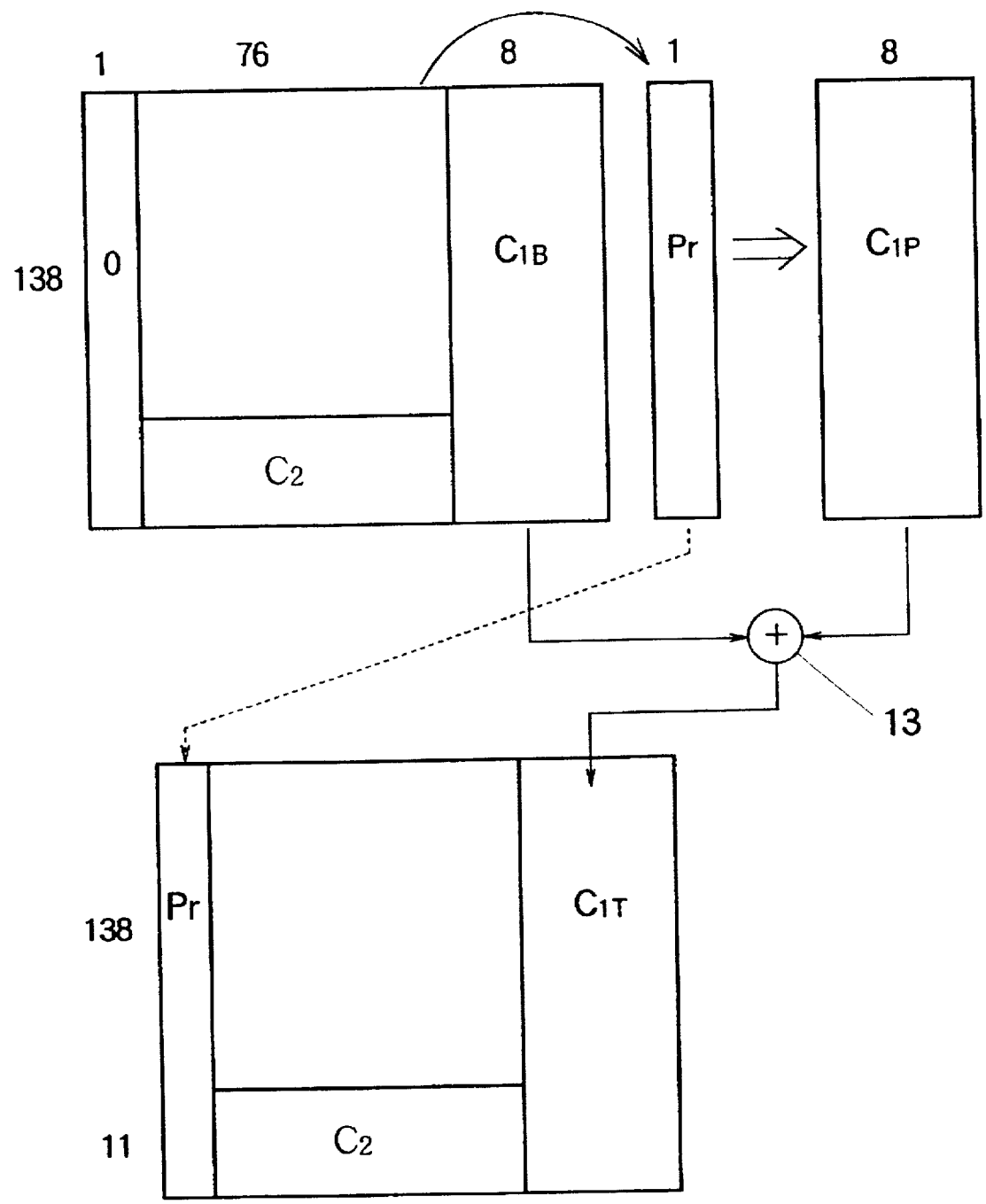
FIG. 11 illustrates the encoding process in the third embodiment.

FIG. 11 illustrates the general encoding process. At the top of FIG. 11, check symbols $C_{1B}$ and parity check symbols Pr are generated from a row-column array in which each row includes of one ID symbol, having a fixed value of zero, and seventy-six information symbols. The ID symbols are not used in generating the $C_{1B}$ or Pr check symbols, or for any other purpose. The $C_{1B}$ check symbols are temporarily appended to the right of the array, while the parity check symbols Pr are expanded into $C_{1P}$ check symbols.

At the bottom of FIG. 11, the parity check symbols Pr have been substituted for the unused ID symbols, and now occupy the first, column of the array. The $C_{1B}$ anti $C_{1P}$ check symbols have been added by the modulo-two adder 13 and the resulting sums ($C_{1T}$ check symbols) have been substituted for the $C_{1B}$ check symbols at the right of the array.

The $C_{1B}$ check symbols can be obtained from the k information symbols (0, $a_{k-2}$, $a_{k-3}$, . . . , $a_0$), including the initial zero ID symbol, by the usual $C_1$ encoding procedure. The parity check symbol is obtained by feeding these k symbols (0, $a_{k-2}$, $a_{k-3}$, . . . , $a_0$) into, for example, the circuit of FIG. 2. In both cases, since the highest-degree coefficient is zero, it makes no difference whether this coefficient is included or not. The parity check symbol Pr is the remainder in the following division operation, and is equal to the dividend polynomial evaluated at $\alpha^{-1}$.

$$(a_{k-2}z^{k-2}+a_{k-3}z^{k-3}+\ldots +a_0)/(z+\alpha^{-1})$$

The parity check symbol Pr of the third embodiment differs from the parity check symbol Cp of the first embodiment in that evaluation of the dividend polynomial is not followed by multiplication by a $\alpha^{-1}$.

Figure 12:
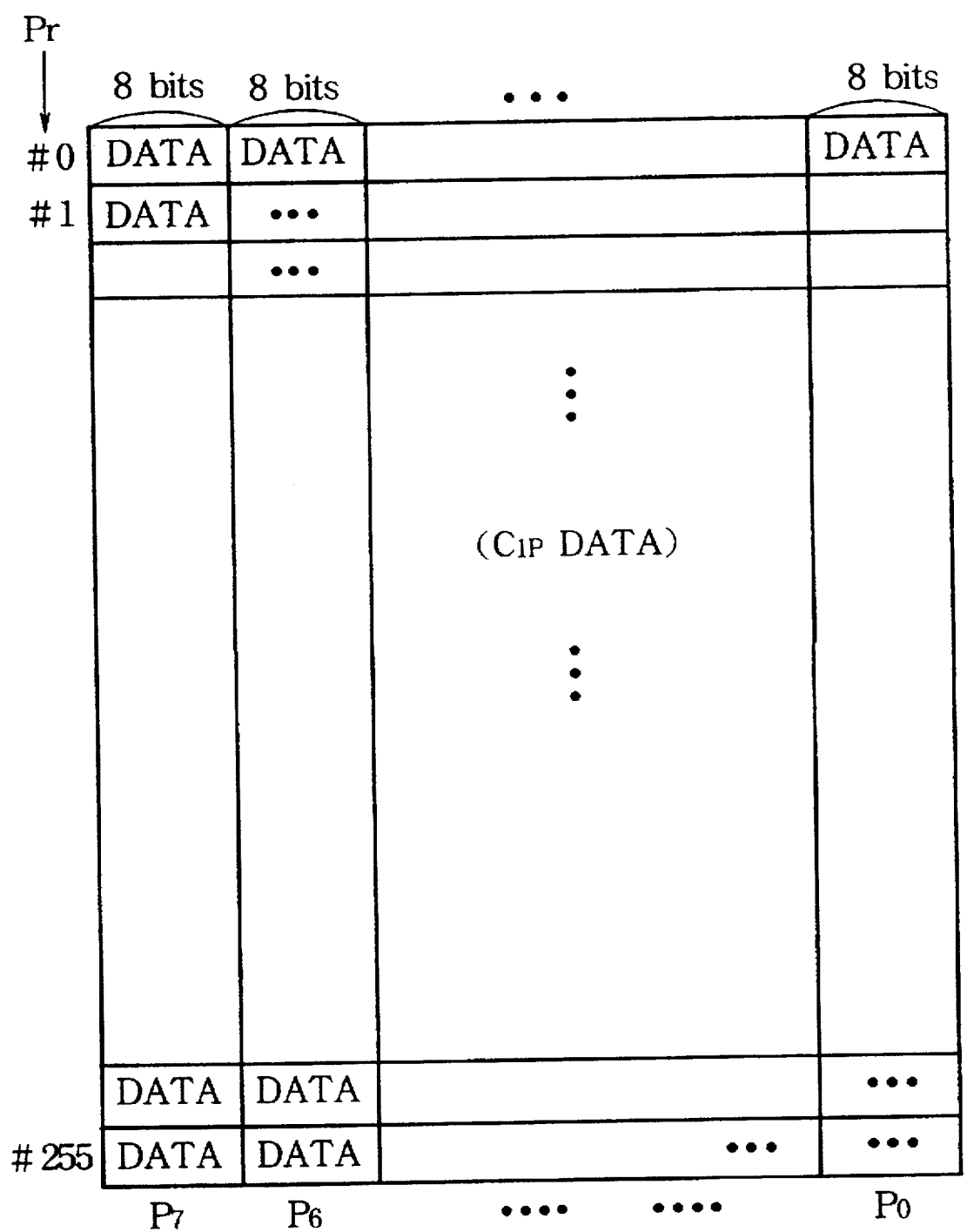
FIG. 12 illustrates a look-up table used in the third embodiment.

Referring to FIG. 12, the ROM look-up table 12 in FIG. 10 bas two hundred fifty-six addresses, corresponding to the possible values of the parity check symbol Pt. Eight $C_{1P}$ check symbols ($P_7$, $P_6$ . . . $P_0$) are stored for each address. The $C_{1P}$ check symbols are obtained by accessing the ROM look-up table 12 at the address indicated by the Pr check symbol and reading out the $C_{1P}$ data. These data are constructed so that when added to the $C_{1B}$ data, they give the same result as if the $C_1$ encoding procedure had been applied to information including the parity check symbol instead of the initial (zero) ID symbol.

The encoding and decoding procedures will now be explained through an example, using $GF(2^3)$ instead of $GF(2^8)$ for simplicity. Table 2 lists the elements of $GF(2^3)$. The prime polynomial that generates this field is:

TABLE 2

P(z) = $Z^3$ + Z + 1
GF ($2^3$)

| Element | Symbol | Element | Symbol |
|---------|--------|---------|--------|
| 0 | 000 | $\alpha^3$ | 011 |
| 1 (= $\alpha^0$) | 001 | $\alpha^4$ | 110 |
| $\alpha$ (= $\alpha^1$) | 010 | $\alpha^5$ | 111 |
| $\alpha^2$ | 100 | $\alpha^6$ | 101 |

The $C_1$ codeword in this example has four information symbols (including the ID symbol) and three check symbols. The information symbols are (0, $a_2$, $a_1$, $a_0$), the initial zero being the unused ID symbol. The other symbols will have the following values in this example:

$$a_2=\alpha^2$$

$$a_1=\alpha^0=1$$

$$a_0=\alpha^3$$

The parity symbol Pr is calculated as follows, by treating the information symbols as coefficients of a polynomial and evaluating this polynomial at $\alpha^{-1}$.

$$\begin{aligned}P_r &= \sum_{i=0}^{2} a_i(\alpha^{-1})^i \\ &= a_0(\alpha^{-1})^0 + a_1(\alpha^{-1})^1 + a_2(\alpha^{-1})^2 \\ &= \alpha^3\alpha^0 + \alpha^0\alpha^{-1} + \alpha^2\alpha^{-2} \\ &= \alpha^3 + \alpha^6 + \alpha^0 = \alpha^5\end{aligned} \quad (62)$$

The $C_1$ check symbols will next be calculated in two ways, to show that both ways give the same result. First they will be calculated directly from the parity check symbol and information symbols, that is, from $$(\text{Pr}, a_2, a_1, a_0)=(\alpha^5, \alpha^2, \alpha^0, \alpha^3)$$

The $C_1$ check symbols generated in this way will be denoted $C_{10}=(P_2, P, P_0)$. The resulting $C_1$ codeword will be:

$$a=(\alpha^5, \alpha^2, \alpha^0, \alpha^3, p_2, p_1, p_0)$$

From coding theory it is known that this codeword satisfies a matrix equation of the form:

$$aH^T=0 \quad (63)$$

In the present case this matrix equation is:

$$(\alpha^5, \alpha^2, 1, \alpha^3, P_2, P_1, P_0) \begin{bmatrix} \alpha^5 & \alpha^6 & 1 \\ \alpha^3 & \alpha^5 & 1 \\ \alpha & \alpha^4 & 1 \\ \alpha^6 & \alpha^3 & 1 \\ \alpha^4 & \alpha^2 & 1 \\ \alpha^2 & \alpha & 1 \\ 1 & 1 & 1 \end{bmatrix} = 0 \qquad (64)$$

The check symbols $C_{1O}$ therefore satisfy the following simultaneous equations.

$$\alpha^5 + \alpha^2 + 1 + \alpha^3 + p_2 + p_1 + p_0 = 0 \qquad (65)$$

$$\alpha^5\alpha^6 + \alpha^2\alpha^5 + \alpha^4 + \alpha^3\alpha^3 + p_2\alpha^2 + p_1\alpha + p_0 = 0 \qquad (66)$$

$$\alpha^5\alpha^5 + \alpha^2\alpha^3 + \alpha + \alpha^3\alpha^6 + p_2\alpha^4 + p_1\alpha^2 + p_0 = 0 \qquad (67)$$

These equations can be solved to obtain $p_2$, $p_1$, and $p_0$. Adding equations (65) and (66) gives:

$$\alpha^5\alpha^6 + \alpha^2\alpha^5 + \alpha^4 + \alpha^3\alpha^3 + \alpha^5 + \alpha^2 + 1 + \alpha^3 + (1+\alpha^2)p_2 + (1+\alpha)p_1 = \alpha^6 + \alpha^6 p_2 + \alpha^3 p_1 = 0 \qquad (68)$$

Adding equations (65) and (67) gives:

$$\alpha^5\alpha^5 + \alpha^2\alpha^3 + \alpha + \alpha^3\alpha^6 + \alpha^5 + \alpha^2 + 1 + \alpha^3 + (\alpha^4+1)p_2 + (\alpha^2+1)p_1 = \alpha^3 + \alpha^5 p_2 + \alpha^6 p_1 = 0 \qquad (69)$$

Multiplying equation (68) by $\alpha^3$ and adding equation (69) gives:

$$\alpha^9 + \alpha^3 + \alpha^9 p_2 + \alpha^5 p_2 = 0$$

$$p_2 = \alpha^2$$

Substituting this result into equation (69) gives:

$$\alpha^3 + \alpha^5\alpha^2 + \alpha^6 p_1 = 0$$

$$p_1 = \alpha^2$$

The results For $P_2$ and $P_1$ can be substituted into equation (65) to obtain $P_0$.

$$\alpha^5 + \alpha^2 + \alpha^0 + \alpha^3 + \alpha^2 + \alpha^2 + p_0 = 0$$

$$p_0 = \alpha^0$$

The complete set of check symbols is thus:

$$C_{1O} = (p_2, p_1, p_0) = (\alpha^2, \alpha^2, \alpha^0)$$

Next, the same check symbols will be calculated by the method of the present embodiment. The first step is to calculate check symbols $C_{1B} = (b_2, b_1, b_0)$ from the information symbols $(0, a_2, a_1, a_0)$ without the parity check symbol. These check symbols can be found by solving the following matrix equation.

$$(0, \alpha^2, 1, \alpha^3, b_2, b_1, b_0) \begin{bmatrix} \alpha^5 & \alpha^6 & 1 \\ \alpha^3 & \alpha^5 & 1 \\ \alpha & \alpha^4 & 1 \\ \alpha^6 & \alpha^3 & 1 \\ \alpha^4 & \alpha^2 & 1 \\ \alpha^2 & \alpha & 1 \\ 1 & 1 & 1 \end{bmatrix} = 0 \qquad (70)$$

This yields the following simultaneous equations for the $C_{1B}$ check symbols:

$$\alpha^2 + 1 + \alpha^3 + b_2 + b_1 + b_0 = 0 \qquad (71)$$

$$\alpha^2\alpha^5 + 1\alpha^4 + \alpha^3\alpha^3 + b_2\alpha^2 + b_1\alpha + b_0 = 0 \qquad (72)$$

$$\alpha^2\alpha^3 + 1\alpha + \alpha^3\alpha^6 + b_2\alpha^4 + b_1\alpha^2 + b_0 = 0 \qquad (73)$$

Adding equations (71) and (72) gives:

$$\alpha^2\alpha^5 + 1\alpha^4 + \alpha^3\alpha^3 + \alpha^2 + 1 + \alpha^3 + (\alpha^2+1)b_2 + (\alpha+1)b_1 = 0$$

$$\alpha^2 + \alpha^6 b_2 + \alpha^3 b_1 = 0 \qquad (74)$$

Adding equations (71) and (73) gives:

$$\alpha^2\alpha^3 + \alpha + \alpha^3\alpha^6 + \alpha^2 + \alpha^0 + \alpha^3 + (\alpha^4+1)b_2 + (\alpha^2+1)b_1 = 0$$

$$\alpha^5 + \alpha^5 b_2 + \alpha^6 b_1 = 0 \qquad (75)$$

Multiplying equation (74) by $\alpha^3$ and adding equation (75) gives:

$$\alpha^3\alpha^2 + \alpha^3\alpha^6 b_2 + \alpha^3\alpha^3 b_1 + \alpha^5 + \alpha^5 b_2 + \alpha^6 b_1 = 0$$

$$(\alpha^2 + \alpha^5)b_2 + 0 = 0$$

$$b_2 = 0$$

Substituting this into equation (75) gives:

$$\alpha^5 + \alpha^5 x 0 + \alpha^6 b_1 = 0$$

$$b_1 = \alpha^6$$

From equation (71), $b_0$ is obtained as follows:

$$\alpha^2 + 1 + \alpha^3 + 0 + \alpha^6 + b_0 = 0$$

$$b_0 = \alpha^2 + 1 + \alpha^3 + \alpha^6 = \alpha^3$$

The complete set of $C_{1B}$ check symbols is thus:

$$C_{1B} = (b_2, b_1, b_0) = (0, \alpha^6, \alpha^3)$$

The $C_{1P}$ check symbols are obtainable from the same matrix equation, using the vector $(Pr, 0, 0, 0, q_2, q_1, q_0)$.

$$(P_r, 0, 0, 0, q_2, q_1, q_0) \begin{bmatrix} \alpha^5 & \alpha^6 & 1 \\ \alpha^3 & \alpha^5 & 1 \\ \alpha & \alpha^4 & 1 \\ \alpha^6 & \alpha^3 & 1 \\ \alpha^4 & \alpha^2 & 1 \\ \alpha^2 & \alpha & 1 \\ 1 & 1 & 1 \end{bmatrix} = 0 \qquad (76)$$

In the present example Pr is $\alpha^5$, so:

$$\alpha^5 + q_2 + q_1 + q_0 = 0 \qquad (77)$$

$$\alpha^6\alpha^5 + q_2\alpha^2 + q_1\alpha + q_0 = 0 \qquad (78)$$

$$\alpha^5\alpha^5 + q_2\alpha^4 + q_1\alpha^2 + q_0 = 0 \quad (79)$$

Adding equations (77) and (79) gives:

$$(\alpha^5+1)x\ \alpha^5+(\alpha^4+1)x\ q_2+(\alpha^2+1)x\ q_1=0$$

$$\alpha^2+\alpha^5 q_2+\alpha^6 q_1=0 \quad (80)$$

Adding equations (77) and (78) gives:

$$(\alpha^6+1)x\ \alpha^5+(\alpha^2+1)x\ q_2+(\alpha+1)x\ q_1=0$$

$$\alpha^0+\alpha^6 q_2+\alpha^3 q_1=0 \quad (81)$$

Multiplying equation (81) by $\alpha^3$ and adding equation (80) gives:

$$\alpha^3\alpha^0+\alpha^3\alpha^6 q_2+\alpha^3\alpha^3 q_1+\alpha^2+\alpha^5 q_2+\alpha^6 q_1=0$$

$$\alpha^3+\alpha^2+(\alpha^2+\alpha^5)x\ q_2=0$$

$$q_2=\alpha^2$$

From equation (80), $$\alpha^6 q_1+\alpha^2+\alpha^5\alpha^2=0$$

$$q_1=\alpha^0$$

From equation (77).

$$\alpha^5+\alpha^2+\alpha^0+q_0=0$$

$$q_0=\alpha^1$$

The complete set of $C_{1P}$ check symbols is:

$$C_{1P}=(q_2, q_1, q_0)=(\alpha^2, \alpha^0, \alpha^1)$$

Adding the $C_{1B}$ check symbols to the $C_{1P}$ check symbols gives the same result as the $C_{10}$ check symbols found earlier.

$$\begin{array}{cccc}
 & 0 & \alpha^6 & \alpha^3 & (C_{1B}) \\
+ & \alpha^2 & \alpha^0 & \alpha^1 & (C_{1P}) \\
\hline
 & \alpha^2 & \alpha^2 & \alpha^0 & (C_{1T})
\end{array} \quad (82)$$

To save time during the encoding process, the $C_{1P}$ check symbols for each parity check symbol Pr are computed in advance and stored in the ROM look-up table 12. FIG. 13 shows the contents of the ROM look-up table 12 for the present example. This table was constructed by applying the procedure above to each possible value of Pr; that is, by substituting different values of Pr into the following matrix equation and solving for $q_2$, $q_1$, and $q_0$.

$$(Pr, 0, 0, 0, q_2, q_1, q_0)x\ H^T=0$$

This equation yields the following simultaneous equations:

$$Pr+q_2+q_1+q_0=0 \quad (83)$$

$$Pr\alpha^6+q_2\alpha^2+q_1\alpha+q_0=0 \quad (84)$$

$$Pr\alpha^5+q_2\alpha^4+q_1\alpha^2+q_0=0 \quad (85)$$

Cramer's rule can be applied as follows to obtain $q_0$:

$$q_0=\frac{1}{\Delta}\begin{vmatrix} 1 & 1 & Pr \\ \alpha^2 & \alpha & Pr\ \alpha^6 \\ \alpha^4 & \alpha^2 & Pr\ \alpha^5 \end{vmatrix} \quad (86)$$

The symbol $\Delta$ denotes the following determinant:

$$\Delta=\begin{vmatrix} 1 & 1 & 1 \\ \alpha^2 & \alpha & 1 \\ \alpha^4 & \alpha^2 & 1 \end{vmatrix}=\alpha+\alpha^4+\alpha^2\alpha^2+\alpha^5+\alpha^2+\alpha^2$$

$$\Delta=\alpha^6$$

The value of $q_0$ is therefore:

$$q_0 = \{Pr\ \alpha^6+Pr\ \alpha^4+Pr\ \alpha^{10}+Pr\ \alpha^5+Pr\ \alpha^8+Pr\ \alpha^7\}/\alpha^6$$

$$= Pr\times\alpha^2/\alpha^6$$

$$= Pr\times\alpha^3$$

Similarly, $q_1$ and $q_2$ can be found as follow:

$$q_1=\frac{1}{\Delta}\begin{vmatrix} 1 & Pr & 1 \\ \alpha^2 & Pr\ \alpha^6 & 1 \\ \alpha^4 & Pr\ \alpha^5 & 1 \end{vmatrix} \quad (87)$$

$$q_1 = \{Pr\ \alpha^6+Pr\ \alpha^4+Pr\ \alpha^7+Pr\ \alpha^{10}+Pr\ \alpha^2+Pr\ \alpha^5\}/\alpha^6$$

$$= Pr\times\alpha/\alpha^6$$

$$= Pr\times\alpha^2$$

$$q_2=\frac{1}{\Delta}\begin{vmatrix} Pr & 1 & 1 \\ Pr\ \alpha^6 & \alpha & 1 \\ Pr\ \alpha^5 & \alpha^2 & 1 \end{vmatrix} \quad (88)$$

$$q_2 = \{Pr\alpha+Pr\ \alpha^5+Pr\ \alpha^8+Pr\ \alpha^6+Pr\ \alpha^2+Pr\ \alpha^6\}/\alpha^6$$

$$= Pr\times\alpha^3/\alpha^6$$

$$= Pr\times\alpha^4$$

The table in FIG. 13 was thus generated from the formulas $q_2=Pr\alpha^4$, $q_1=Pr\alpha^2$, and $q_0=Pr\alpha^3$. A ROM look-up table 12 for $GF(2^8)$ or any other Galois field can be constructed by similar formulas.

The parity and other check symbols in this embodiment can be calculated at high speed, as the information symbols are being input. As noted earlier, the parity check symbol Pr is calculated by using a circuit like that shown in FIG. 2 to work out the following equation (89), which evaluates a polynomial A(z) having the information symbols as coefficients when $z=\alpha^{-1}$ $$Pr=\sum_{i=0}^{k-1} a_i(\alpha^{-1})^i \quad (89)$$

The $C_{1B}$ check symbols can be calculated by conventional encoding circuits, which are well known in the art. The final steps of looking up the $C_{1P}$ check symbols in the ROM look-up table 12 and adding them to the $C_{1B}$ check symbols take very little time. The encoding process of the fourth embodiment is therefore completed in substantially the same time as the conventional encoding process without a parity check symbol.

In the decoding process, conventional $C_1$ decoding is applied to detect and correct errors in the $C_1$ codewords. Next the parity check symbol Pr in each codeword is compared with a value calculated from the other information symbols In the codeword by the above equation (89). If the parity check symbol equals the calculated value, the parity check passes. Otherwise, the parity check fails and the codeword is flagged as having a parity error; that is, a $C_1$ miscorrection is detected. $C_2$ decoding then proceeds as in the first or second embodiment.

The third embodiment can be modified in various ways. For example, the look-up table for the $C_{1P}$ check symbols can be stored in a random-access memory (RAM), or in a so-called flash memory, instead of in ROM. The generator polynomial of the $C_1$ code need not be $$G_1(z)=(z+\alpha^0)(z+\alpha^1)\ldots(z+\alpha^{d-2})$$

It can have the more general form:

$$G_1(z)=(z+\alpha^j)(z+\alpha^{j+1})\ldots(z+\alpha^{j+d-2})$$

The parity check symbol need not be generated from $\alpha^{-1}$ as in the preceding example, it can be generated from any non-zero element $\alpha^p$ of the Galois field that is not a root of the $C_1$ generator polynomial $G_1(z)$.

The third embodiment provides the same advantages as the first and second embodiments of reduced miscorrections and more reliable final results, with the additional advantage of an encoding method which is substantially as fast as the conventional encoding method.

In the preceding embodiments the reliability of $C_1$ decoding results is improved by adding a parity check symbol to each $C_1$ codeword. The reliability of $C_2$ decoding results can be similarly improved by adding a parity check symbol to each $C_2$ codeword. The $C_2$ parity check symbol should be generated using an element of the Galois field that is not a root off the generator polynomial of the $C_2$ code.

The reliability of $C_1$ or $C_2$ decoding results can be further improved by checking the number of bits corrected in each corrected symbol. First the reason for this will be explained, then further embodiments of the invention incorporating this principle will be described.

Consider, for example, information transmitted over a memoryless binary symmetric channel (n channel in which each bit has the same probability of being corrupted in transmission, with equal probabilities that a "0" will be changed to a "1" and that a "1" will be changed to a "0"). If the bit error rate is $P_b$, then the symbol error rate $P_s$ is given by the following equation, in which $_8C_i$ denotes the number off combinations of eight objects taken i at a time.

$$P_s = \sum_{i=1}^{n} {_8C_i} P_b^i (1-P_b)^{8-i} \quad (90)$$

If the bit error rate $P_b$ is $10^{-3}$, then the probability $Ps_1$ of a one-bit error in a symbol is:

$$\begin{aligned}Ps_1 &= {_8C_1} Pb(1-Pb)^7 \\ &= 8\times10^{-3}\times(0.999)^7 \\ &= 7.94\times10^{-3}\end{aligned}$$

Similarly, the probability of a two-bit error is:

$$\begin{aligned}Ps_2 &= {_8C_2} Pb^2(1-Pb)^6 \\ &= 28\times10^{-6}\times(0.999)^6 \\ &= 2.78\times10^{-5}\end{aligned}$$

The probability of a three-bit error is:

$$\begin{aligned}Ps_3 &= {_8C_3} Pb^3(1-Pb)^5 \\ &= 56\times10^{-9}\times(0.999)^5 \\ &= 5.57\times10^{-8}\end{aligned}$$

In comparison with the above probabilities, the probability of a four-bit error is so small as to be negligible.

$$Ps_4 = {_8C_4} Pb^4(1-Pb)^4 \approx 0$$

Similarly, the probability of a symbol having five or more bits in error is negligible.

$$Ps_5 = Ps_6 = Ps_7 = Ps_8 \approx 0$$

The same tendency is observed at all bit error rates $P_b$ from $10^{-2}$ to $10^{-5}$. In a memoryless binary symmetric channel, almost all symbol errors are one-bit errors.

Figure 14:
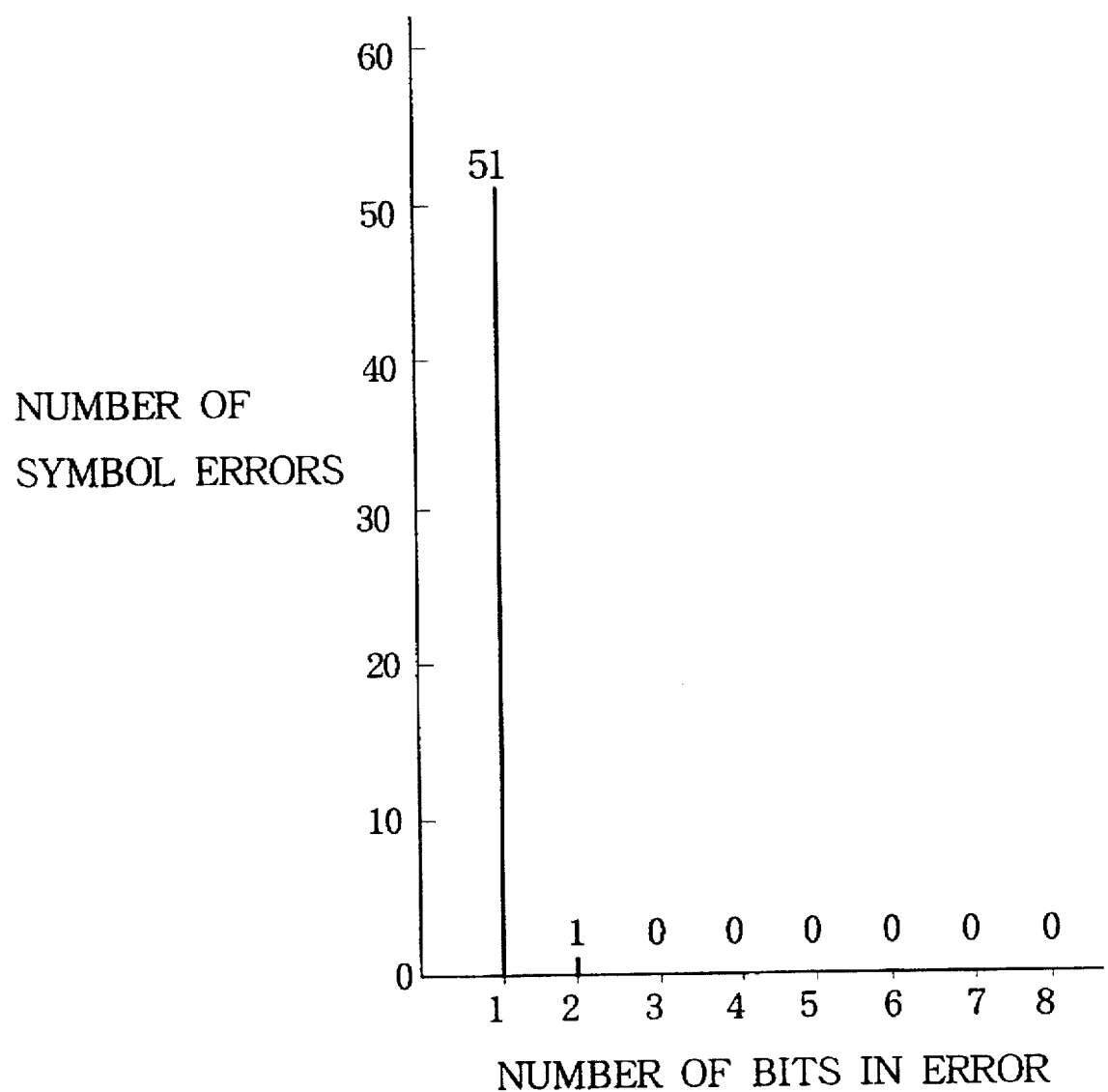
FIG. 14 shows the distribution of types of errors in symbols read from a video tape.

FIG. 14 shows the distribution of number of bits in error for symbols read from a digital video tape. These data were obtained by recording 220, 230 eight-bit symbols with a 24/25 modulation scheme being. (In this modulation scheme, which is under consideration for use in a commercial digital video tape recorder, twenty-four data bits are recorded as twenty-five bits on the tape.) When the symbols were read from the tape and reproduced without error correction, fifty-two symbols were in error, giving an average symbol error rate Ps of $2.86\times10^{-4}$. Of these fifty-two symbols, fifty-one had one-bit errors, and one had a two-bit error.

A somewhat similar situation occurs for signals recorded optically by eight-four modulation (EFM) on compact discs: here the majority of the errors are known to be two-bit errors. For a wide variety of actual digital recording media and communication channels, the errors occurring in eight-bit symbols are found to be predominantly one-bit or two-bit errors.

Figure 15:
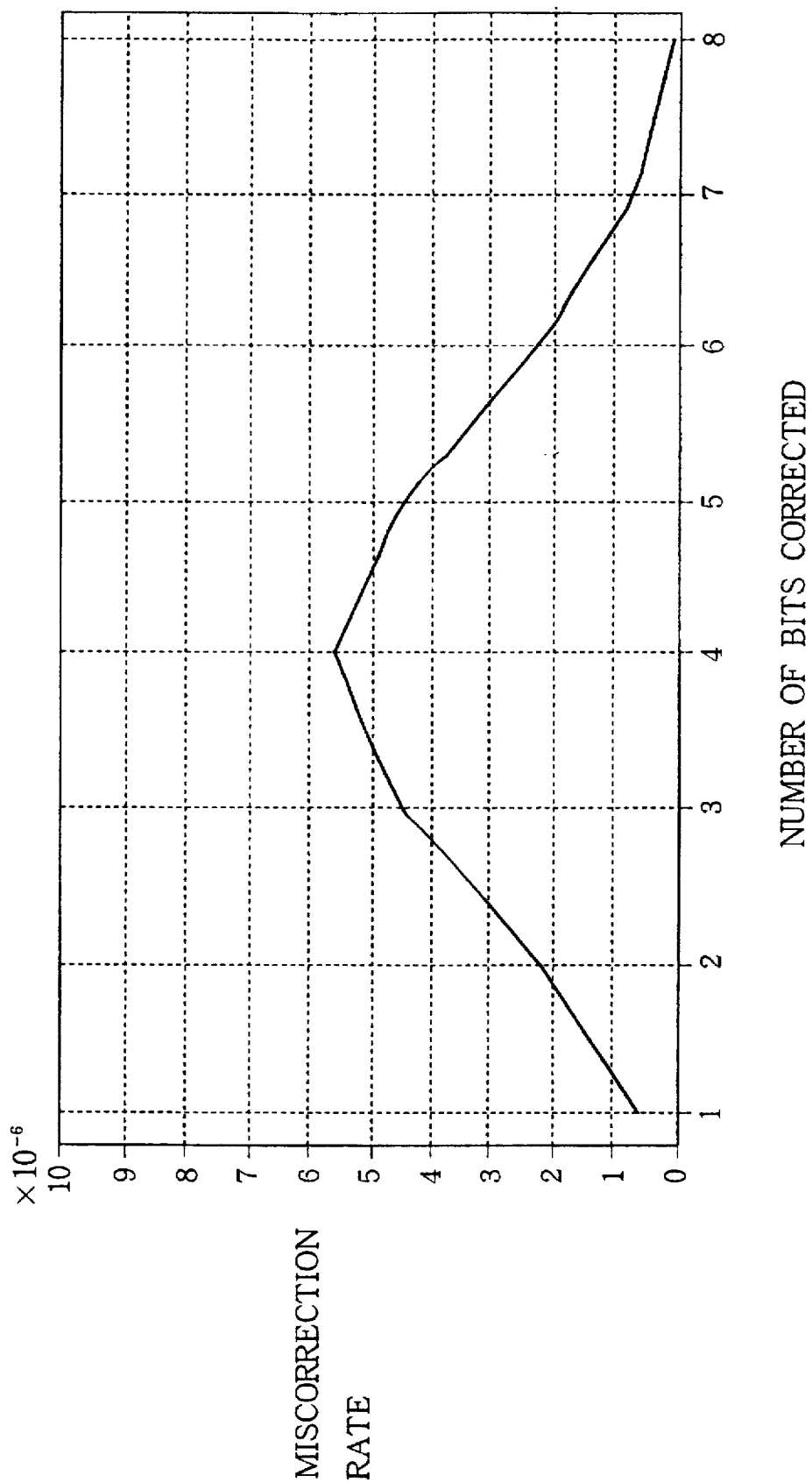
FIG. 15 shows the distribution of types of errors in simulated miscorrections of data received from a communication channel.

For errors due to miscorrection by a decoder, however, the situation is quite different. FIG. 15 5 shows results of a computer simulation of miscorrections by a Reed-Solomon code over $GF(2^8)$ with seventy-seven information symbols and eight check symbols, assuming a received symbol error rate $P_s$ of $10^{-2}$. One hundred thousand $C_1$ codewords were decoded with correction of a maximum of four symbols per codeword, miscorrections were noted, and the number of corrected bits in each miscorrected symbol was counted. That is, the number of non-zero bits in the error pattern of each miscorrected symbol was counted. This number will be referred to as the bit weight of the error pattern of that symbol.

As FIG. 15 shows, the distribution of bit weights in miscorrected symbols is similar to a binomial distribution with a peak at the central value of four bits. Although not shown in FIG. 15, in symbols that were corrected correctly, the bit weight of the error pattern (number of bits corrected) was almost always one or two. Thus the error patterns of most miscorrected symbols had a bit weight of three or more, as indicated in FIG. 15, while the error patterns of correctly corrected symbols almost always had a bit weight of two or less.

Miscorrections can accordingly be identified with a fairly high degree of probability by looking for symbols in which more than two bits were corrected. The bit weight of the error pattern symbols can be used to provide a second check on the reliability of error correction, either in addition to or instead of the parity check described in the preceding embodiments.

A somewhat similar check can be obtained by considering the symbol weight of the error pattern, which is the number of symbols corrected (the number of non-zero error pattern symbols.) As a general rule, the greater the number of symbols corrected in a codeword is, the greater the chance of miscorrection of that codeword becomes. Thus a codeword in which four symbols have been corrected is more likely to have been miscorrected than a codeword in which only one symbol was corrected.

Figure 16:
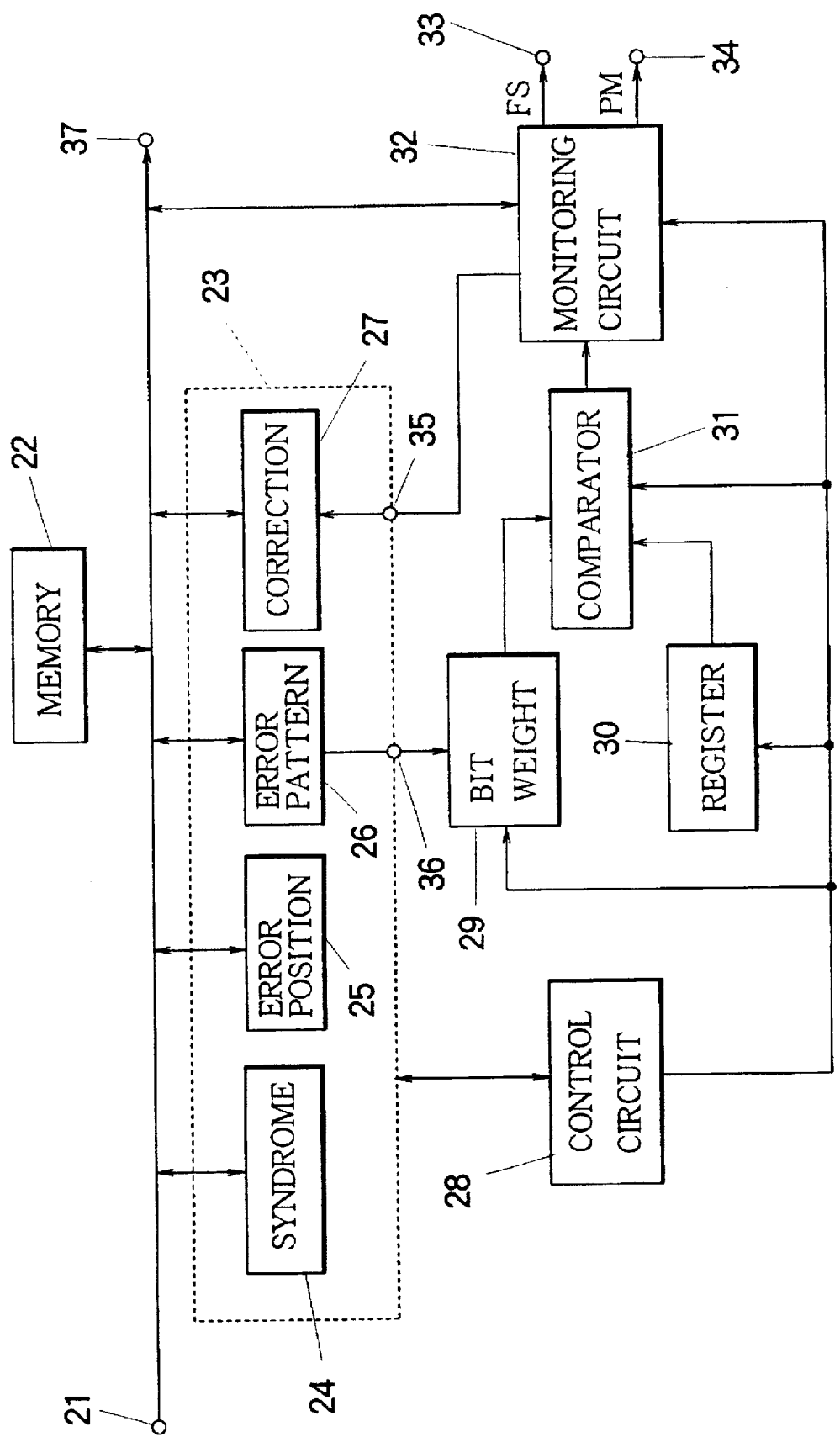
FIG. 16 is a block diagram of a novel decoder illustrating a fourth embodiment of the invention.

As a fourth embodiment of the invention, FIG. 16 illustrates a novel decoder adapted to assess the reliability of error correction in light of the bit weight and symbol weight of the error pattern. Symbols are received at an input terminal 21, stored in a memory 22, and corrected by an error detecting and correcting unit 23. The actual hardware structure of this error detecting and correcting unit 23 can be similar to the conventional structure shown in FIGS. 37 to 40, but conceptually, this structure can be considered to include of a syndrome calculation module 24, an error position calculation module 25, an error pattern calculation module 26, and an error correction module 27. The error detecting and correcting unit 23 is controlled by a decoding control circuit, 28.

In addition to the error detecting and correcting unit 23, the decoder in FIG. 16 provides a bit-weight calculation circuit 29, a threshold register 30, a comparator 31, and a monitoring circuit 32, which are also controlled by the decoding control circuit 28. The monitoring circuit 32 outputs erasure flags FS at an output terminal 33, reliability information PM at an output terminal 34, and inhibiting signals at a terminal 35. These inhibiting signals disable the error correction module 27.

The bit-weight calculation circuit 29 receives error patterns from the error pattern calculation module 26 at a terminal 36 and calculates the bit weight of each symbol in the error pattern, by counting the number of "1's." The comparator 31 compares the bit weight of each symbol in the error pattern with a threshold value $L_B$ obtained from the threshold register 30, and notifies the monitoring circuit 32 of the result. For each codeword, the monitoring circuit 32 counts the number of symbols with bit weights greater than or equal to $L_B$. If this number exceeds a certain limit q, the monitoring circuit 32 sets an erasure flag FS for that symbol and sends an inhibiting signal to the error correction module 27 to prevent correction of that codeword.

When the error correction module 27 does not receive an inhibiting signal, it carries out the usual corrections on codewords stored in the memory 22. Corrected codewords, and codewords in which no errors were found, are output at a data output terminal 37.

Using error location information from the error position calculation module 25, for example, the decoding control circuit 28 counts the number of symbols corrected in each codeword and informs the monitoring circuit 32, which outputs a corresponding reliability value PM for the codeword at terminal 34. The reliability value may be based on the corrected symbol count alone, or may also take into account the number of error pattern symbols with bit weights of $L_B$ or more, as reported by the comparator 31.

In the fourth embodiment (and other embodiments described herein) error correction can be intentionally restricted to reduce the probability of miscorrection. If the minimum distance between codewords is D, for example (i.e. the number of check symbols is D−1), then for corrections of errors of unknown location, the maximum number of symbols corrected per codeword can be restricted to any number $t_a$ not exceeding one-half of D−1; that is, to [(D−1)/2] or any smaller positive integer. The miscorrection probability is reduced if $t_a$ is strictly less than [(D−1)/2].

If error correction is restricted to $t_a$ symbols, then the parameter q should have a value between one and $t_a$ ($1 \leq q < t_a$). Appropriate selection of the parameters $t_a$ and q can provide effective protection from miscorrections due to burst errors, as these miscorrections tend to produce correction of the maximum number $t_a$ of symbols, with correction of a large number of bits in many of these symbols.

The erasure flags FS and reliability information PM output; by the monitoring circuit 32 in FIG. 16 can be used in various ways, several of which will be described in the following embodiments. Some of these embodiments use the erasure flags FS, or the erasure flags FS and reliability information PM, in decoding. Others use the bit-weight or symbol-weight information to make soft corrections; that is, to defer doubtful corrections until additional confirmation is received.

Figure 17:
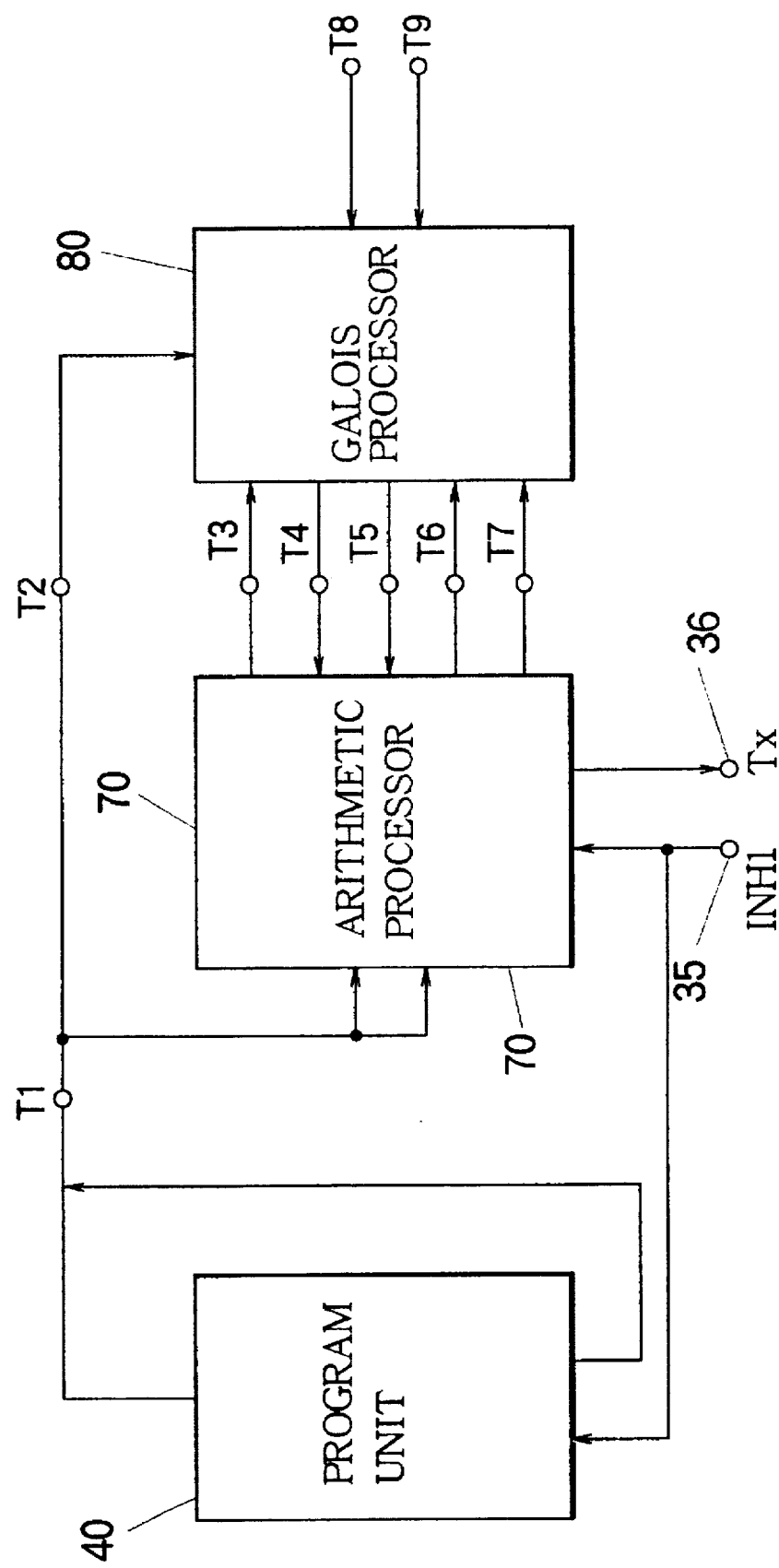
FIG. 17 is a block diagram of hardware for implementing the decoder In FIG. 16.

FIG. 17 is a general block diagram of the error detecting and correcting unit 23 used in the following embodiments. The program unit 40 and Galois processor 80 are similar to the conventional blocks with the same reference numerals in FIG. 37, except that the program and other data stored in the program unit 40 are adapted for carrying out functions of the decoding control circuit 28 in FIG. 16. For example, the values of the parameters $L_B$ and q can be stored in the program unit 40.

The arithmetic processor 70 in FIG. 17 is similar to the arithmetic processor 50 in FIG. 37, but has additional facilities, which will be shown later, for making use of erasure and reliability information in $C_2$ decoding. The arithmetic processor 70 outputs error pattern symbols at terminal 36, and receives inhibiting signals (INHI) at terminal 35. Terminals 35 and 36 are identical to the terminals with the same reference numerals in FIG. 16. Inhibiting signals INHI are also input to the program unit 40, where they cause a branch in program execution.

Figure 18:
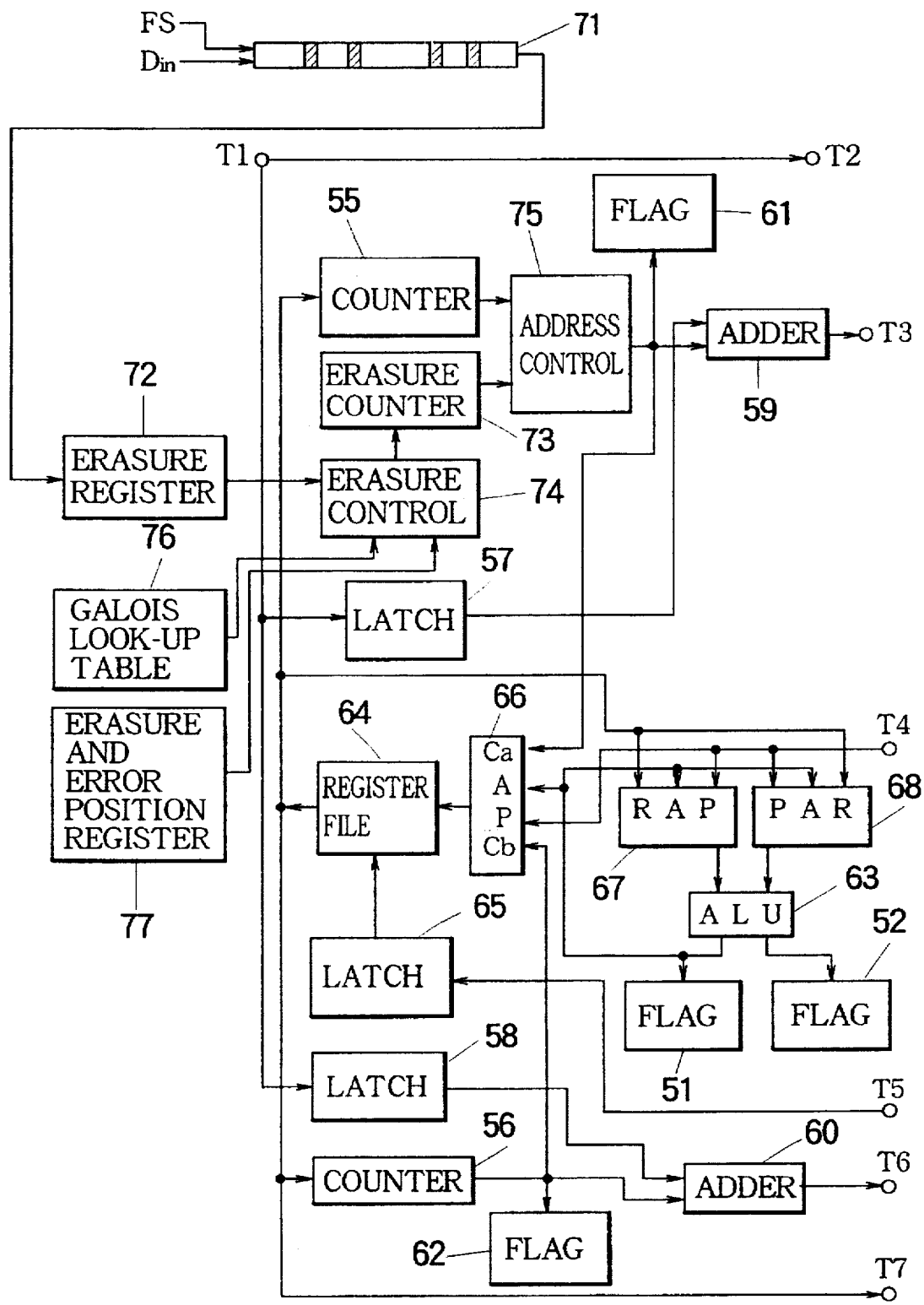
FIG. 18 is a block diagram of an arithmetic processor used in a fifth embodiment of the invention.

FIG. 18 shows the structure of the arithmetic processor 70 in the fifth embodiment. Elements identical to elements of the conventional arithmetic processor in FIG. 39 have the same reference numerals and perform the same functions. Only the new elements will be described below.

The arithmetic processor 70 has a shift register 71 that stores both received symbol data Din and erasure flags FS. Symbols flagged as erasures are indicated by shading in the drawing. The symbol data are stored in the memory 22 in FIG. 16. The erasure flags are stored in an erasure register 72. The erasure register 72 is an n-bit register, where n is the number of symbols per $C_2$ codeword. Erasures are indicated by setting the corresponding bit to "1" in the erasure register 72.

The erasure flags are counted by an erasure counter 73, which receives the contents of the erasure register 72 through an erasure control circuit 74. The count value in the erasure counter 73 is output to an address control circuit 75, which also receives an error count from the up-down counter 55. From the error and erasure counts, the address control circuit 75 generates an address count, which is added to the value in latch 57 by adder 59 to generate a RAM address.

The erasure control circuit 74 is coupled to a Galois look-up table 76, wherein the erasure control circuit 74 converts the position of each erasure flag to an element of the Galois field. The addressing scheme is, for example, the scheme described earlier, in which successive positions are designated by $\alpha^0, \alpha^{-1}, \alpha^{-2}, \ldots$. The positions of up to d−1 erasures and errors are stored in an erasure/error position register 77, which is organized as an 8×(d−1)-bit RAM. The parameter d−1 is the number of $C_2$ check symbols. Addresses in the erasure/error position register 77 are generated by the address control circuit 75 and adder 59 from the error and erasure counts provided by the counter 55 and erasure counter 73.

Next the operation of the fifth embodiment will be described.

In $C_1$ decoding no erasure flags are received, and the arithmetic processor 70 In FIG. 18 operates like the arithmetic processor 50 In FIG. 39. The monitoring circuit 32 in FIG. 16 generates erasure flags for $C_1$ codewords FS as described in the fourth embodiment. Additional erasure flags FS are generated if the error detecting and correcting unit 23 detects uncorrectable errors. Still further erasure flags FS may be generated by a parity check as described in the first embodiment.

In $C_2$ decoding, all of these erasure flags are input to the shift register 71, together with $C_2$ codewords read from the memory 22 in FIG. 16. The $C_2$ decoding procedure will be described with reference to FIGS. 19 to 23.

Figure 19:
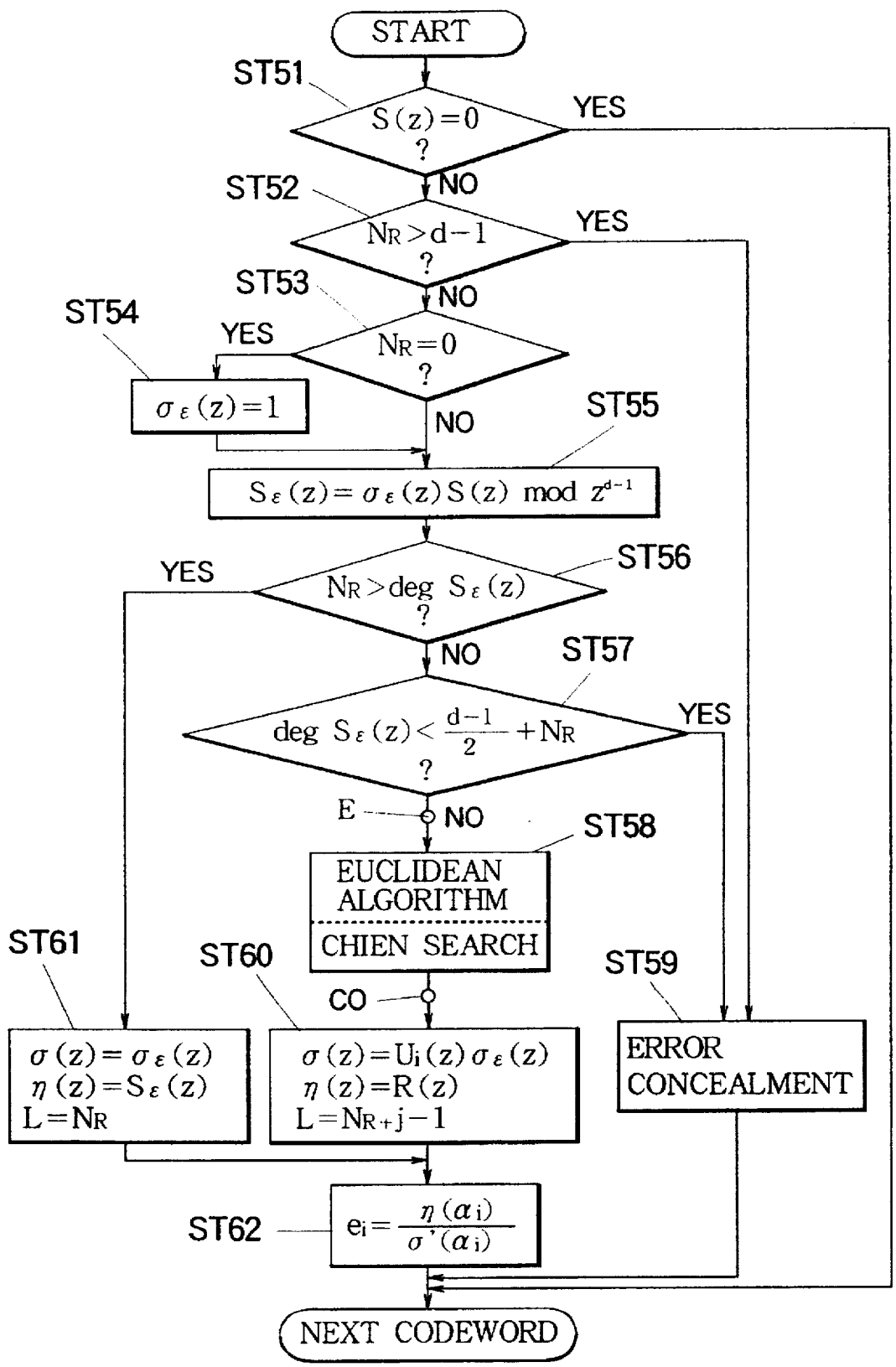
FIG. 19 is a flowchart of the $C_1$ error-correcting process in the fifth embodiment.

Referring to FIG. 19, in the first step ST51 a $C_2$ codeword is input and its syndrome polynomial S(z) is calculated. If all syndrome coefficients are zero, the codeword is presumed correct and output without correction.

In the next step ST52, the number of erasure flags ($N_R$) is counted by the erasure counter 73 and compared with the number of $C_2$ check symbols (d−1). If there are more erasure flags than $C_2$ check symbols, the codeword is treated as uncorrectable and a branch is made to step ST59, described below. If there are not more erasure flags than $C_2$ check symbols, the erasure control circuit 74 in FIG. 18 converts the erasure locations to elements $\alpha_i$ of the Galois field, using the look-up table 76, and stores these elements in the erasure/error position register 77.

In the next step ST53, the number of erasure flags compared with zero. If there are no erasure flags, the polynomial $\sigma^\epsilon$ described in the background of the invention is set to unity (1) in step ST54. Otherwise, $\sigma_\epsilon$ is set to the value given in equation (14); that is, to the product of terms of the form $(z-\alpha_i)$, where the $\alpha_i$ (read from the erasure/error position register 77) designate the erasure positions.

In the next step ST55 a modified syndrome polynomial $S_\epsilon$(z) is calculated as the product of $\sigma^\epsilon$(z) and S(z), taken modulo $z^{d-1}$.

In the next step ST56, the degree of the modified syndrome polynomial $S_\epsilon$(z) is compared with the number $N_R$ of erasure flags. The degree of $S_\epsilon$(z) can be found in substantially the same way as the degree of the syndrome polynomial S(z) was found, as described in the background of the invention. If the number of erasure flags exceeds the degree of $S_\epsilon$(z), then all errors are erasures, and a branch is made to step ST61, described below.

If the number of erasure flags does not exceed the degree of $S_\epsilon$(z), then additional errors are present. In the next step ST57, the degree of $S_\epsilon$(z) is compared with the quantity (d−1)/2+$N_R$. If the degree of $S_\epsilon$(z) is not less than (d−1)/2+$N_R$, then the Euclidean algorithm and Chien search are executed in step ST58. This step will be described in more detail below. If the degree of $S_\epsilon$(z) is less than (d−1)/2+$N_R$, the errors are uncorrectable and step ST59 is executed.

Step ST59 is an error concealment step in which the uncorrectable $C_2$ codeword is replaced by, for example, data interpolated from preceding and following codewords. If $N_R$>d−1 in step ST52, then an entire block of codewords is uucorrectable, and the entire block must be interpolated.

The Euclidean algorithm and Chien search as executed in step ST58 will be described with reference to FIGS. 20 23.

Figure 20:
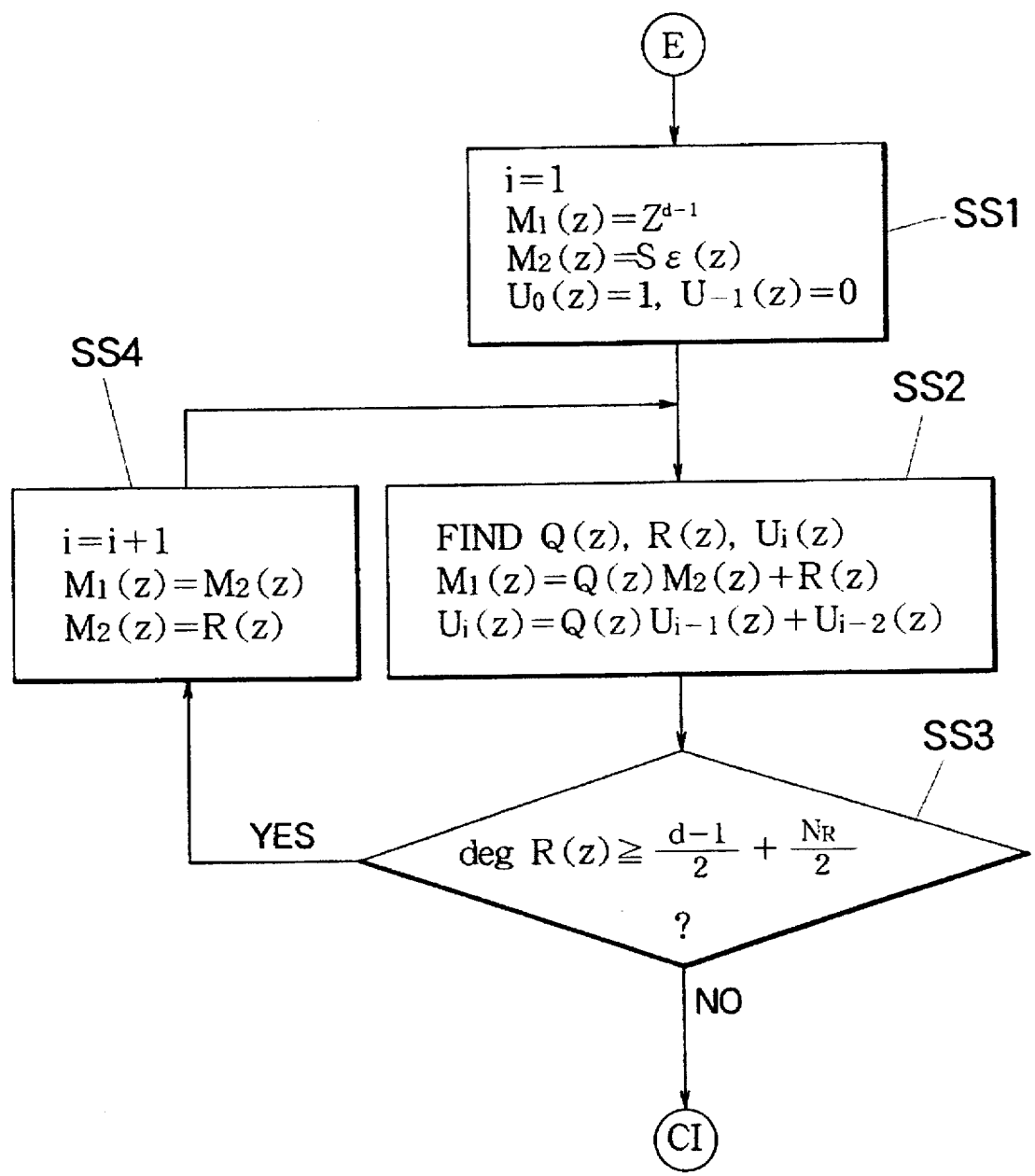
FIG. 20 is a more detailed flowchart of the Euclidean algorithm as executed in FIG. 19.

Referring to FIG. 20, the Euclidean algorithm begins with an initialization step SS1 in which a parameter i is set to unity, a polynomial $M_1$(z) is initialized to $z^{d-1}$, and a polynomial $M_2$(z) is initialized to $s_\epsilon$(z). Additional polynomials $U_0$(z) and $U_{-1}$(z) are initialized to one and zero, respectively.

In the next step SS2, $M_1$(z) is divided by $M_2$(z) to obtain a quotient Q(z) and remainder R(z), and a polynomial $U_i$(z) is set equal to $Q(z)U_{i-1}(z)+U_{i-2}(z)$. In the first iteration, when i=1 a polynomial $U_1$(z) is set to $Q(z)U_0(z)+U_{-1}(z)$, which is equal to Q(z).

In the next step SS3, the degree of the remainder R(z) is compared with the quantity (d−1)/2+$N_R$. If the degree of R(z) is greater than or equal to (d−1)/2+$N_R$, then in step SS4 the parameter i is incremented by one, $M_1$(z) is replaced by $M_2$(z), and $M_2$(z) is replaced by R(z); then the procedure loops back to step SS2.

Figure 21:
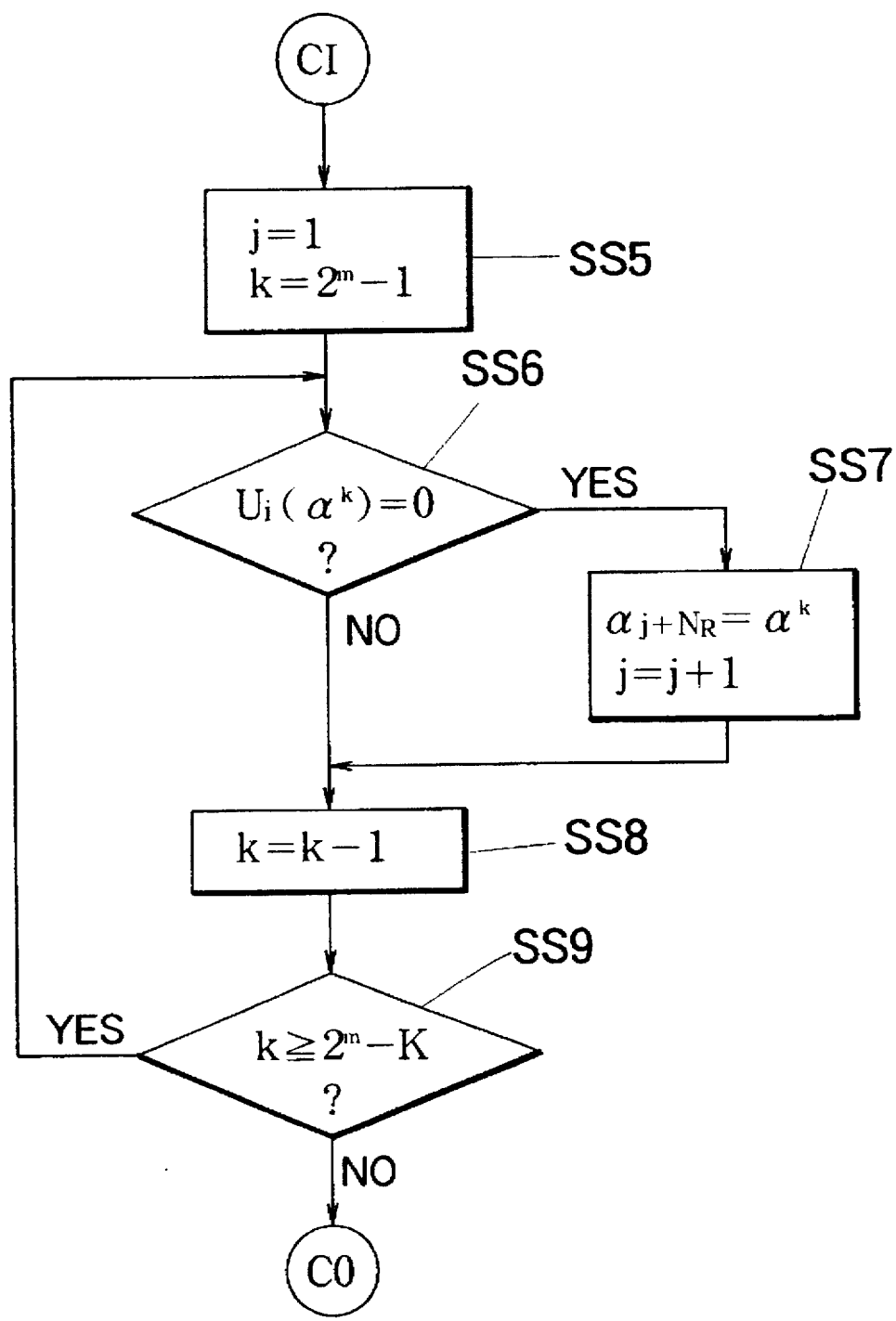
FIG. 21 is a more detailed flowchart of a Chien search as executed in FIG. 19.

When the degree of the remainder R(z) is reduced to a value less than (d−1)/2+$N_R$, a branch is made to FIG. 21 to execute the Chien search. In step SS5 a parameter j is initialized to unity, and a parameter k is initialized to $2^m-1$, where $2^m$ is the number of elements in the Galois field ($2^8$ in the present embodiment). In step SS6 the Galois field element $\alpha^k$ is tested to see if it is a root of the polynomial $U_i$(z). If it is, then in step SS7 $\alpha^k$ is stored in the erasure/error position register 77 as the location of the (j+$N_R$)-th error, and j is incremented by one. Next, in step SS8, parameter k is decremented by one. In step SS9 a test is made to see if $\alpha^k$ still designates a position in the information part of the $C_2$ codeword. The lower-case letter k on the left of the inequality sign in step SS9 is the above parameter k. The upper-case K on the right of the inequality sign is the number of information symbols per $C_2$ codeword. If k≥$2^m$−K then $\alpha^k$ still designates a location in the information part of the codeword, and a return is made to step SS6 to find the next root of $U_i$(z).

Figure 22:
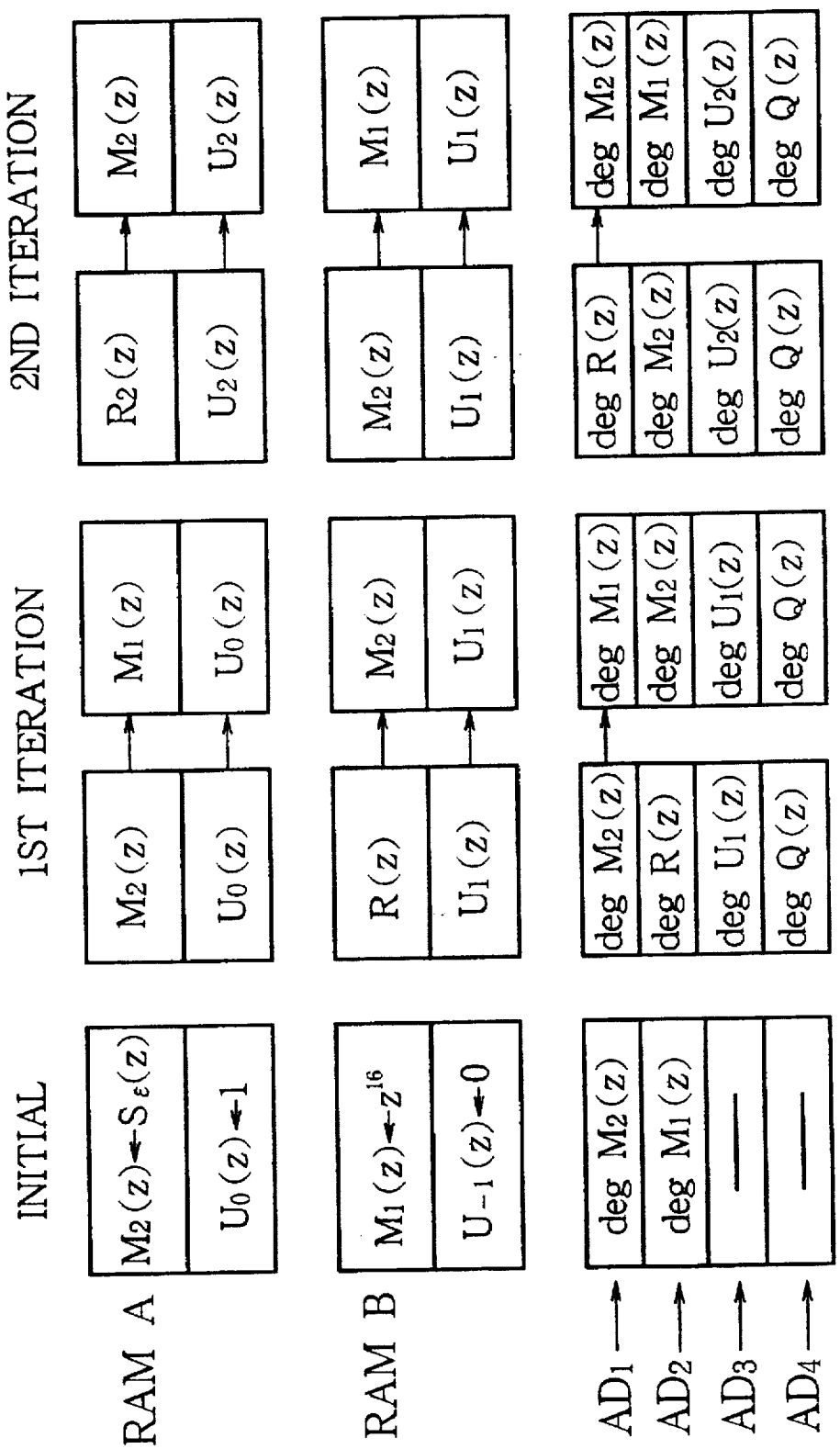
FIG. 22 illustrates memory and register contents during execution of the Euclidean algorithm in the fifth embodiment.
Figure 40:
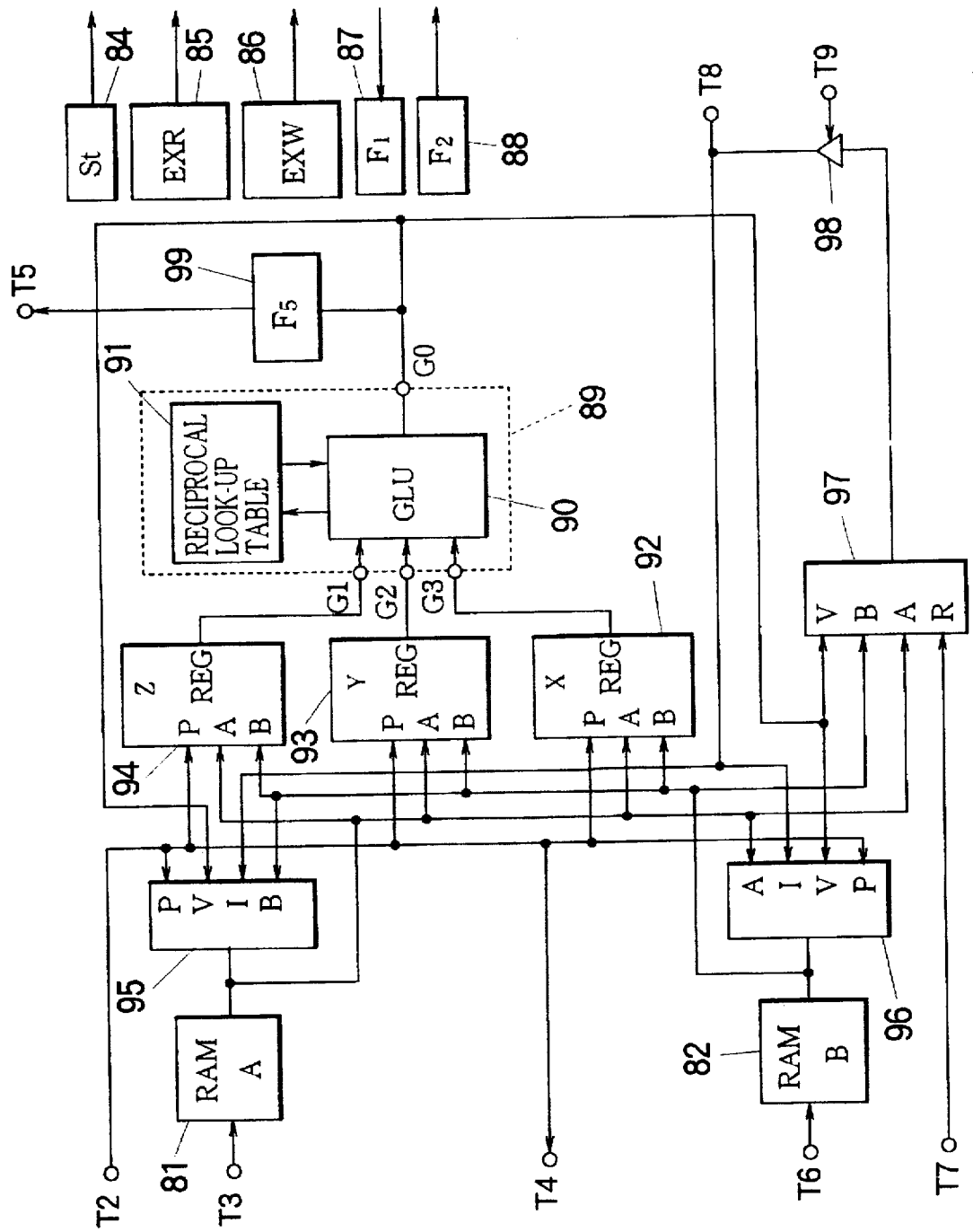
FIG. 40 is a more detailed block diagram of the Galois processor in FIG. 37.
Figure 41:
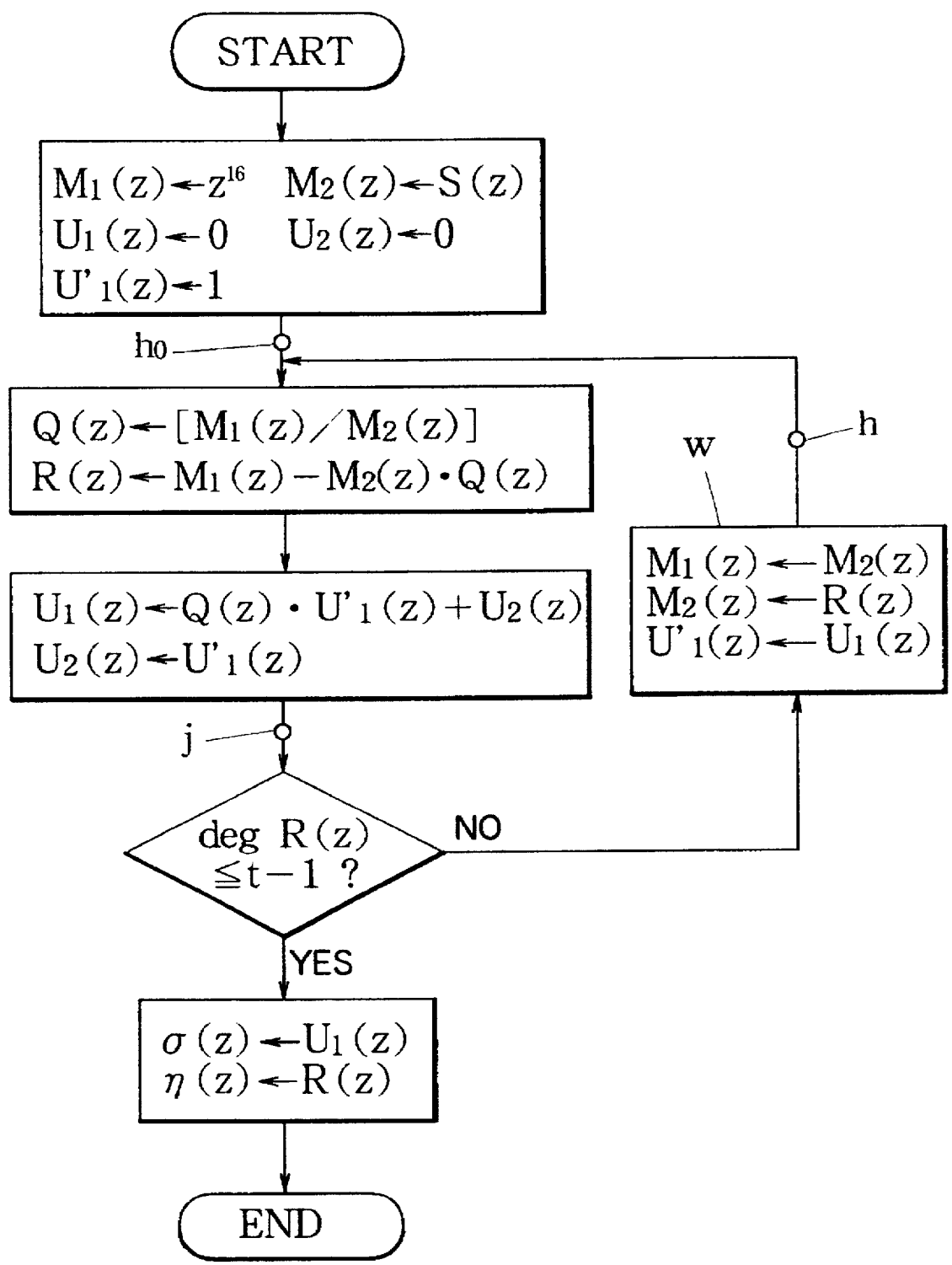
FIG. 41 is a flowchart of the Euclidean algorithm as executed by the decoder in FIG. 37.
Figure 42:
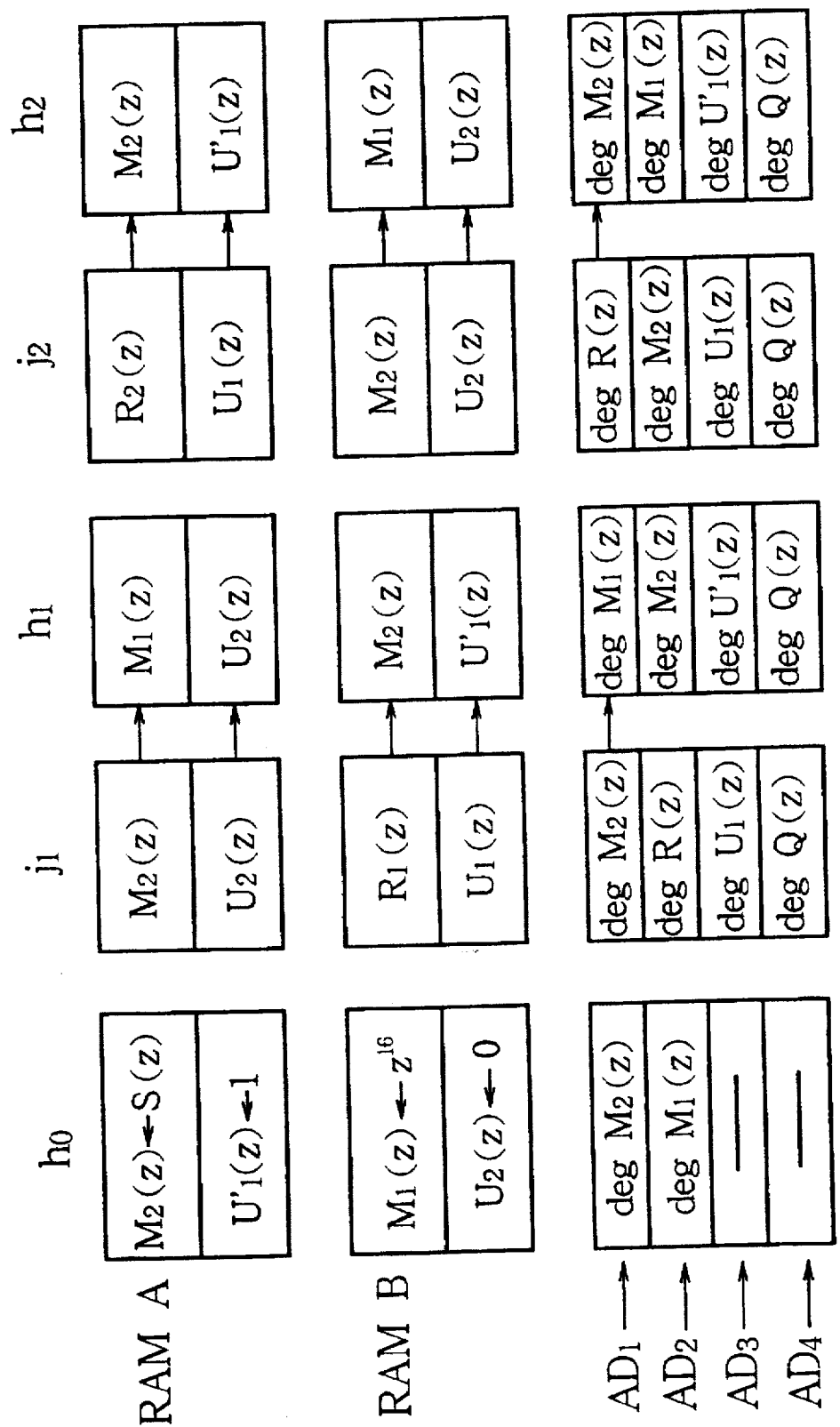
FIG. 42 illustrates memory and register contents during execution of the Euclidean algorithm by the conventional decoder.
Figure 43:
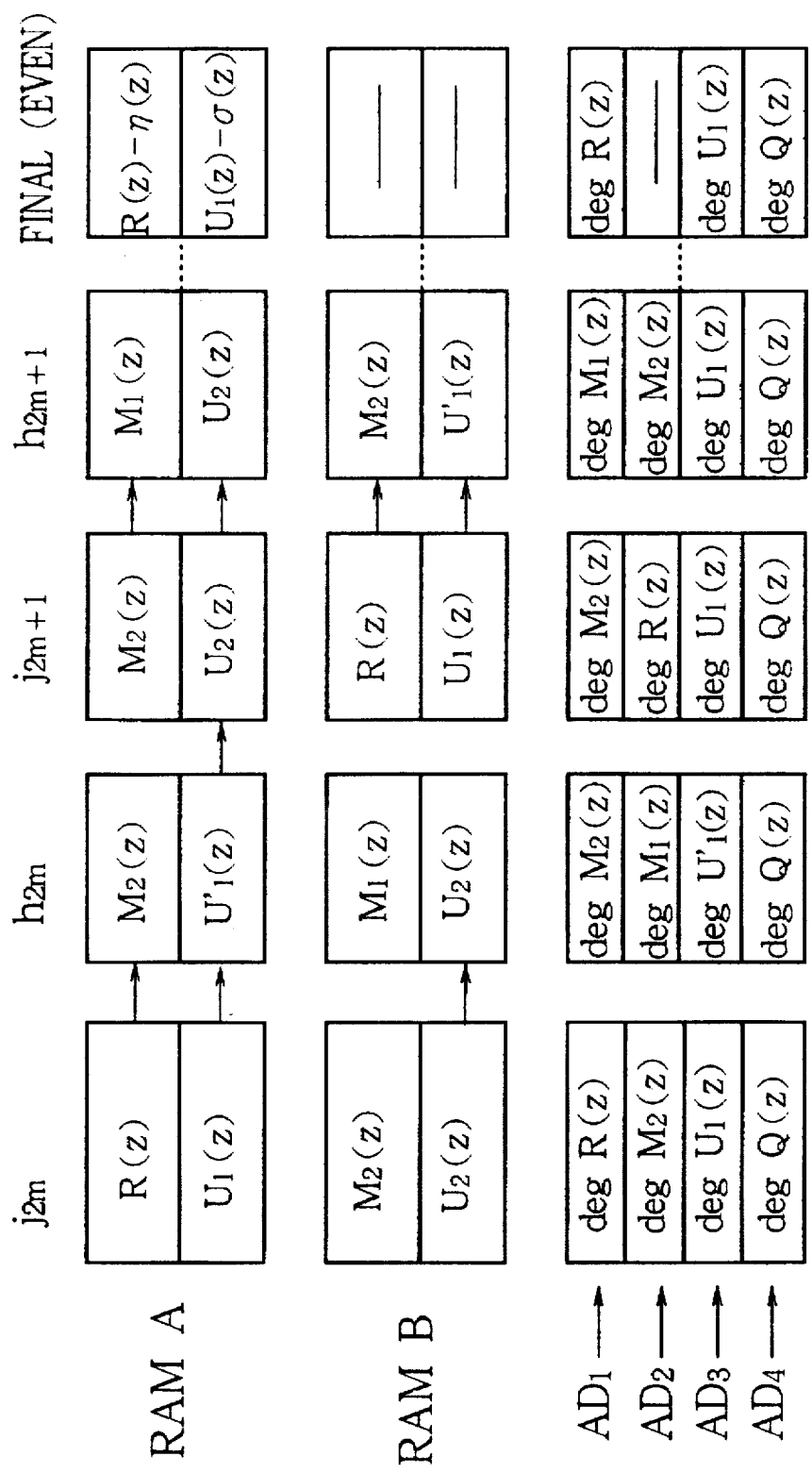
FIG. 43 illustrates further memory and register contents during execution of the Euclidean algorithm.

FIG. 22 illustrates the contents of RAM A 81 and RAM B 82 in FIG. 40 and the register file 64 in FIG. 18 during the first two iterations of the Euclidean algorithm. Initially, $M_1$(z) and $U_{-1}$(z) are stored in RAM B 82, and $M_2$(z) and $U_0$(z) in RAM A 81. After the first iteration, RAM A 81 holds $U_0$(z) and the new $M_1$(z), while RAM B 82 holds $U_1$(z) and the new $M_2$(z). After the second iteration, RAM A 81 holds $M_2$(z) and $U_2$(z), while RAM B 82 holds $M_1$(z) and $U_1$(z). That is, the same swapping system is used as in FIG. 42 to minimize actual data transfers.

Figure 23:
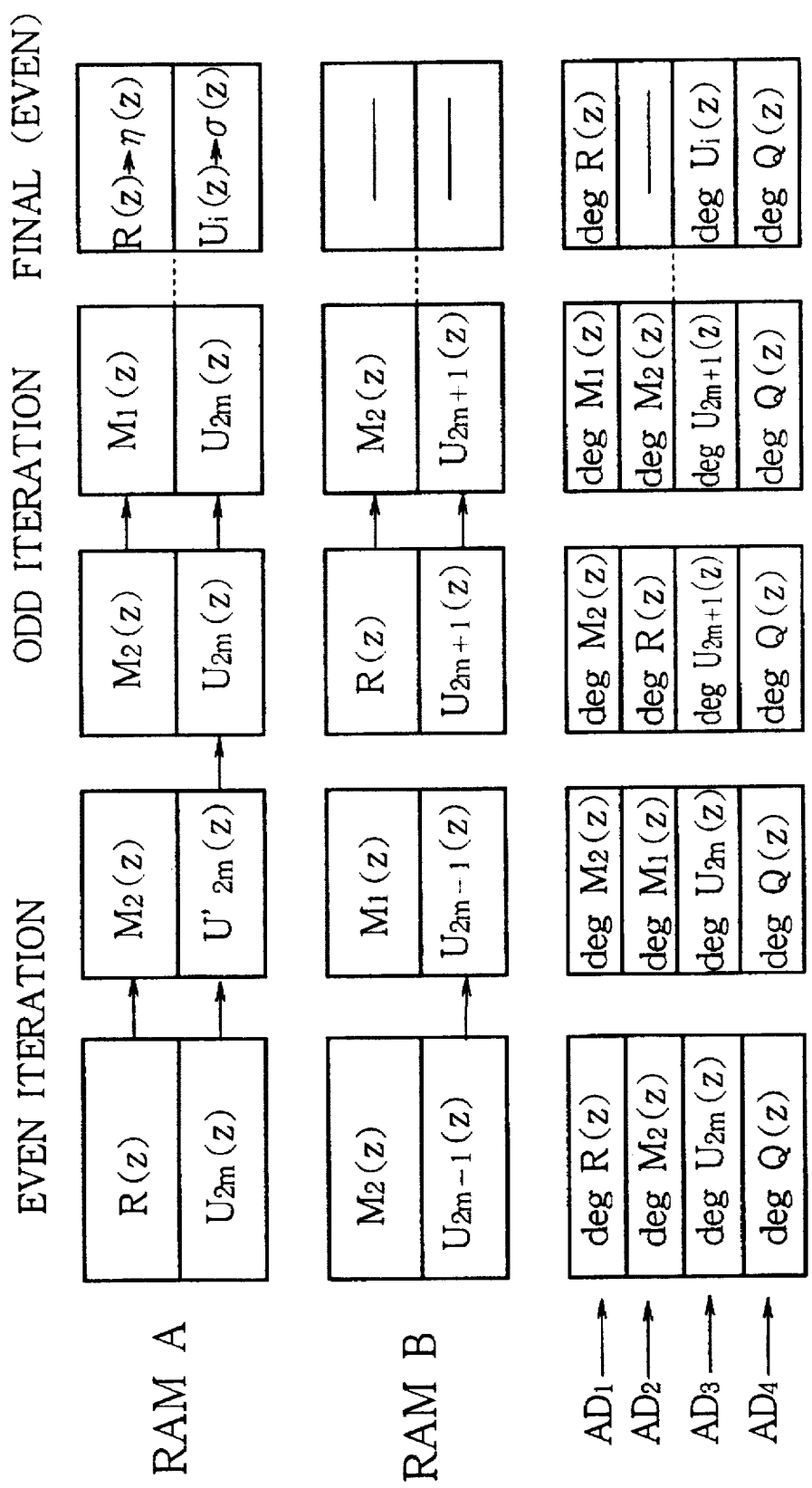
FIG. 23 illustrates further memory and register contents during execution of the Euclidean algorithm.

FIG. 23 illustrates a general even-numbered iteration, a general odd-numbered iteration, and the final RAM and register contents. If the final iteration is even, the coefficients of the final polynomials R(z) and $U_i$(z) are left in RAM A 81. If the final iteration is odd, these final polynomial coefficients are left in RAM B 82.

Referring again to FIG. 19, after the execution of the Euclidean algorithm and Chien search, in step ST60 the polynomial σ(z) is set equal to $U_i(z)\sigma\epsilon(z)$, the polynomial η(z) is set equal to R(z), and a parameter L is set equal to $N_R$+j−1. The parameter L is the total number of symbols to be corrected, including both erasures and other errors.

If the number of erasures exceeded the degree of the modified syndrome polynomial $S_\epsilon$(z) instep ST57, then in step ST61 polynomial σ(z) is set equal to $\sigma^\epsilon$(z), polynomial η(z) is set equal to $S_\epsilon$(z), and the parameter L is set, equal to $N_R$, indicating that all corrections are at erasure locations.

Following step ST60 or ST61, the error patterns of the symbols to be corrected are obtained in step ST62. If $\alpha_i$ designates the position of the i-th incorrect symbol, its error pattern $e_i$ is found as $\eta(\alpha_i)/\sigma'(\alpha_i)$, where as before $\sigma'(\alpha_i)$ is the value of the formal derivative of σ(z) $\alpha_i$. This calculation is repeated for values of i from one to L to obtain an error pattern for each incorrect symbol.

Following step ST62, the $C_2$ codeword is corrected by adding to each incorrect symbol the value of its error pattern symbol $e_i$. The parameter L (number of symbols corrected) can be output as a check on the reliability of the correction. The process then returns to step ST51 to correct the next $C_2$ codeword.

The novel features of the fifth embodiment are the hardware features shown in FIG. 18 for handling erasure information during $C_2$ decoding, and the use of bit weight information in FIG. 16 to generate erasure flags. By generating these additional erasure flags, the fifth embodiment strengthens the error-correcting capability of the $C_2$ decoding process; that is, it pinpoints the locations of more errors. Increasing the number of erasure flags also has the effect of increasing the number of code blocks determined to be completely uncorrectable; that is, it produces a more conservative decoder that, when many errors are present, relies more on error concealment and less on error correction than does a conventional decoder.

Figure 24:
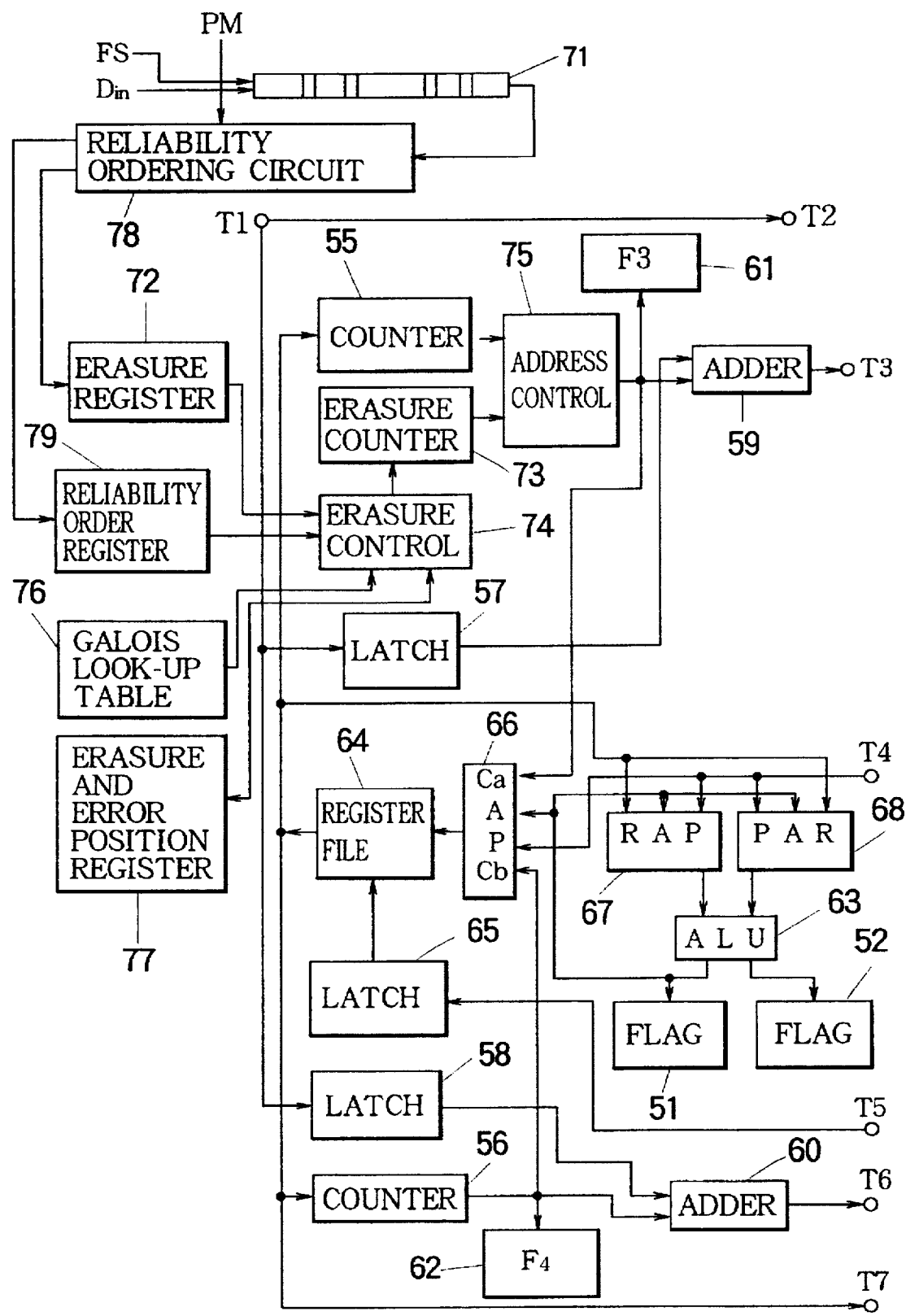
FIG. 24 is a block diagram of an arithmetic processor used in a sixth embodiment, of the invention.

The sixth embodiment uses the reliability information PM furnished by the monitoring circuit 32 in FIG. 16 to take a different approach to $C_2$ decoding. FIG. 24 shows the hardware configuration of the arithmetic processor 70 in the sixth embodiment, using the same reference numerals to denote parts that are identical to the arithmetic processor 70 of the fifth embodiment In FIG. 18. Descriptions of these elements will be omitted.

The new elements in FIG. 24 are a reliability ordering circuit 78 and a reliability order register 79. The reliability ordering circuit 78 receives the reliability information PM from terminal 34. On the basis of this information it selects the least reliable $d-1$ symbols and sorts them in order of reliability. The $d-1$ reliability rankings thus generated are stored in the reliability order register 79 for output to the erasure control circuit 74. (The parameter $d-1$ is the number of $C_2$ check symbols.)

Equation (91) below shows an example of the way in which reliability values can be calculated for $C_1$ codewords.

$$W_j = i \quad \text{if } i \text{ symbols were corrected} \qquad (91)$$
$$= D/2 \quad \text{if uncorrectable errors were detected}$$

The parameter D in tilts equation denotes the minimum distance between $C_1$ codewords (the number of $C_1$ check symbols is $D-1$). If the j-th $C_1$ codeword is found to have errors at i locations, where i does not exceed $(D-1)/2$, these errors are corrected and the j-th codeword is assigned a weight $W_j$ equal to i, the number of symbols corrected. If the codeword is found to have uncorrectable errors, its weight $W_j$ is set equal to $D/2$. The reliability values of the $C_1$ codewords are in reverse order to their weights, $W_j$, high weights $W_j$ denoting low reliability and vice versa.

Reliability values can also be assigned on the basis of the bit weights employed in the fifth embodiment, e.g. by ranking $C_1$ codewords according to the number of symbols having at least $L_B$ symbols in error. Reliability rankings by bit weight can be used independently, or they can be used to refine the reliability rankings given by the symbol weights in equation (91). Another possible way to obtain reliability values is to count the total number of bits corrected in a $C_1$ codeword. Reliability values may also be obtained from processes preceding $C_1$ decoding. The invention is not limited to any particular method of obtaining reliability values.

The $C_1$ decoding operation of the sixth embodiment identical to the $C_1$ decoding operation of the fifth embodiment, so a description will be omitted. The operation of decoding a $C_2$ codeword will be described with reference to FIG. 25.

Figure 25:
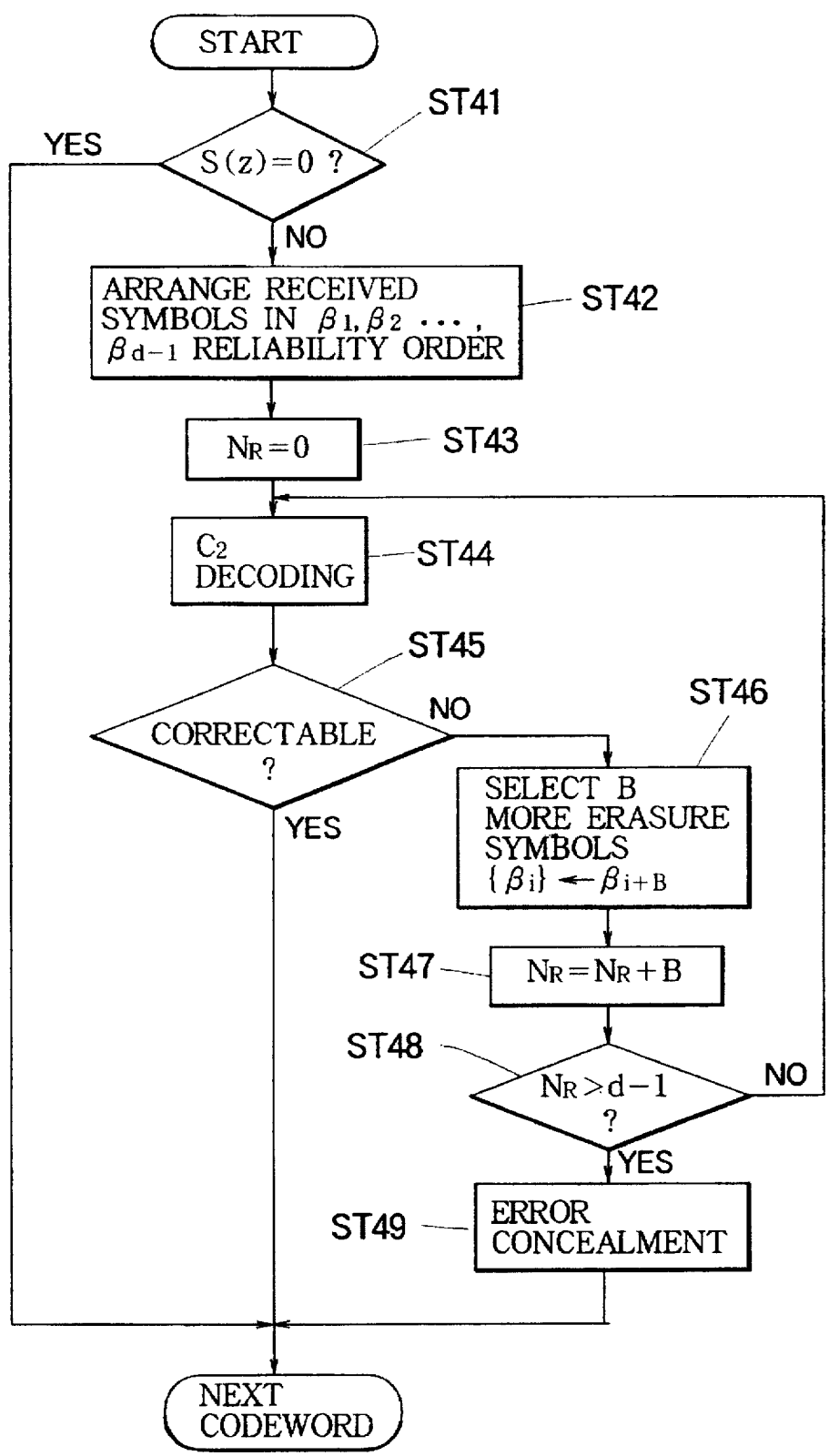
FIG. 25 is a flowchart of the $C_2$ decoding process the sixth embodiment.

In the first step ST41 in FIG. 25, the $C_2$ syndrome polynomial $S(z)$ is calculated and tested. If all its coefficients are zero, the $C_2$ codeword is presumed to be error-free.

In the next step ST42 the $d-1$ least reliable symbols in the codeword are ranked by the reliability ordering circuit 78, and Galois field elements $\beta^1, \beta_2, \ldots, \beta_{d-1}$ are stored in the reliability order register 79. $\beta_1$ denotes the location of the least reliable symbol in the codeword, $\beta_2$ the location of the next-least reliable symbol, and so on. Symbols of equal reliability can be ranked in any order. If reliability is given in terms of the weights $W_j$ in equation (90), which apply to $C_1$ codewords, the reliability order will be the same for all $C_2$ codewords in the same information block, so step ST42 need be performed only once per block.

In the next step ST43, the number of erasures $N_R$ is initialized to zero, even if erasure flags were output for one or more $C_1$ codewords in the $C_1$ decoding step.

In the next step ST44, $C_2$ decoding is attempted on the assumption that the least reliable $N_R$ symbols in the codeword are erasures. The first time this step is carried out, the assumption is that there are no erasures ($N_R$ is zero). The $C_2$ decoding procedure in this step is identical to the procedure given in the fifth embodiment.

The next step ST45 is a decision step based on the result of the $C_2$ decoding in step ST44. If the codeword was found to be correctable (if an error pattern was obtained), the correction is made and processing proceeds to the next codeword. If all uncorrectable error was detected, processing proceeds to step ST46.

In step ST46 an additional B symbols are treated as erasures. If $\{\beta^1, \ldots, \beta_i\}$ is the set of locations of symbols treated as erasures so far (i=NR), new locations $B_{i+1}, \ldots, \beta_{i+B}$ are now added to this set. The first time this step ST46 is carried out, the set $\{\beta_1, \ldots, \beta^i\}$ is empty (i=0), so the new set of erasures becomes $\{\beta_1, \ldots, \beta_B\}$. The parameter B can be any positive integer less than d ($1 \leq B \leq d-1$).

In the next step ST47, the value of $N_R$ is updated by adding B.

In the next step $N_R$ is compared with $d-1$. If $N_R$ does not exceed $d-1$, a return is made to step ST44 to attempt $C_2$ decoding again with more erasures than before. Each step ST44 is executed, the syndrome polynomial is modified to take account of the newly added erasure locations.

If $N_R$ exceeds $d-1$, an error concealment process is executed in step ST49.

One advantage of the sixth embodiment is that, in the first iteration of step ST44, no symbols are erased. As noted earlier, a $C_1$ erasure flag does not imply that all symbols in the $C_1$ codeword are in error; most of them are likely to be correct. By allowing these symbols to be treated as correct in the first iteration, the sixth embodiment improves the likelihood that the $C_2$ decoding step will be able to correct other errors that were missed completely in the $C_1$ decoding step.

A second advantage is that symbols of low reliability can be treated as erasures even if their $C_1$ codewords were not flagged as erasures. The reliability information can thus be used to help locate miscorrections in the $C_1$ decoding step, thereby improving the error-correcting capability of the $C_2$ decoding step. If the number of $C_2$ check symbols is eleven, for example, and if erasure flags were set on five $C_1$ codewords, a conventional decoder could correct only three additional symbol errors per $C_2$ codeword. By taking reliability information into account, however, the sixth embodiment is able to treat six more symbols as erasures, and correct tip to six additional symbol errors.

The next four embodiments employ the soft correction memory mentioned in the summary of the invention.

Figure 26:
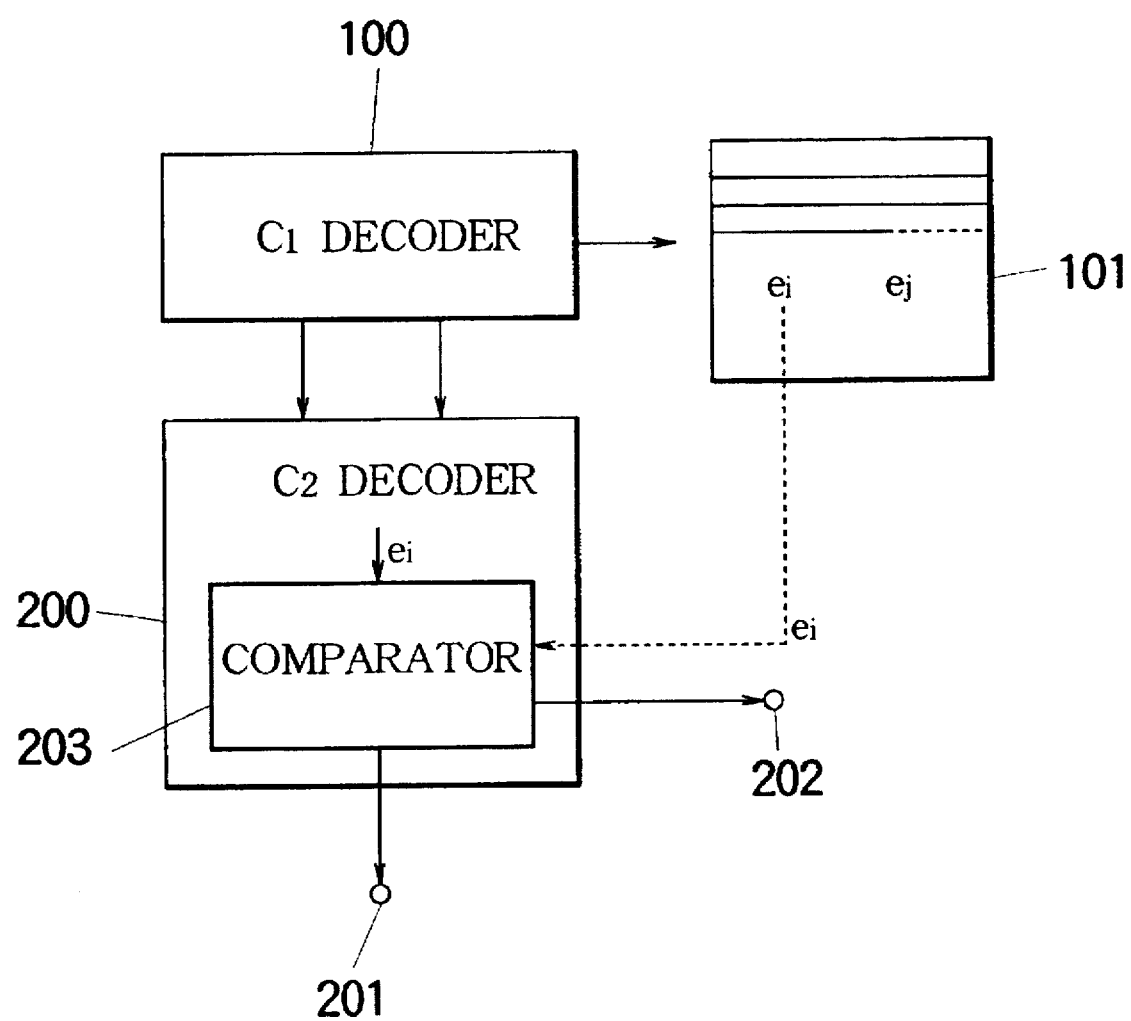
FIG. 26 is a block diagram of a decoder used in seventh and eighth embodiments of the invention.

FIG. 26 shows the conceptual structure of a seventh embodiment of the invention, organized as a $C_1$ decoder 100, soft correction memory 101, and $C_2$ decoder 200. Both the $C_1$ and $C_2$ decoders incorporate the features shown in FIG. 16 for measuring the bit weights of error pattern symbols.

The $C_1$ decoder 100 is allowed to correct a maximum of $t_1$ errors per codeword, $t_1$ being similar to the parameter $t_a$ mentioned in the fourth embodiment, equal to at most half the number of $C_1$ check symbols. Parameter values $L_{B1}$ and $q_1$ similar to the parameters $L_B$ and q of the fourth embodiment ($1 \leq q_1 \leq t_1$), are stored in the $C_1$ decoder 100.

When decoded, $C_1$ codewords fall into three reliability classes. Those with uncorrectable errors (errors in more than $t_1$ symbols) belong to the least reliable class; these codewords are left uncorrected, and are flagged with erasure flags. $C_1$ codewords with errors in $t_1$ symbols or less are placed in the most reliable class if not more than $q_1$ error pattern symbols have a bit weight of $L_{B1}$ or more, and in the intermediate class if the bit weight of more than $q_1$ error pattern symbols equals or exceeds $L_{B1}$. $C_1$ codewords in the most reliable class are corrected, if they have any errors, and no erasure flags are output. $C_1$ codewords in the intermediate class are not corrected, an erasure flag is output, and the error pattern and address of each incorrect symbol are stored in the soft correction memory 101. Storage of this information is referred to as a soft correction.

Figure 27:
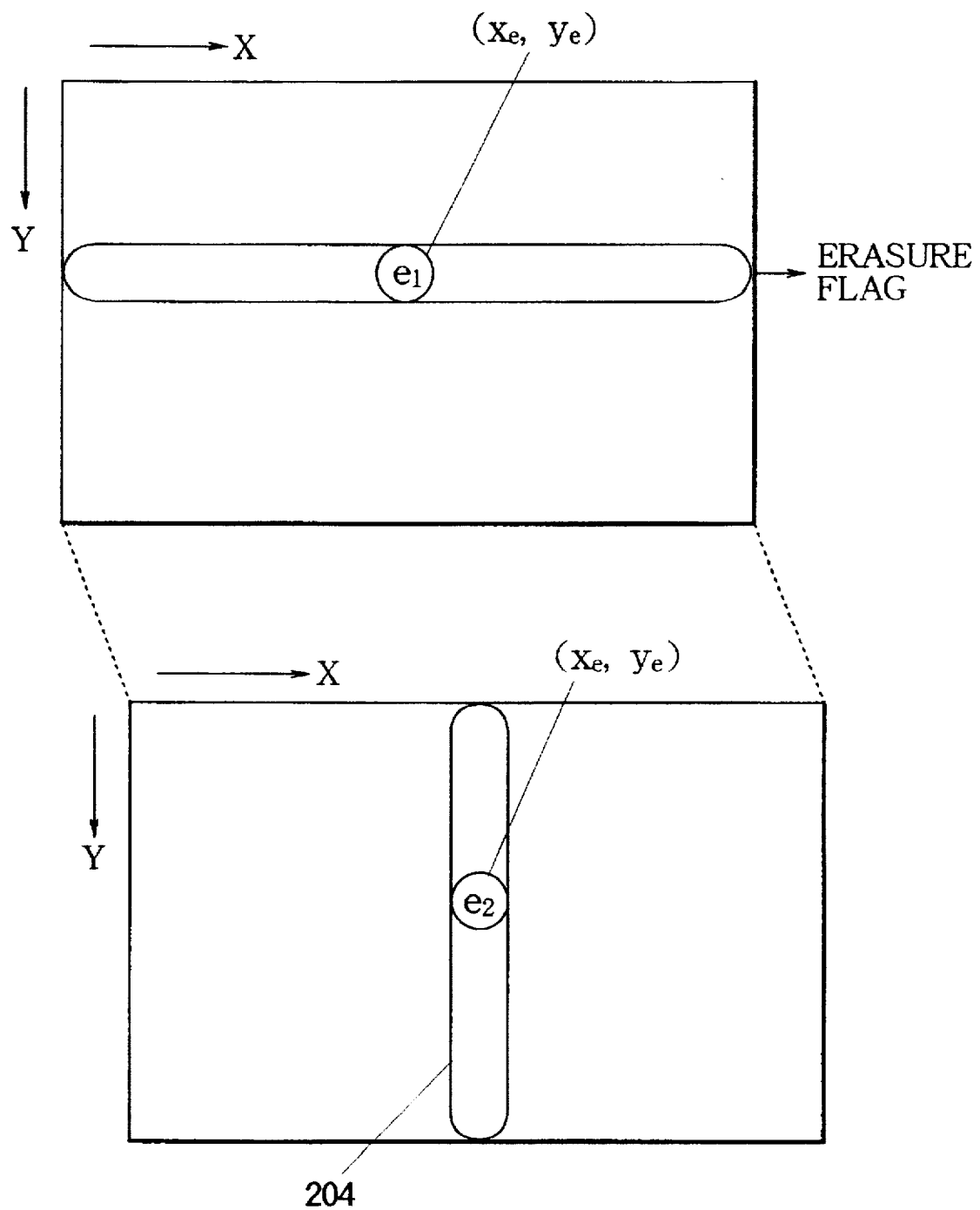
FIG. 27 illustrates a soft correction in the seventh embodiment.

Referring to FIG. 27, the address of a symbol in a codeword is a pair of integers $(x_e, y_e)$, in which $x_e$ identifies the column and $y_e$ identifies the row. The column address $x_e$ indicates the $C_2$ codeword and the row address $y_e$ indicates the $C_1$ codeword in which the symbol is disposed. For each soft correction, the address $(x_e, y_e)$ of each symbol with a non-zero error pattern, and the value of the error pattern (e.g. $e_1$ In FIG. 27) are stored in the soft correction memory 101. Storage of the $C_1$ error pattern information in this form conserves memory space; depending on the $C_2$ decoding algorithm, space for storing, at maximum, address and pattern information for only $t_1 \times t_2$ symbols suffices.

Referring again to FIG. 26, the $C_2$ decoder 200 is allowed to correct up to $t_2$ erasures, where $t_2$ is, at maximum, the number of $C_2$ check symbols. Parameter values $L_{B2}$ and $q_2$, similar to the parameters $L_B$ and q of the fourth embodiment ($1 \leq q_2 \leq t_2$), are stored in the $C_2$ decoder 200.

The erasure flags output by the $C_1$ decoder 100 are used in $C_2$ decoding. Like $C_1$ decoding, $C_2$ decoding sorts codewords into three reliability classes. $C_2$ codewords found to have uncorrectable errors (e.g. erasures in more than $t_2$ symbols) are placed in the least reliable class, their errors are not corrected, and an erasure flag is output at terminal 202, so that error concealment measures can be taken. $C_2$ codewords with correctable errors are placed in the most reliable class if not more than $q_2$ error pattern symbols have a bit weight of $L_{B2}$ or more; these codewords are corrected (if they have any errors) and output at the data output terminal 201.

$C_2$ codewords with correctable errors, but in which the error patterns of more than $q_2$ symbols have a bit weight of $L_{B2}$ or more, belong to the intermediate class. For these codewords, a comparison circuit 203 in the $C_2$ decoder 200 compares each non-zero error pattern symbol with the information stored in the soft correction memory 101. If a matching error pattern value is found at a matching address, the correction is accepted as valid. If all corrections the $C_2$ codeword are validated in this way, the codeword is corrected and output at the data output terminal 201. If any of the corrections are not validated, an erasure flag is output at terminal 202 to invoke error concealment processing.

The basic idea of the seventh embodiment is that if a correction fails the bit-weight reliability test in either $C_1$ or $C_2$ decoding, the correction is made only if it is verified by occurrence of the same error pattern in both $C_1$ and $C_2$ decoding. Referring again to FIG. 27, suppose that a $C_2$ codeword 204 is found to have correctable errors, but its error pattern fails the reliability test (more than $q_2$ symbols with corrections to $L_{B2}$ bits or more). A correction to a symbol with address $(x_e, y_e)$ and error pattern $e_2$ in this codeword is accepted as valid only if there was a soft correction at the same symbol address $(x_e, y_e)$ in $C_1$ decoding, and the $C_1$ error pattern $e_1$ at this address $(x_e, y_e)$ was the same as the $C_2$ error pattern ($e_1=e_2$). All of the symbols with non-zero error patterns $e_2$ in the $C_2$ codeword are checked in this way. If all corrections are validated, the codeword is corrected; otherwise it is flagged for error concealment processing.

The error pattern $e_2$ that is compared with the error pattern $e_1$ is the difference between the corrected symbol value and the original symbol value, before the symbol was erased to zero. With suitable alterations to the decoding algorithm, $C_2$ error correction can be carried out using the original symbol values of erased symbols, instead of changing these values to zero. If $C_2$ error decoding is carried out in the conventional way, however, with erased symbols cleared to zero, then the original symbol values must also be saved to enable meaningful comparison of their error patterns with the contents of the soft correction memory 101.

Compared with rejecting all $C_2$ corrections that fail the reliability test with respect to $L_{B2}$ and $q_2$ the seventh embodiment provides the capability to correct more errors.

Next an eighth embodiment will be described. The eighth embodiment has the same structure as the seventh embodiment, with a soft correction memory 101 for storing soft correction information, and performs the same functions, with one additional function. After storing soft corrections for one block of received data, the $C_1$ decoder 100 checks the soft correction memory 101 for the occurrence of soft corrections at a certain number $q_3$ of consecutive symbol addresses. Consecutive means consecutive in the order in which the symbols were received from the communication channel or read from the recording medium. Due to interleaving, such consecutive addresses are not necessarily consecutive in the x-y sense of FIG. 27.

The value of $q_3$ can be any positive integer equal to or greater than two (for example $q_3=3$).

If soft corrections at $q_3$ or more consecutive symbol addresses are found, they are accepted as valid, the assumption being that a burst error has occurred in the communication channel or on the recording medium. After all such occurrences of $q_3$ or more consecutive soft corrections have been found, the number of symbols with bit weights of $L_{B1}$ or more in the $C_1$ codewords in which these soft corrections occurred is counted again, disregarding the burst errors. $C_1$ codewords now pass the bit-weight reliability test if they do not have corrections of $L_{B1}$ bits or more in more than $q_1$ symbols other than symbols involved in burst errors. Any $C_1$ codewords now passing the bit-weight reliability test are corrected, their erasure flags are removed, and their soft correction data are deleted from the soft correction memory 101.

$C_2$ decoding is then carried out as in the seventh embodiment, using the remaining erasure flags and soft correction data. Compared with the seventh embodiment, the eighth embodiment permits still more errors to be corrected, by enabling $C_1$ error correction to be employed to a greater extent on identifiable burst errors.

Next a ninth embodiment will be described. The ninth embodiment uses a soft correction scheme generally similar to that of the seventh and eighth embodiments, but based on symbol weights (number of symbols corrected per codeword) rather than bit weights. Also, the ninth embodiment does not use erasure information.

Figure 28:
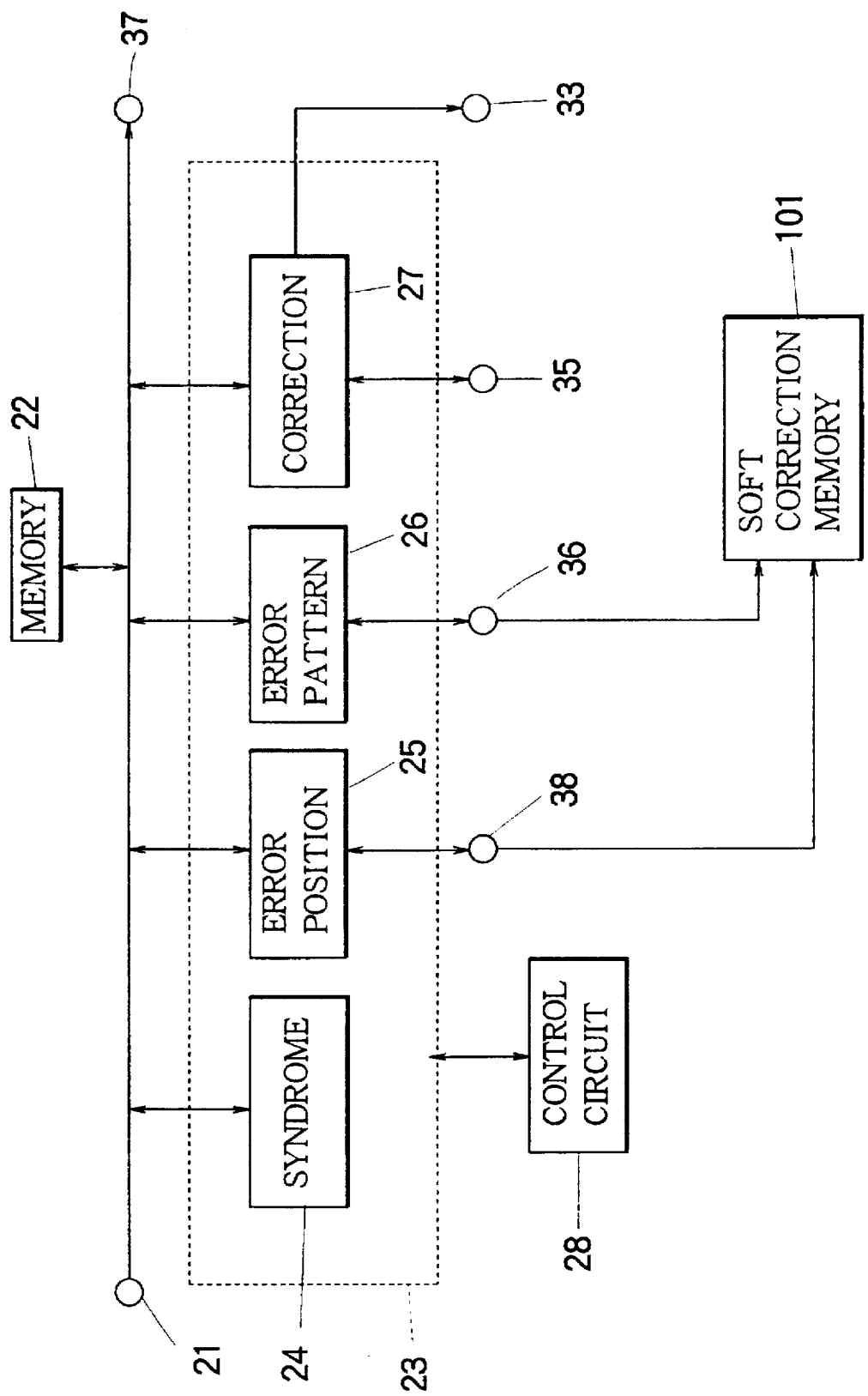
FIG. 28 is a block diagram of a decoder used in ninth and tenth embodiments of the invention.

FIG. 28 shows the conceptual structure of the decoder in the ninth embodiment, using the same reference numerals as in FIGS. 16 and 26 to denote identical parts. In place of the circuits for monitoring bit weights in FIG. 16, the decoder in FIG. 28 has a soft correction memory 101 for storing soft correction patterns and addresses, as in FIG. 28. Error pattern symbols are obtained from the error pattern calculation module 26 via terminal 36, and their addresses from the error position calculation module 25 via a terminal 38. Error flags are output from the error correction module 27 at terminal 33. Inhibiting signals can be input to the error correction module 27 from terminal 35.

Figure 29:
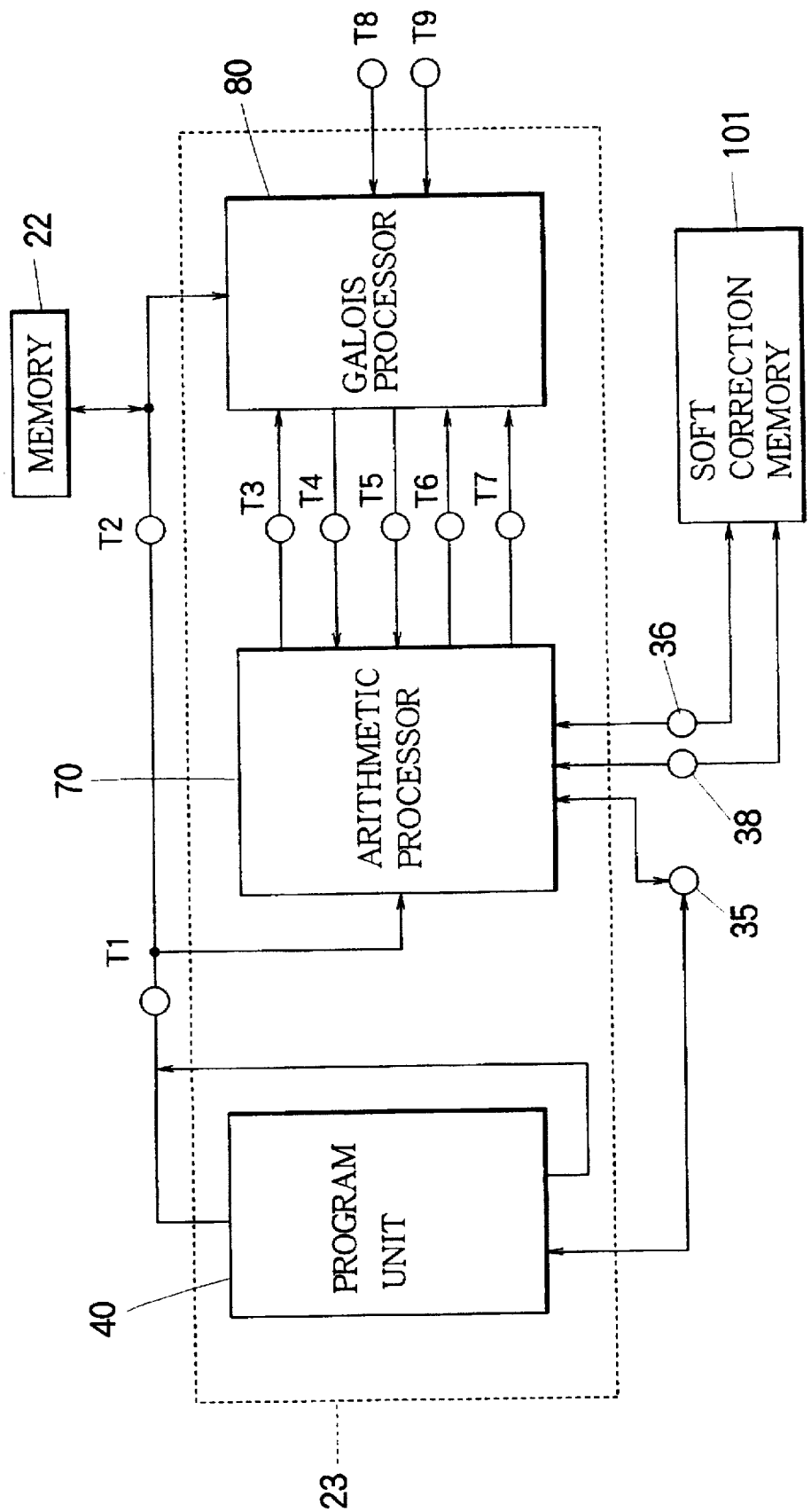
FIG. 29 is a block diagram of hardware for implementing the ninth embodiment.

FIG. 29 is a general block diagram of the decoder hardware In the ninth embodiment, using the same reference numerals as In FIGS. 17 and 28 to denote equivalent or identical parts. The soft correction memory 101 is coupled to the arithmetic processor 70 through terminals 36 and 38 The program unit 40 and arithmetic processor 70 are interconnected through terminal 35 for passing inhibiting signals, which cause appropriate branches in the execution of the program in the program unit 40 and appropriate resetting of flags and register contents in the arithmetic processor 70.

Figure 30:
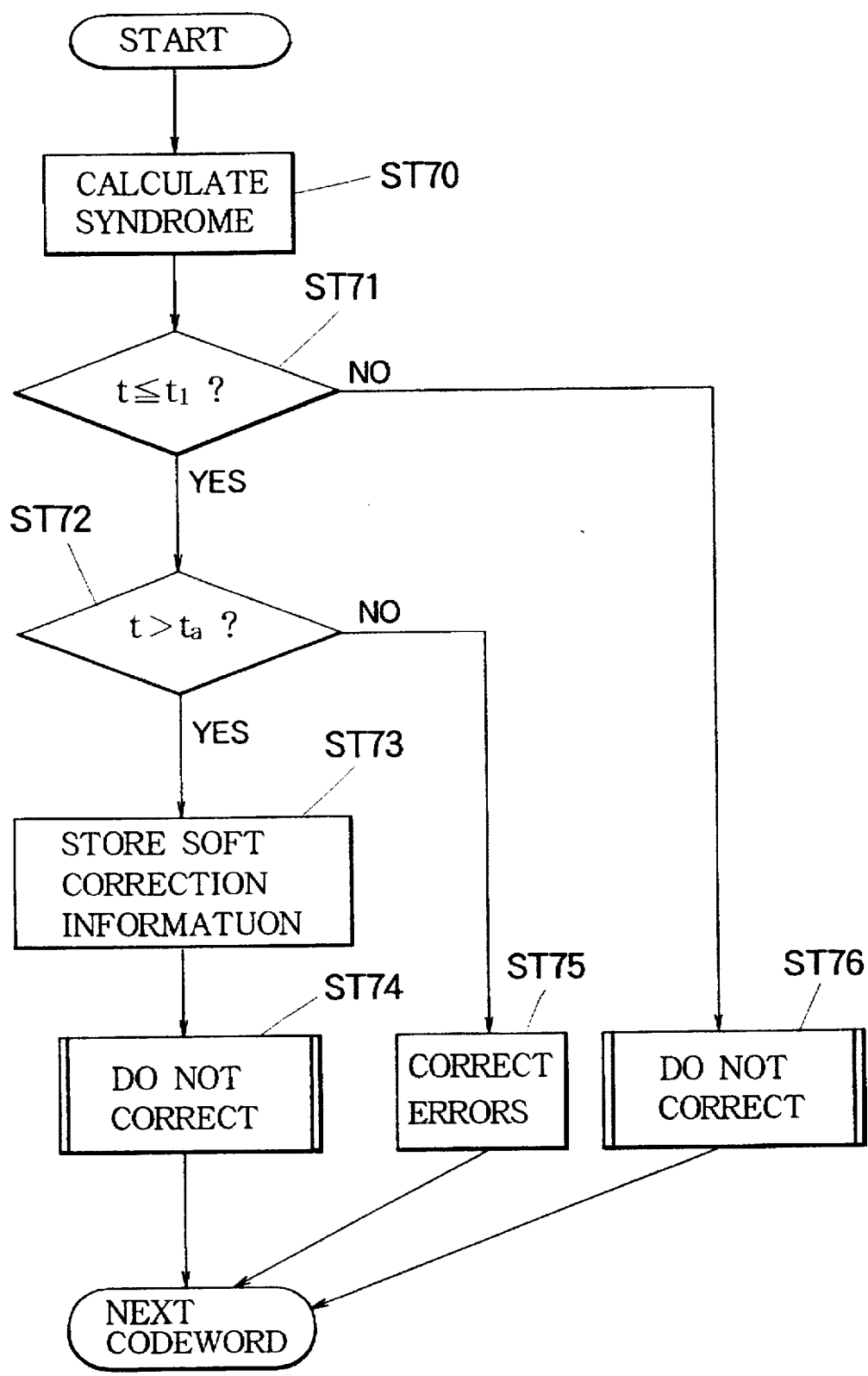
FIG. 30 is a flowchart of the $C_1$ decoding process in the ninth embodiment.

FIG. 30 shows the $C_1$ decoding procedure in the ninth embodiment. In step ST70 a $C_1$ codeword is input, its syndrome coefficients are computed, and the usual $C_1$ decoding operations are carried out to determine error positions and error patterns. The number of symbols in error will be denoted by the letter t, and the maximum error-correcting capability of the $C_1$ code by $t_1$, where $t_1$ is the greatest integer not exceeding half the number or $C_1$ check symbols.

The next step ST72 is a decision step to determine whether the errors, if any, are correctable by the $C_1$ code. If the codeword has uncorrectable errors (t>$t_1$), a branch is made to step ST76, described below.

in the next step ST72, if the codeword is correctable, the number of errors is compared with a parameter $t_a$. This parameter, described in connection with the fourth embodiment, is the maximum number of symbols that will actually be corrected. In the present embodiment $t_a$ is an integer greater than zero but less than $t_1$. If the number of errors is equal to or less than $t_a$, a branch is made to step ST75, described below.

In the next step ST73, given that the number of errors is greater than $t_a$ but not greater than $t_1$ ($t_a$<t≦$t_1$), the addresses and error patterns of the symbols in error are stored in the soft correction memory 101, as in the seventh and eighth embodiments, thereby executing a soft correction.

Step ST73 is followed by step ST74, in which an inhibiting signal is output to prevent correction of the codeword. No erasure flag is output. $C_1$ codewords processed in steps ST73 and ST74 belong to the intermediate reliability class.

If the number of errors is equal to or less than $t_a$ (t≦Eta), step ST72 is followed by step ST75, in which the error pattern values (if any) are added to the codeword symbol values to correct the codeword. $C_1$ codewords processed in step ST75 belong to the most reliable class.

If the codeword has uncorrectable errors (t>$t_1$), step ST71 is followed by step ST76, in which error correction is not performed, and no erasure flag is output. $C_1$ codewords processed In step ST76 belong to the least reliable class.

Figure 31:
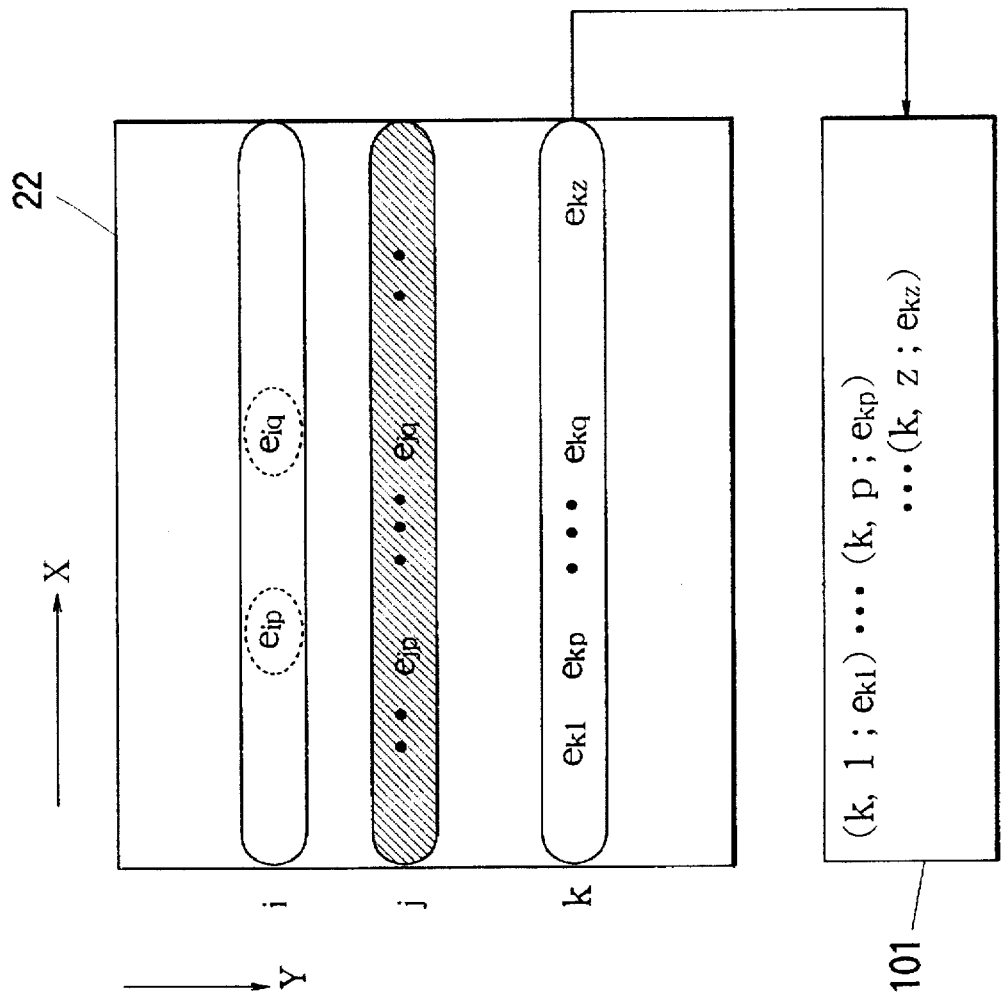
FIG. 31 illustrates $C_1$ decoding results in the ninth embodiment.

FIG. 31 shows typical results of $C_1$ decoding in the ninth embodiment: $e_{xy}$ represents the error pattern of a symbol in error, the subscripts x and y being the column and row addresses of the symbol. The i-th $C_1$ codeword was found to have errors in symbols with column addresses p and q. The number of symbols in error did not exceed $t_a$, so the errors were corrected, as indicated by the dotted lines around their error patterns $e_{ip}$ and $e_{iq}$. The j-th $C_1$ codeword was found to have uncorrectable errors (errors in more than $t_1$ symbols), so although the errors were detected, no action was taken. The k-th $C_1$ codeword was found to have errors in a number of symbols exceeding $t_a$ but not, exceeding $t_1$. These errors were not corrected, but information about them was stored in the soft correction memory 101 as a soft correction. The information stored includes the row address (k), column address (l, ..., p, ..., z), and error pattern ($e_{kl}$, ..., $e_{kp}$, ..., $e_{kz}$) for each symbol in error.

The $C_2$ decoding process is similar to the $C_1$ decoding process, employing parameters $t_2$ and $t_b$, where $t_2$ is the greatest integer not exceeding half the number of $C_2$ check symbols and $t_b$ is a positive integer less than $t_2$. Uncorrectable $C_2$ codewords, with errors in more than $t_2$ symbols, are placed in the least reliable class and flagged for error concealment. If errors are found in $L_b$ symbols or less, the codeword is placed in the most reliable class and its error, if any, are corrected.

Figure 32:
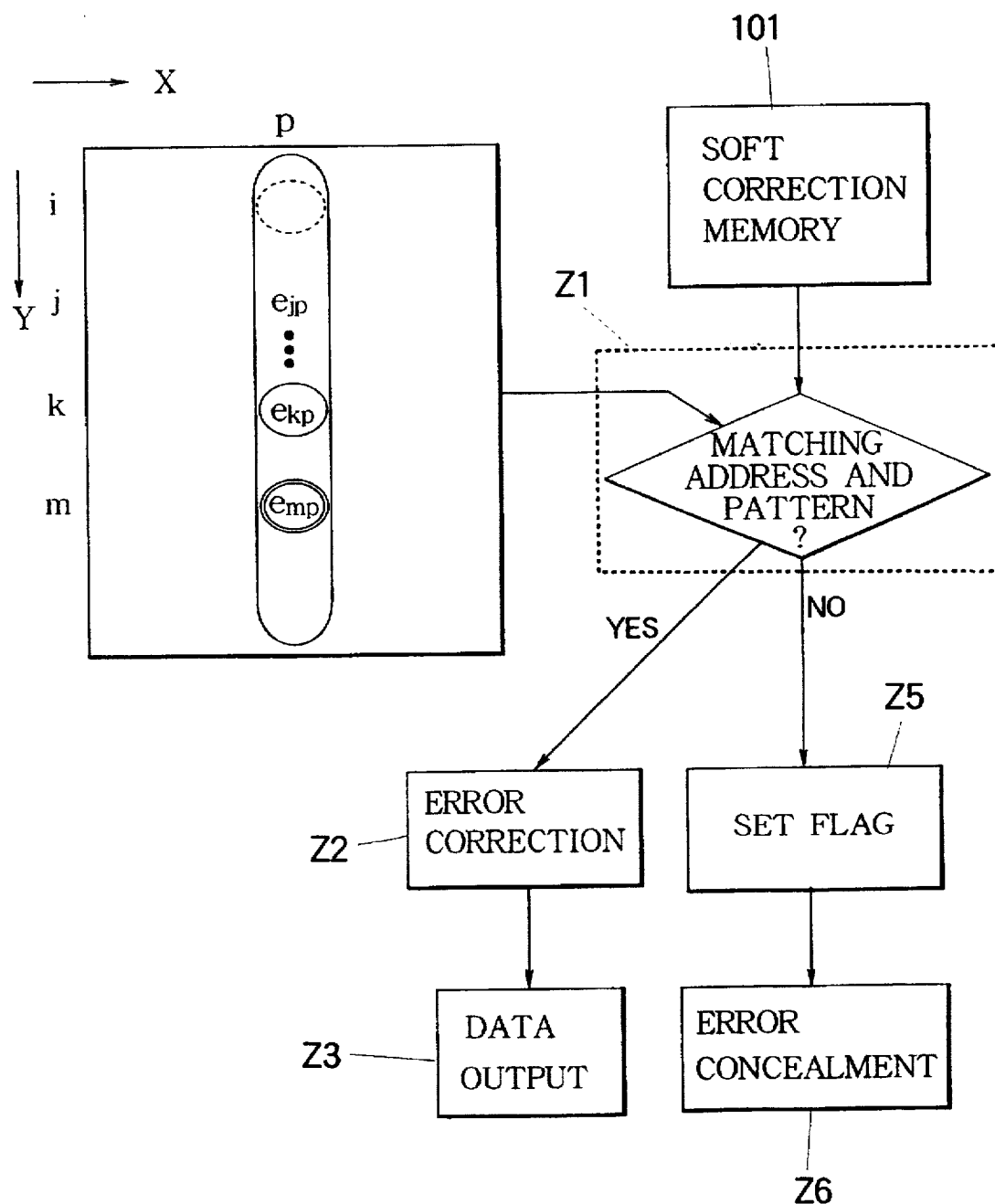
FIG. 32 illustrates part of the $C_2$ decoding process the ninth embodiment.

FIG. 32 illustrates the procedure for the intermediate class of $C_2$ codewords, having errors in more than $t_b$ but not more than $t_2$ symbols. The p-th $C_2$ codeword is assumed to be such a codeword, with error patterns $e_{jp}$, ..., $e_{kp}$, $e_{mp}$. Of these, only $e_{kp}$ is stored in the soft correction memory 101.

The $C_2$ decoding algorithm includes a step Z1 that checks each error in a $C_2$ codeword in the intermediate class against the contents of the soft correction memory 101. If the same error pattern is found at the same address, the correction is accepted as valid. If all corrections in the $C_2$ codeword are valid, the codeword is corrected (step Z2) and output (step Z3). If one or more corrections are not validated in the soft correction memory 101, the codeword is flagged as uncorrectable (step Z5) and error concealment is performed (step Z6).

In the present example, the p-th $C_2$ codeword is flagged as uncorrectable because error patterns $e_{jp}$ and $e_{mp}$ are not found in the soft correction memory 101. If, for example $e_{mp}$ is a miscorrection, there is very little likelihood that a soft correction would also be stored by chance at the same address in the soft correction memory 101. Even if such a correction were stored, the chance that it would have the same error pattern is small. For GF($2^8$), the probability of the error pattern matching by chance is only 1/256. In the present case, even if the error pattern and address of the $e_{mp}$ were matched by chance, the codeword would still not be miscorrected, because $e_{jp}$ is not present in the soft correction memory 101.

Since it does not use erasure information, the ninth embodiment does not offer high error-correcting capability, but it provides very strong protection from miscorrection.

Next a tenth embodiment will be described. The tenth embodiment is generally similar to the ninth, employs similar parameters $t_a$, $t_1$, $t_b$, and $t_2$, and has the structure shown in FIGS. 28 and 29, including the detailed structure of the arithmetic processor 70 shown in FIG. 18. The tenth embodiment differs from the ninth embodiment in that it uses erasure information.

Figure 33:
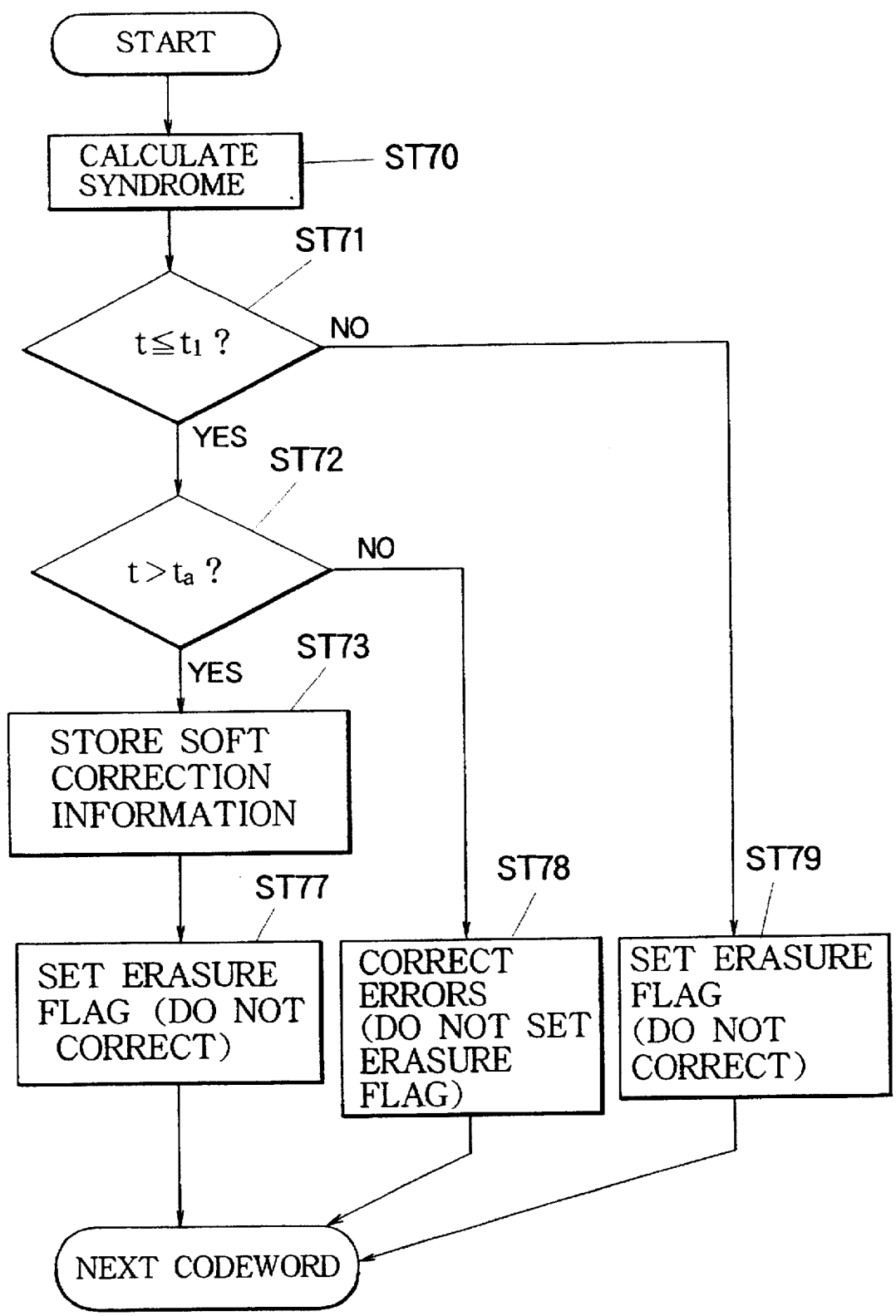
FIG. 33 is a flowchart of the $C_1$ decoding process in the tenth embodiment.

FIG. 33 shows the $C_1$ decoding procedure in the tenth embodiment. Steps ST70, ST71, ST72, and ST73 are the same as in the ninth embodiment, so descriptions will be omitted.

When a soft correction is performed in step ST73, an erasure flag is set in step ST77. The codeword is left uncorrected. The codeword belongs to the intermediate reliability class.

If the number of symbols in error (t) does not exceed parameter $t_a$ in step ST72, the codeword is corrected in step ST78, and no erasure flag is set. The codeword belongs to the most reliable class.

If the codeword is found to be uncorrectable in step ST71 ($t>t_1$), an erasure flag is output in step ST79 and the codeword is left uncorrected. The codeword belongs to the least reliable class.

Figure 34:
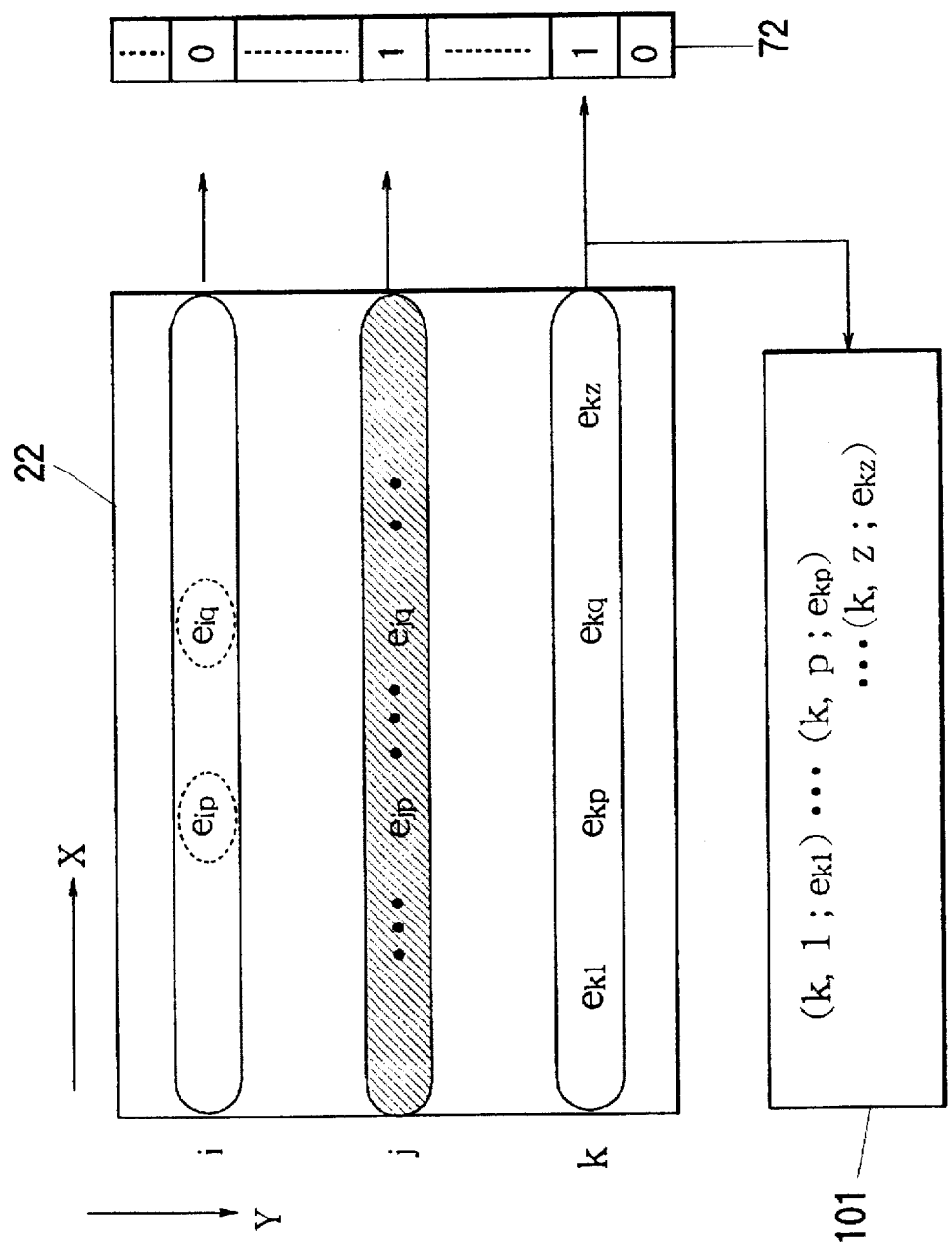
FIG. 34 Illustrates $C_1$ decoding results in the tenth embodiment.

FIG. 34 shows typical results of $C_1$ decoding in the tenth embodiment, including the erasure flags stored in the erasure register 72. As in FIG. 31, two errors have been corrected in the i-th codeword, uncorrectable errors were detected in the j-th codeword, and a soft correction was made on the k-th codeword. Erasure flags have been output for the j-th and k-th codewords.

The $C_2$ decoding process makes selective use or the erasure flags. Before $C_2$ decoding begins, the number of erasure flags is compared with the parameter $t_2$, which now equal to, for example, the number of $C_2$ check symbols ($d_2-1$). If the number of erasure flags exceeds $t_2$, an attempt is made to reduce the number of erasure flags by accepting some of the soft corrections.

Figure 35:
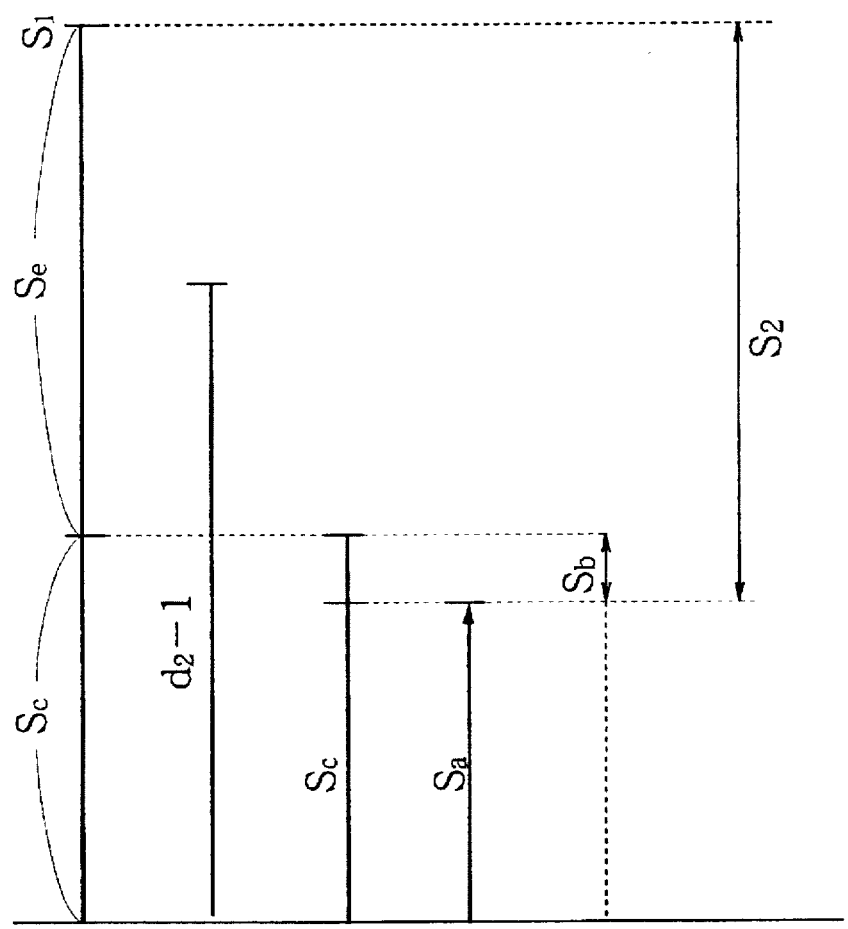
FIG. 35 illustrates $C_2$ preprocessing in the tenth embodiment.

Referring to FIG. 35, the total number $S_1$ of erasure flags after $C_1$ decoding is the sum of the number $S_c$ of soft corrections and the number $S_e$ of other erasure flags for $C_1$ codewords with more than $t_1$ errors). If $S_1$ exceeds $t_2$ and $S_e$ is less than $t_2$, indicating that soft corrections have been made for at least two $C_1$ codewords, then some (but not all) of these soft corrections are executed by adding the error pattern values stored in the soft correction memory 101 to the symbol values stored in memory 22. The $C_1$ codewords for which soft corrections are executed at this point can be selected according to their reliability; for example, the $C_1$ codewords with the fewest symbols in error can be corrected. Among $C_1$ codewords of equal reliability, an arbitrary selection can be made.

The soft corrections that are executed at this stage are deleted from the soft correction memory 101, and their erasure flags are removed from the erasure register 72. If $S_a$ is the number of $C_1$ codewords that are corrected in this way, using the information in the soft correction memory 101, then only $S_b$ soft corrections per $C_2$ codeword are left stored in the soft correction memory 101 (where $S_a+S_b=S_c$), and only $S_2$ erasure flags are left in the erasure register 72 (where $S_a+S_2=S_1$).

After this preprocessing step, $C_2$ decoding is carried out as described in the ninth embodiment, except that the remaining erasure flags are used to identify error positions. The parameters $t_2$ and $t_b$ accordingly differ from the ninth embodiment: $t_2$ (the maximum number of erasures that can be corrected) can be as large as the number of $C_2$ check symbols ($d_2-1$), as noted above; $t_b$ is a positive integer less than $t_2$.

If $S_2$ is the number of erasures and E is the number additional errors discovered in decoding of a $C_2$ codeword, and if the following inequality is satisfied, then the erasures and other errors are corrected unconditionally.

$$2E+S_2 \leq t_b$$

If this inequality is not satisfied, then the codeword is corrected only if E=0, meaning that only erasures are present, and only if there is no conflict between any of the corrections and the information stored in the soft correction memory. If any of the erasures are due to soft corrections, that is, the error patterns stored in the soft correction memory 101 for these erasures and the error patterns found in $C_2$ decoding must be identical. If conflicting error patterns are found for any soft corrections, the $C_2$ codeword is not corrected.

Figure 36:
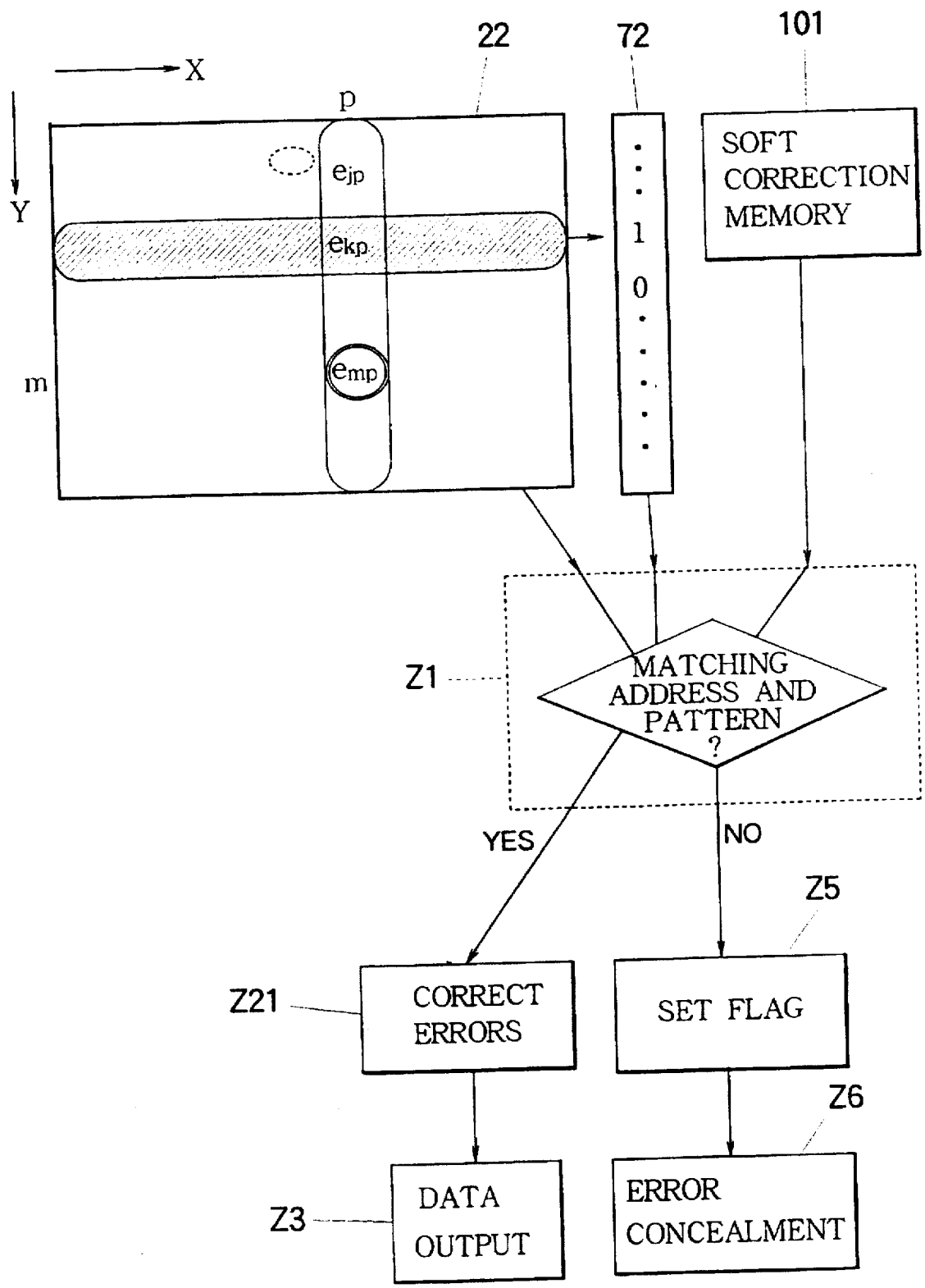
FIG. 36 illustrating part of the $C_2$ decoding process in the tenth embodiment.

Referring to FIG. 36, suppose that the p-th $C_2$ codeword turns out to have errors at $e_{jp}$, $e_{kp}$, and $e_{mp}$, of which $e_{jp}$ and $e_{kp}$ have erasure flags, and $e_{kp}$ has soft correction information stored in the soft correction memory 101. Suppose furthermore that the inequality given above is not satisfied. This codeword is not corrected, because $e_{mp}$ does not have an erasure flag.

If $e_{mp}$ were not present, then error patterns $e_{jp}$ and $e_{kp}$ would be checked against the contents of the soft correction memory 101 in step Z1 in the decoding process. For $e_{jp}$ no conflict is possible because no soft correction is stored for address (p, j). A soft correction has been stored, however, for address (p, k). If the error pattern stored in the soft correction memory 101 for address (p, k) matched $e_{kp}$, the codeword would be corrected (step Z21) and output (step Z3). If the error pattern stored for address (p, k) did not match $e_{kp}$, the codeword would not be corrected, a flag would be set (step Z5) and error concealment measures would be taken (step Z6).

In FIG. 36 one soft correction $e_{kp}$ was checked in p-th codeword. As the Galois field $GF(2^8)$ has two hundred fifty-six elements, there is a probability of 1/256 that a miscorrection might generate a matching error pattern by chance. If two soft corrections are checked the probability that both checks might pass by chance is $(1/256)^2$, and if three soft corrections are checked the probability of chance agreement for all three error patterns is $(1/256)^3$. Checking just one soft correction will accordingly eliminate more than 99% of all $C_2$ miscorrections, checking two soft corrections will eliminate more than 99.998%, and checking three soft corrections will eliminate more than 99.99999%. These figures give some idea of the power of the soft correction method.

Referring again to FIG. 35, in the preprocessing before $C_2$ decoding, the number of soft corrections left, ($S_b$) should be at least one per $C_2$ codeword, but $S_b$ need not be a large number. As the above figures indicate, adequate protection against miscorrection is obtained if $S_b$ is in the range from one to three. As long as this number of soft corrections is left, the number $S_a$ of soft corrections that are executed in the preprocessing stage can be any number that reduces the number of erasure flags $S_2$ to $t_2$ or less (e.g. to $d_2-1$ or less).

The present invention is not limited to the preceding embodiments, but includes various further modifications to and combinations of these embodiments. In particular, the invention is not limited to two-dimensional product codes; several of the embodiments are also useful for one-dimensional codes (e.g. codes with only row cheer symbols), and all can be extended to product codes with more than two dimensions (e.g. codes with $C_1$, $C_2$, and $C_3$ check symbols).

No restriction is placed on the number of symbols per codeword, which can be as large as the number of elements in the Galois field. No restriction is placed on the number of check symbols; the number of row check symbols need not be eight, and the number of column cheer symbols need not be eleven.

The Galois field $GF(2^8)$ need not be generated by the prime polynomial P(z) given earlier. Other prime polynomials that can be used include the following two:

$$z^8+z^5+z^3+z^2+1$$

$$z^8+x^7+x^2+x^1+1$$

The invention can be practiced with Galois fields $GF(2^m)$ where m is an integer other than eight, or more generally GF(q), where q is any power of any prime number. The conventional Galois field $GF(2^8)$ is preferable, however, insofar as digital information is commonly expressed in eight-bit bytes, and memory devices with an eight-bit data width are readily available.

The invention is not limited to the particular hardware configurations described in the embodiments. For example, FIG. 16 was described as showing the conceptual structure of an embodiment having the actual hardware structure shown in FIGS. 17 and 18, but the invention can also be practiced in a decoder having separate hardware circuits for syndrome calculation, error position calculation, error pattern calculation, and error correction. Conversely, the control circuit, bit weight calculation circuit, comparator, and monitoring circuit in FIG. 16, which were described as separate hardware circuits, can be replaced by suitable program modules in the program unit in FIG. 17. Similarly, the $C_1$ decoder and $C_2$ decoder in FIG. 26 can be structured as separate software modules for $C_1$ and $C_2$ decoding, both executing on the same processor hardware.

Various modifications of an obvious nature can also be made to the flowcharts.

Those skilled in the art will recognized that further variations are possible without departing from the scope claimed below.

Further scope of applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

What is claimed is:

1. A method of encoding and decoding information symbols which can be treated as coefficients of a first polynomial over a Galois field, comprising the steps of:

generating a parity check symbol by evaluating said first polynomial at a certain element of said Galois field;

generating additional check symbols as remainder coefficients in a first division operation having as a dividend a second polynomial of which said information symbols and said parity check symbol are coefficients, and as divisor a generator polynomial of which said certain element is not a root;

receiving, in a possible corrupted form, a codeword including said information symbols, said parity check symbol, and said additional check symbols;

using the additional check symbols in said codeword to detect and correct errors in the information symbols and the parity check symbol in said codeword, and setting a flag if an uncorrectable error is found;

performing a parity check using the information symbols and the parity check symbol in said codeword, and setting said flag if a parity error is found; and taking error concealment measures if said flag is set.

2. The method of claim 1, wherein generating the parity check symbol comprises the sub-steps of:

evaluating said first polynomial at said certain element to obtain an intermediate value; and multiplying said intermediate value by said certain element to obtain said parity check symbol.

3. The method of claim 1, wherein said Galois field has a primitive element $\alpha$, said certain element is equal to $\alpha^{-1}$, and said generator polynomial has roots equal to $\alpha^i$, where $i$ ranges over consecutive integers from zero to a certain positive integer.

4. The method of claim 1, wherein the step of generating the additional check symbols comprises the sub-steps of:

converting said parity check symbol to a first plurality of symbols;

generating a second plurality of symbols as remainder coefficients in a second division operation having said first polynomial as a dividend and having said generator polynomial as a divisor; and adding each symbol in said first plurality of symbols, treated as an element of said Galois field, to a corresponding symbol in said second plurality of symbols.

5. The method of claim 4, wherein the steps of generating the parity check symbol and generating the second plurality of symbols are performed concurrently.

6. The method of claim 4, wherein the step of converting said parity check symbol employs a look-up table.

7. The method of claim 4, wherein said parity check symbol is equal to said first polynomial evaluated at said certain element.

8. A method of encoding and decoding a block of data organized into a number of rows and a number of columns of information symbols representing elements of a Galois field, comprising the steps of:

generating column check symbols for said columns and appending said column check symbols to respective columns, thereby increasing the number of rows in said block of data;

generating parity check symbols for said rows, using a certain element of said Galois field, and appending said parity check symbols to respective rows;

generating row check symbols for said rows with appended parity check symbols, using a generator polynomial of which said certain element is not a root;

receiving, in a possible corrupted form, said information symbols, said parity check symbols, said row check symbols, and said column check symbols;

using the received row check symbols to detect and correct errors in the parity check symbols, column check symbols, and the received information symbols, and setting erasure flags for rows with uncorrectable errors;

performing parity checks on rows not having erasure flags set using said parity check symbols, and setting additional erasure flags for rows with parity errors;

counting said erasure flags and said additional erasure flags to obtain an erasure count;

comparing said erasure count with a first threshold value;

using said column check symbols, said erasure flags, and said additional erasure flags to detect and correct errors in said information symbols, if said erasure count is less than said first threshold value; and using said column check symbols to detect and correct errors in said information symbols, without using said erasure flags and said additional erasure flags, if said erasure count is not less than said first threshold value.

9. The method of claim 8, wherein said column check symbols and said row check symbols are generated using respective Reed-Solomon codes.

10. The method of claim 8, wherein said parity check symbols are generated using a Reed-Solomon code having a first-degree generator polynomial.

11. The method of claim 8, further comprising the steps of:

counting said additional erasure flags to obtain a parity error count;

comparing said parity error count with a second threshold value;

setting said first threshold value to a first number if said parity error count exceeds said second threshold value; and setting said first threshold value to a second number, different from said first number, if said parity error count does not exceed said second threshold value.

12. The method of claim 11, wherein said first number is less than said second number.

13. A method of detecting and correcting errors in a codeword including symbols, each symbol including a certain number of bits, comprising the steps of:

computing coefficients of a syndrome polynomial from said codeword and determining, from said coefficients, how many symbols in said codeword are in error;

setting an erasure flag if more than a first number of said symbols are in error;

computing an error pattern indicating corrections to be made to said codeword, if not more than said first number of symbols are in error;

counting symbols in said codeword having at least a second number of bits in error, thereby obtaining a count value;

comparing said count value with a third number, said third number being less than said first number;

setting erasure flag, if said count value exceeds said third number; and making the corrections indicated by said error pattern, if said count value does not exceed said third number.

14. The method of claim 13, wherein each symbol in said codeword includes eight bits, and said second number is an integer greater than one but less than four.

15. The method of claim 13, wherein said codeword is encoded using a Reed-Solomon code.

16. The method of claim 13, wherein said error pattern includes error-pattern symbols which are combined with corresponding symbols in said codeword to make said corrections, and the step of counting symbols in said codeword having at least a second number of bits in error is carried out by counting error-pattern symbols having certain numbers of non-zero bits.

17. A method of decoding a block of data including rows and columns of symbols, with check symbols in each of said rows and each of said columns, comprising the steps of:

performing error detection and correction on each of said rows, and assigning reliability values to said rows;

selecting one column from among said columns;

initializing a set of erasures to be an empty set, containing none of said rows;

detecting errors in said one column, treating symbols in rows belonging to said set of erasures as errors of known position, and correcting all errors in said one column if possible; and if said one column has uncorrectable errors, selecting a certain number of rows according to said reliability values, adding said certain number of rows to said set of erasures, then repeating the above step of detecting errors in said one column, provided said set of erasures does not contain more than a certain limit number of rows.

18. The method of claim 17, wherein all of said columns have an identical number of check symbols, and said limit number of rows is equal to said identical number.

19. The method of claim 17, where said reliability values are assigned according to a number of symbols found to be in error in respective rows.

20. The method of claim 19, wherein said reliability values are assigned according to a number of bits found to be in error in said number of symbols found to be in error.

21. A method of decoding a block of data including rows and columns of symbols, with row check symbols in each of said rows and column check symbols in each of said columns, each symbol including a certain number of bits, comprising the steps of:

computing error patterns for said rows;

correcting errors in rows with not more than $t_1$ symbols in error, provided that, of said not more than $t_1$ symbols, not more than $q_1$ have at least $L_{B1}$ bits in error, where $t_1$, $q_1$, and $L_{B1}$ are positive integers;

storing the error patterns computed for other rows with not more than $t_1$ symbols in error in a memory;

computing error patterns for said columns;

correcting errors in columns with not more than $t_2$ symbols in error, provided that, of said not more than $t_2$ symbols, not more than $q_2$ have at least $L_{B2}$ bits in error, where $t_2$, $q_2$, and $L_{B2}$ are positive integers;

correcting errors in other columns with not more than $t_2$ symbols in error, provided that for all of said not more than $t_2$ symbols in error, identical corrections are found in said error patterns stored in said memory.

22. The method of claim 21, wherein the step of storing the error patterns includes storing, for each symbol in error, a row address, a column address, and an error pattern value.

23. The method of claim 21, further comprising the steps of:

examining said error patterns stored for said other rows to find burst errors including errors in at least a certain number of consecutively received symbols;

counting the symbols in each row having at least $L_{B1}$ bits in error, assuming that all symbols in said burst errors have fewer than $L_{B1}$ bits in error;

correcting rows now found to have not more than $q_1$ symbols with at least $L_{B1}$ bits in error; and deleting the error patterns of the rows thus corrected from said memory.

24. The method of claim 21, further comprising the steps of:

setting erasure flags for rows having more than $t_1$ symbols in error, and for rows having more than $q_1$ symbols with at least $L_{B1}$ bits in error; and using said erasure flags to identify error positions in said step of correcting errors in columns.

25. The method of claim 21, wherein each symbol includes eight bits.

26. The method of claim 25, wherein $L_{B1}$ and $L_{B2}$ are both greater than one and less than four.

27. A method of decoding a block of data including rows and columns of symbols, with row check symbols in each of said rows and column check symbols in each of said columns, comprising the steps of:

computing error patterns for said rows;

correcting errors in rows with not more than $t_a$ symbols in error, where $t_a$ is a positive integer;

storing the error patterns computed for rows with more than $t_a$ but not more than $t_1$ symbols in error in a memory, where $t_1$ is an integer greater than $t_a$;

computing errors patterns for said columns;

correcting errors in columns with not more than $t_b$ symbols in error, where $t_b$ is a positive integer;

flagging columns with more than $t_2$ symbols in error as having uncorrectable errors, where $t_2$ is an integer greater than $t_b$;

comparing error patterns of columns having more than $t_b$ but not more than $t_2$ symbols in error with the error patterns stored in said memory;

correcting those columns having more than $t_b$ but not more than $t_2$ symbols in error, for which no conflicting error patterns are found in said memory; and flagging as having uncorrectable errors those columns with more than $t_b$ but not more than $t_2$ symbols in error, for which a conflicting error pattern is found in said memory.

28. The method of claim 27, wherein the step of storing the error patterns comprises the sub-set of storing, for each symbol in error, a row address, a column address, and an error pattern value.

29. The method of claim 27, wherein said columns with more than $t_b$ but not more than $t_2$ symbols in error are corrected only if identical corrections are found for all error positions in said memory.

30. The method of claim 27, further comprising the steps of:

setting erasure flags for rows with more than $t_a$ symbols in error; and using said erasure flags to identify error positions in the step of computing error patterns for said columns.

31. The method of claim 30, wherein said columns with more than $t_b$ but not more than $t_2$ symbols in error are corrected only if all error positions are identified by erasure flags.

32. The method of claim 30, further comprising the steps, which are performed before said step of computing error patterns for said columns, of:

counting said erasure flags to obtain an erasure flag count; and if said erasure flag count exceeds $t_2$ and if error patterns have been stored in said memory for at least a certain number of rows, correcting some but not all of at least a certain number or rows rows, deleting the error patterns of the rows thus corrected from said memory, and deleting the erasure flags of the rows thus corrected, thereby reducing the number of erasure flags to at most $t_2$.

33. A decoder for detecting and correcting errors in a codeword including symbols which can be treated as coefficients of a first polynomial over a Galois field, comprising:

error detecting and correcting means for dividing said first polynomial by a certain generator polynomial to obtain a syndrome polynomial, and detecting and correcting errors in said codeword according to said syndrome polynomial, thus obtaining a corrected codeword; and parity checking means coupled to said error detecting and correcting means, for checking said corrected codeword by treating symbols of said corrected codeword as coefficients of a second polynomial and evaluating said second polynomial at a certain element of said Galois field; wherein said certain element is not a root of said generator polynomial.

34. The decoder of claim 33, wherein said parity checking means includes, a register for storing an element of said Galois field;

a control circuit for initializing said register to zero;

a multiplier for multiplying contents of said register by said certain element to obtain a product element;

an adder for receiving successive symbols of said corrected codeword, adding each successive symbol to the produce element obtained by said multiplier, and storing a result sum element in said register, thereby replacing contents of said register; and a zero detection circuit for detecting whether said contents of said register are zero.

35. The decoder of claim 33, wherein said error detecting and correcting means decodes a row-column array of symbols in which each row is a codeword and each column is also a codeword.

36. The decoder of claim 35, wherein:

said error detecting and correcting means includes an erasure register for storing flags identifying rows in which uncorrectable errors are found by said error detecting and correcting means and rows in which parity errors are found by said parity checking means; and after parity checking of said rows by said parity checking means, said error detecting and correcting means decodes said columns to detect and correct errors, using said erasure register to identify error positions.

37. The decoder of claim 36, wherein said decoder uses said erasure register to identify error positions only if said erasure register contains less than a certain threshold number of erasure flags.

38. The decoder of claim 37, wherein said decoder determines said threshold number by counting parity errors found by said parity checking means.

39. An encoder for generating a parity check symbol and additional check symbols for a set of information symbols which can be treated as coefficients of a first polynomial over a Galois field, comprising:

a parity generator for evaluating said first polynomial at a certain element of said Galois field, thereby generating said parity check symbol;

a memory device storing a look-up table for converting said parity check symbol to a first plurality of symbols;

encoding means for generating a second plurality of symbols as remainder coefficients in a division operation having as a dividend a second polynomial of which said information symbols are coefficients, and as a divisor a generator polynomial of which said certain element is not a root; and an adder for adding said first plurality of symbols to said second plurality of symbols as elements of said Galois field, thereby obtaining said additional check symbols.

40. The encoder of claim 39, wherein said parity generator includes, a register for storing an element of said Galois field;

a control circuit for initializing said register to zero;

a multiplier for multiplying contents of said register by said certain element to obtain a product element; and an adder for receiving said information symbols; adding each received information symbol to the product element obtain by said multiplier, and storing a resulting sum element in said register, thereby replacing said contents of said register.

41. The encoder of claim 39, wherein said parity generator and said encoding means operate simultaneously on said information symbols.

42. A decoder for detecting and correcting errors in a codeword including symbols which can be treated as coefficients of a polynomial over a Galois field, each symbol including a certain number of bits, comprising:

error detecting and correcting means for dividing said polynomial by a certain generator polynomial to obtain a syndrome polynomial, and detecting and correcting errors in said codeword according to said syndrome polynomial, thus obtaining a corrected codeword;

a bit weight calculation circuit coupled to said error detecting and correcting means, for counting bits corrected by said error detecting and correcting means by thereby producing, for each symbol, a bit weight;

a comparator coupled to said bit weight calculation circuit, for comparing said bit weight with a first threshold number; and a monitoring circuit coupled to said comparator, for counting symbols with bit weights indicating corrections to at least said first threshold number of bits, and setting an erasure flag for said codeword if more than a second threshold number of said symbols have corrections to at least said first threshold number of bits.

43. The decoder of claim 42, wherein said error detecting and correcting means decodes a row-column array of symbols in which each row is a codeword and each column is also a codeword.

44. The decoder of claim 43, wherein:

said error detecting and correction means includes an erasure register for storing erasure flags set by said monitoring circuit; and after setting of said erasure flags by said monitoring circuit, said error detecting and correcting means decodes said columns to detect and correct errors, using said erasure register to identify error positions.

45. The decoder of claim 44, wherein said error detecting and correcting means also sets erasure flags in said erasure register, to identify rows in which uncorrectable errors are detected.

46. The decoder of claim 44, wherein said error detecting and correcting means uses said erasure register to identify error positions only if said erasure register does not contain more than a certain number of erasure flags.

47. A decoder for decoding a block of data including rows and columns of symbols, with check symbols in each of said rows and each of said columns, comprising:

a first register for storing one of said columns of symbols together with reliability values indicating reliability of the stored symbols;

a reordering circuit coupled to said first register, for sorting said stored symbols in order of reliability;

a second register coupled to said reodering circuit, for storing position information identifying a first number of least reliable symbols as determined by said reordering circuit; and an error detecting and correcting means coupled to said second register, for detecting and correcting errors in each of said rows, assigning said reliability values to said rows, then detecting and correcting errors in each of said columns, treating a second number of least reliable symbols in each column as errors of known position, wherein;

said second number is set initially to zero for each column among said columns; and if said error detecting and correcting means finds that a column has uncorrectable errors, said error detecting and correcting means increases said second number of said column, provided said second number does not exceed said first number, then attempts again to detect and correct errors in said column.

48. The decoder of claim 47, wherein each of said columns has a number of check symbols equal to said first number.

49. The decoder of claim 47, wherein said error detecting and correcting means assigns said reliability values according to a number of symbols corrected in respective rows.

50. The decoder of claim 49, wherein:

each symbol in said block includes a certain number of bits; and said error detecting and correcting means also assigns said reliability values according to number of bits corrected in respective symbols.

51. A decoder for decoding a block of data including rows and columns of symbols, with check symbols in each of said rows and each of said columns, each symbol including a certain number of bits, comprising:

a soft correction memory for storing error position information and error pattern values;

first error detecting and correcting means coupled to said soft correction memory, for decoding said rows, detecting errors in said rows, dividing said rows into a most reliable row class, a least reliable row class, and an intermediate row class according to the detected errors correcting errors in rows in said most reliable row class, and storing position information and error pattern values for errors in rows in said intermediate row class in said soft correction memory; and second error detecting and correcting means coupled to said soft correction memory, for decoding said columns, detecting errors in said columns, dividing said columns into a most reliable column class, a least reliable column class, and an intermediate column class according to the detected errors, correcting errors in columns in said most reliable column class, flagging columns in said least reliable column class as having uncorrectable errors, comparing the errors in columns in said intermediate column class with the position information and error pattern values stored in said soft correction memory, correcting those columns in said intermediate column class having only errors that match the position information and error pattern values stored in said soft correction memory, and flagging other columns in said intermediate column class as having uncorrectable errors.

52. The decoder of claim 51, wherein said first error detecting and correcting means assigns to said least reliable row class those rows having more than a seventh number of errors, and assigns to said intermediate row class those rows having more than an eighth number of errors but not more than said seventh number of errors.

53. The decoder of claim 52, wherein said second error detecting and correcting means assigns to said least reliable column class those columns having more than a ninth number of errors, and assigns to said intermediate column class those columns having more than a tenth number of errors but not more than said ninth number of errors.

54. The decoder of claim 53, wherein:

said second error detecting and correcting means includes an erasure register;

said first error detecting and correcting means sets erasure flags in said erasure register for rows in said least reliable row class and said intermediate row class; and said second error detecting and correcting means uses said erasure flags in decoding said columns.

55. The decoder of claim 54, wherein before decoding said columns, said second error detecting and correcting means counts the erasure flags in said erasure register, and if there are more than said ninth number of erasure flags, reduces said erasure flags to at most said ninth number, if possible, by deleting error position information and error pattern values from said soft correction memory and deleting corresponding erasure flags from said erasure register, leaving error position information and error pattern values for at least one of said rows in said soft correction memory.

56. The decoder of claim 51, wherein said first error detecting and correcting means assigns to said least reliable row class those rows having more than a first number of symbols in error, and assigns to said intermediate row class those rows having not more than said first number of symbols in error, but having more than a second number of symbols with errors in at least a third number of bits.

57. The decoder of claim 56, wherein each symbol includes eight bits, and said third number is greater than one but less than four.

58. The decoder of claim 56, wherein said second error detecting and correcting means assigns to said least reliable column class those columns having more than a fourth number of symbols in error, and assigns to said intermediate column class those columns having not more than said fourth number of symbols in error, but having more than a fifth number of symbols with errors in at least a sixth number of bits.

59. The decoder of claim 56, wherein said first error detecting and correcting means reviews rows assigned to said intermediate row class to find burst errors including errors in at least a certain number of consecutively received symbols, removes from said intermediate class those rows whose inclusion in said intermediate class was due to said burst errors, and deletes from said soft correction memory the error position information and error pattern values of the removed rows.

60. The decoder of claim 56, wherein:

said second error detecting and correcting means includes an erasure register;

said first error detecting and correcting means sets erasure flags in said erasure register for rows in said least reliable row class and said intermediate row class; and said second error detecting and correcting means uses said erasure flags in decoding said columns.

* * * * *